(12) United States Patent
Bae et al.

(10) Patent No.: US 12,272,778 B2
(45) Date of Patent: Apr. 8, 2025

(54) DISPLAY DEVICE

(71) Applicant: Samsung Display Co., LTD., Yongin-si (KR)

(72) Inventors: Sung Geun Bae, Yongin-si (KR); Jang Soon Park, Yongin-si (KR); Hyun Wook Lee, Yongin-si (KR); Da Sol Jeong, Yongin-si (KR); Won Hyeong Heo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 402 days.

(21) Appl. No.: 17/752,327

(22) Filed: May 24, 2022

(65) Prior Publication Data
US 2023/0044364 A1    Feb. 9, 2023

(30) Foreign Application Priority Data

Aug. 3, 2021  (KR) .......................... 10-2021-0102219

(51) Int. Cl.
*H01L 33/62*  (2010.01)
*H01L 33/38*  (2010.01)

(52) U.S. Cl.
CPC ............ *H01L 33/62* (2013.01); *H01L 33/382* (2013.01)

(58) Field of Classification Search
CPC ............................. H01L 33/62; H01L 33/382
See application file for complete search history.

(56) References Cited

U.S. PATENT DOCUMENTS

2022/0158054 A1*  5/2022  Cha .......................... H01L 33/62
2022/0254816 A1*  8/2022  Park .................... H01L 25/0753

* cited by examiner

*Primary Examiner* — Douglas M Menz
(74) *Attorney, Agent, or Firm* — KILE PARK REED & HOUTTEMAN PLLC

(57) ABSTRACT

A display device may include a substrate including a display area and a non-display area; pixels disposed in the display area; first and second driving voltage lines disposed in the non-display area and spaced apart from each other; a first fan-out line disposed in the non-display area and electrically connected to the first driving voltage line; a second fan-out line disposed in the non-display area and electrically connected to the second driving voltage line; a first power line including at least two first sub-power lines branching off to a corresponding one of the pixels from the first fan-out line; and a second power line including at least two second sub-power lines branching off to a corresponding one of the pixels from the second fan-out line.

20 Claims, 19 Drawing Sheets

DISPLAY DEVICE

CROSS-REFERENCE TO RELATED APPLICATION

The disclosure claims priority to and the benefit of Korean patent application 10-2021-0102219 under 35 U.S.C. § 119, filed in the Korean Intellectual Property Office (KIPO) on Aug. 3, 2021, the entire contents of which are incorporated herein by reference.

BACKGROUND

1. Technical Field

The disclosure generally relates to a display device.

2. Description of the Related Art

Recently, as interest in information displays is increased, research and development of display devices have been continuously conducted.

SUMMARY

Embodiments provide a display device having improved reliability.

In accordance with an aspect of the disclosure, there is provided a display device including a substrate including a display area and a non-display area; pixels disposed in the display area; a first driving voltage line and a second driving voltage line disposed in the non-display area and spaced apart from each other; a first fan-out line disposed in the non-display area and electrically connected to the first driving voltage line; a second fan-out line disposed in the non-display area and electrically connected to the second driving voltage line; a first power line including at least two first sub-power lines branching off to a corresponding one of the pixels from the first fan-out line; and a second power line including at least two second sub-power lines branching off to a corresponding one of the pixels from the second fan-out line.

The at least two first sub-power lines may extend in a same direction and be spaced apart from each other, and the at least two second sub-power lines may extend in a same direction and be spaced apart from each other.

The at least two first sub-power lines may include a (1-1)th sub-power line and a (1-2)th sub-power line which branch off to a corresponding one of the pixels from the first fan-out line, and the at least two second sub-power lines may include a (2-1)th sub-power line and a (2-2)th sub-power line which branch off to a corresponding one of the pixels from the second fan-out line.

A ratio of the number of the first fan-out line and a number of the at least two first sub-power lines may be 1:2, and a ratio of the number of the second fan-out line and a number of the at least two second sub-power lines may be 1:2.

The (1-1)th and (1-2)th sub-power lines may be spaced apart from the (2-1)th and (2-2)th sub-power lines and be electrically disconnected from the (2-1)th and (2-2)th sub-power lines.

Widths of the (1-1)th and (1-2)th sub-power lines may be equal to each other, and widths of the (2-1)th and (2-2)th sub-power lines may be equal to each other.

A sum of the width of the (1-1)th sub-power line, the width of the (1-2)th sub-power line, and a distance between the (1-1)th sub-power line and the (1-2)th sub-power line may be equal to a width of the first fan-out line, and a sum of the width of the (2-1)th sub-power line, the width of the (2-2)th sub-power line, and a distance between the (2-1)th sub-power line and the (2-2)th sub-power line may be equal to a width of the second fan-out line.

The display device may include a first bridge pattern located in a corresponding one of the pixels and electrically connecting the (1-1)th sub-power line and the (1-2)th sub-power line to each other; and a second bridge pattern located in a corresponding one of the pixels and electrically connecting the (2-1)th sub-power line and the (2-2)th sub-power line to each other.

The first bridge pattern may be integral with the (1-1)th and (1-2)th sub-power lines, and the second bridge pattern may be integral with the (2-1)th and (2-2)th sub-power lines.

Each of the first and second power lines may have a mesh shape in a corresponding one of the pixels.

The display device may further include a buffer layer, a gate insulating layer, and an interlayer insulating layer which are sequentially disposed on the substrate. The first and second power lines may be located between the substrate and the buffer layer. The first and second driving voltage lines may be located between the interlayer insulating layer. The first and second fan-out lines and the first and second power lines may be located in the same layer.

The first driving voltage line may be electrically connected to the first fan-out line through a contact hole sequentially penetrating the buffer layer, the gate insulating layer, and the interlayer insulating layer, and the second driving voltage line may be electrically connected to the second fan-out line through a contact hole sequentially penetrating the buffer layer, the gate insulating layer, and the interlayer insulating layer.

The at least two first sub-power lines may include a (1-1)th sub-power line, a (1-2)th sub-power line, and a (1-3)th sub-power line which branch off to a corresponding one of the pixels from the first fan-out line, and the at least two second sub-power lines may include a (2-1)th sub-power line, a (2-2)th sub-power line, and a (2-3)th sub-power line, which branch off to a corresponding one of the pixels from the second fan-out line.

A ratio of the number of the first fan-out line and the number of the at least two first sub-power lines may be 1:3, and a ratio of the number of the second fan-out line and the number of the at least two second sub-power lines may be 1:3.

Each of the pixels may include: an emission area and a non-emission area; a pixel circuit layer disposed on the substrate, the pixel circuit layer including at least one transistor; and a display element layer disposed in the emission area on the pixel circuit layer, the display element layer including at least one light emitting element electrically connected to the at least one transistor.

The display element layer may include a first alignment electrode, a second alignment electrode, a third alignment electrode, and a fourth alignment electrode located in the emission area on the pixel circuit layer and spaced apart from each other; a bank located in the non-emission area on the pixel circuit layer, the bank including an opening corresponding to the emission area; and a first electrode and a second electrode located in the emission area on the pixel circuit layer and electrically connected to the light emitting element.

The display device may further include a first pad disposed in the non-display area and electrically connected to the first driving voltage line; and a second pad disposed in the non-display area and electrically connected to the second driving voltage line.

In accordance with another aspect of the disclosure, there is provided a display device including a substrate including a display area and a non-display area; pixels disposed in the display area; a first driving voltage line and a second driving voltage line, disposed in the non-display area and spaced apart from each other; a first fan-out line located between the first driving voltage line and the pixels in the non-display area and electrically connected to the first driving voltage line; a second fan-out line located between the second driving voltage line and the pixels in the non-display area and electrically connected to the second driving voltage line; a (1-1)th sub-power line extending to a corresponding one of the pixels from the first fan-out line; a (1-2)th sub-power line extending to a corresponding one of the pixels from the first fan-out line and spaced apart from the (1-1)th sub-power line; a (2-1)th sub-power line extending to a corresponding one of the pixels from the second fan-out line; and a (2-2)th sub-power line extending to a corresponding one of the pixels from the second fan-out line and spaced apart from the (2-1)th sub-power line.

The (1-1)th and (1-2)th sub-power lines may be electrically disconnected from the (2-1) and (2-2)th sub-power lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
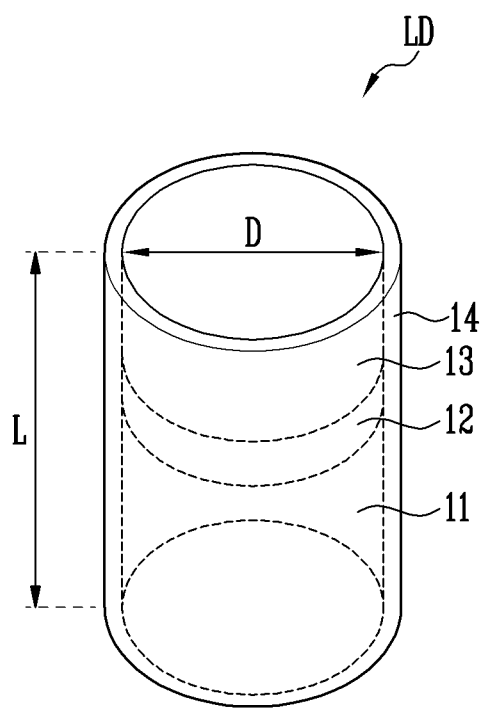
FIGS. 1 and 2 are perspective views schematically illustrating a light emitting element in accordance with an embodiment of the disclosure.

The disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms (or meanings) as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "directly above" the other element but also a case where a further element is interposed between the element and the other element. On the contrary, an expression that an element such as a layer, region, substrate or plate is placed "beneath" or "below" another element indicates not only a case where the element is placed "directly beneath" or "directly below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure and items required for those skilled in the art to understand the content of the disclosure will be described in detail with reference to the accompanying drawings.

Figure 2:
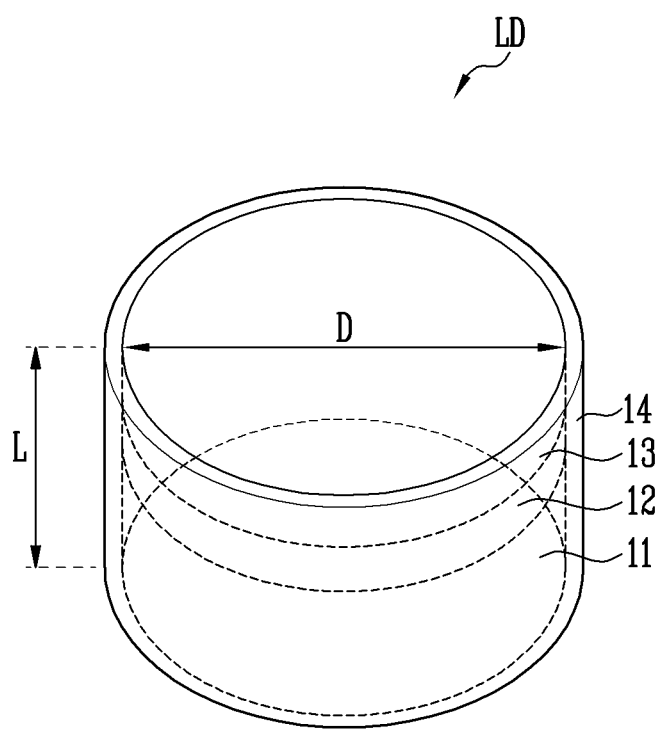
Figure 3:
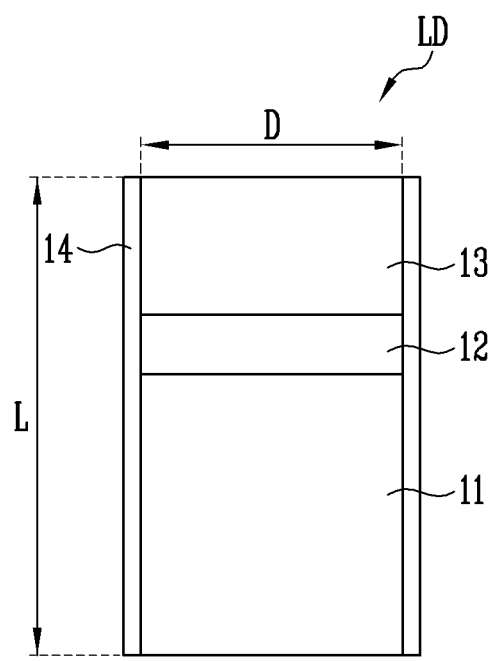
FIG. 3 is a cross-sectional view of the light emitting element shown in FIG. 1.

FIGS. 1 and 2 are perspective views schematically illustrating a light emitting element LD in accordance with an embodiment of the disclosure. FIG. 3 is a schematic cross-sectional view of the light emitting element LD shown in FIG. 1.

In an embodiment, the kind and/or shape of the light emitting element LD is not limited to the embodiment shown in FIGS. 1 to 3.

Referring to FIGS. 1 to 3, the light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure (or stack structure) in which the first semiconductor layer 11, the active layer 12, and the second semiconductor layer 13 are sequentially stacked.

The light emitting element LD may extend in a direction. When assuming that an extending direction of the light emitting element LD is a length direction, the light emitting element LD may include one end portion (or lower end portion or first end portion) and the other end portion (or upper end portion or second end portion) in the length direction. One of the first and second semiconductor layers 11 and 13 may be disposed at the one end portion of the light emitting element LD, and the other of the first and second semiconductor layers 11 and 13 may be disposed at the other end portion of the light emitting element LD. In an example, the first semiconductor layer 11 may be disposed at the one end portion of the light emitting element LD, and the second semiconductor layer 13 may be disposed at the other end portion of the light emitting element LD.

The light emitting element LD may be provided in various shapes. In an example, the light emitting element LD may have a rod-like shape, a bar-like shape, a pillar-like shape, or the like, which is long in its length direction (for example, its aspect ratio is greater than 1) as shown in FIG. 1. In an embodiment, a length L of the light emitting element LD in the length direction may be larger than a diameter D (or a width of a cross-section) of the light emitting element LD. However, the disclosure is not limited thereto. In some embodiments, the light emitting element LD may have a rod-like shape, a bar-like shape, a pillar-like shape, or the like, which is short in its length direction (for example, its aspect ratio is smaller than 1) as shown in FIG. 2. In some embodiments, the light emitting element LD may have a rod-like shape, a bar-like shape, a pillar-like shape, or the like, of which a length L and a diameter D are the same.

The light emitting element LD may include, for example, a light-emitting diode (LED) manufactured small enough to have a diameter D and/or a length L to a degree of nanometer scale to micrometer scale. The size of the light emitting element LD may be changed according to requirement conditions (or design conditions) of a lighting device or a self-luminous display device to which the light emitting element LD is applied.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN and include an n-type semiconductor layer doped with a first conductive dopant (or n-type dopant) such as Si, Ge, or Sn. However, the material forming (or constituting) the first semiconductor layer 11 is not limited thereto. The first semiconductor layer 11 may be configured with various materials. The first semiconductor layer 11 may include an upper surface contacting (or in contact with) the active layer 12 and a lower surface exposed to the outside in the length direction of the light emitting element LD. The lower surface of the first semiconductor layer 11 may be the one end portion (or lower end portion) of the light emitting element LD.

The active layer 12 is formed on the first semiconductor layer 11 and may be formed in a single or multiple quantum well structure. In an example, in case that the active layer 12 is formed in the multiple quantum well structure, a barrier layer (not shown), a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain, applied to the well layer. However, the structure of the active layer 12 is not limited to the above-described embodiment.

The active layer 12 may emit light having a wavelength of about 400 nm to about 900 nm and use a double hetero structure. In an embodiment, a clad layer (not shown) doped with a conductive dopant may be formed on the top and/or the bottom of the active layer 12 in the length direction of the light emitting element LD. In an example, the clad layer may be formed as an AlGaN layer or InAlGaN layer. In some embodiments, a material such as AlGaN or AlInGaN may be used to form the active layer 12. The active layer 12 may be configured with various materials. The active layer 12 may include a first surface contacting the first semiconductor layer 11 and a second surface contacting the second semiconductor layer 13.

In case that an electric field having a predetermined voltage or more is applied to both end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting devices, including a pixel of a display device.

The second semiconductor layer 13 is formed on the second surface of the active layer 12 and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg, Zn, Ca, Sr, or Ba. However, the material forming the second semiconductor layer 13 is not limited thereto. The second semiconductor layer 13 may be configured with (or formed of or include) various materials. The second semiconductor layer 13 may include a lower surface contacting the second surface of the active layer 12 and an upper surface exposed to the outside in the length direction of the light emitting element LD. The upper surface of the second semiconductor layer 13 may be the second end portion (or upper end portion) of the light emitting element LD.

In an embodiment, the first semiconductor layer 11 and the second semiconductor layer 13 may have different thicknesses in the length direction of the light emitting element LD. In an example, the first semiconductor layer 11 may have a thickness relatively thicker or greater than that of the second semiconductor layer 13 in the length direction of the light emitting element LD. Accordingly, the active layer 12 of the light emitting element LD may be located more adjacent to the upper surface of the second semiconductor layer 13 than the lower surface of the first semiconductor layer 11.

Although it is illustrated that each of the first semiconductor layer 11 and the second semiconductor layer 13 is configured with one layer, the disclosure is not limited thereto. In an embodiment, each of the first semiconductor layer 11 and the second semiconductor layer 13 may further include at least one layer, e.g., a clad layer and/or a tensile strain barrier reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAInP, p-AlInP, or p-AlGaInP, but the disclosure is not limited thereto.

In some embodiments, the light emitting element LD may further include a contact electrode (not shown) (hereinafter referred to as a "first contact electrode") disposed on the top of the second semiconductor layer 13, in addition to the first semiconductor layer 11, the active layer 12, and the second semiconductor layer 13, which are described above. In some embodiments, the light emitting element LD may further include another contact electrode (not shown) (hereinafter referred to as a "second contact electrode") disposed at one end of the first semiconductor layer 11.

Each of the first and second contact electrodes may be an ohmic contact electrode, but the disclosure is not limited thereto. In some embodiments, each of the first and second contact electrodes may be a Schottky contact electrode. The first and second contact electrodes may include a conductive material. For example, the first and second contact electrodes may include an opaque metal including one or mixture of chromium (Cr), titanium (Ti), aluminum (Al), gold (Au), nickel (Ni), and any oxide or alloy thereof, but the disclosure is not limited thereto. In some embodiments, the first and second contact electrodes may include a transparent conductive oxide such as indium tin oxide (ITO), indium zinc oxide (IZO), zinc oxide ($ZnO_x$), indium gallium zinc oxide (IGZO), or indium tin zinc oxide (ITZO). The zinc oxide ($ZnO_x$) may be zinc oxide (ZnO) and/or zinc peroxide ($ZnO_2$).

Materials included in the first and second contact electrodes may be identical to or different from each other. The first and second contact electrodes may be substantially transparent or translucent. Accordingly, light generated in the light emitting element LD can be emitted to the outside of the light emitting element LD by passing through the first and second contact electrodes. In some embodiments, in case that light generated in the light emitting element LD does not pass through the first and second contact electrodes and is emitted to the outside of the light emitting element LD through an area except both the end portions of the light emitting element LD, the first and second contact electrodes may include an opaque metal.

In an embodiment, the light emitting element LD may further include an insulative film 14 (or insulating film or layer). However, in some embodiments, the insulative film 14 may be omitted and be provided to cover (or overlap) only portions of the first semiconductor layer 11, the active layer 12, and the second semiconductor layer 13.

The insulative film 14 can prevent an electrical short circuit which may occur in case that the active layer 12 contacts a conductive material in addition to the first semiconductor layer 11 and the second semiconductor layer 13. The insulative film 14 minimizes a surface defect of the light emitting element LD, thereby improving the lifespan and light emission efficiency of the light emitting element LD. In case that light emitting elements LD are densely disposed, the insulative film 14 can prevent an unwanted short circuit which may occur between the light emitting elements LD. Whether the insulative film is provided is not limited as long as the active layer 12 can prevent occurrence of a short circuit with external conductive material.

The insulative film 14 may be provided in a shape entirely surrounding the outer circumference of the light emitting stack structure including the first semiconductor layer 11, the active layer 12, and the second semiconductor layer 13.

Although a case where the insulative film 14 is provided in a shape entirely surrounding the outer circumference of each of the first semiconductor layer 11, the active layer 12, and the second semiconductor layer 13 is described in the above-described embodiment, the disclosure is not limited thereto. In some embodiments, in case that the light emitting element LD includes the first contact electrode, the insulative film 14 may entirely surround the outer circumference of each of the first semiconductor layer 11, the active layer 12, the second semiconductor layer 13, and the first contact electrode. In some embodiments, the insulative film 14 may not entirely surround the outer circumference of the first contact electrode, or may surround only a portion of the outer circumference of the first contact electrode and may not surround the other of the outer circumference of the first contact electrode. In some embodiments, in case that the first contact electrode is disposed at the other end portion (or upper end portion) of the light emitting element LD and the second contact electrode is disposed at one end portion (or the other end portion) of the light emitting element LD, the insulative film 14 may expose at least a portion of each of the first and second contact electrodes.

The insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulative film 14.

The insulative film 14 may be provided in the form of a single layer or be provided in the form of a multi-layer including at least two layers. In an example, in case that the insulative film 14 may be configured as a double layer including a first layer and a second layer which are sequentially stacked, the first layer and the second layer may be made of different materials (or ingredients), and be formed by different processes. In some embodiments, the first layer and the second layers may be formed of the same material and be formed by a continuous process.

In some embodiments, the light emitting element LD may be implemented with a light emitting pattern having a core-shell structure. The first semiconductor layer 11 may be located at a core of the light emitting element LD, for example, in the middle (or center) thereof, the active layer 12 may be provided and/or formed in a shape surrounding the outer circumference of the first semiconductor layer 11, and the second semiconductor layer 13 may be provided and/or formed in a shape surrounding the active layer 12. The light emitting element LD may further include a contact electrode (not shown) surrounding at least one side of the second semiconductor layer 13. In some embodiments, the light emitting element LD may further include an insulative film 14 which is provided on the outer circumference of the light emitting pattern having the core-shell structure and includes a transparent insulating material. The light emitting element LD implemented with the light emitting pattern having the core-shell structure may be manufactured by a growth process.

The above-described light emitting element LD may be used as a light emitting source (or light source) for various display devices. The light emitting element LD may be manufactured by a surface treatment process. For example, in case that light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD are not unequally condensed (or aggregated) in the solution but equally dispersed in the solution.

A light emitting unit (or light emitting part) (or light emitting device) including the above-described light emitting element LD may be used in various types of devices that require a light source, including a display device. In case that light emitting elements LD are disposed in an emission area of each pixel of a display panel, the light emitting elements LD may be used as a light source of the pixel. However, the application field of the light emitting element LD is not limited to the above-described example. For example, the light emitting element LD may be used for other types of electronic devices that require a light source, such as a lighting device.

Figure 4:
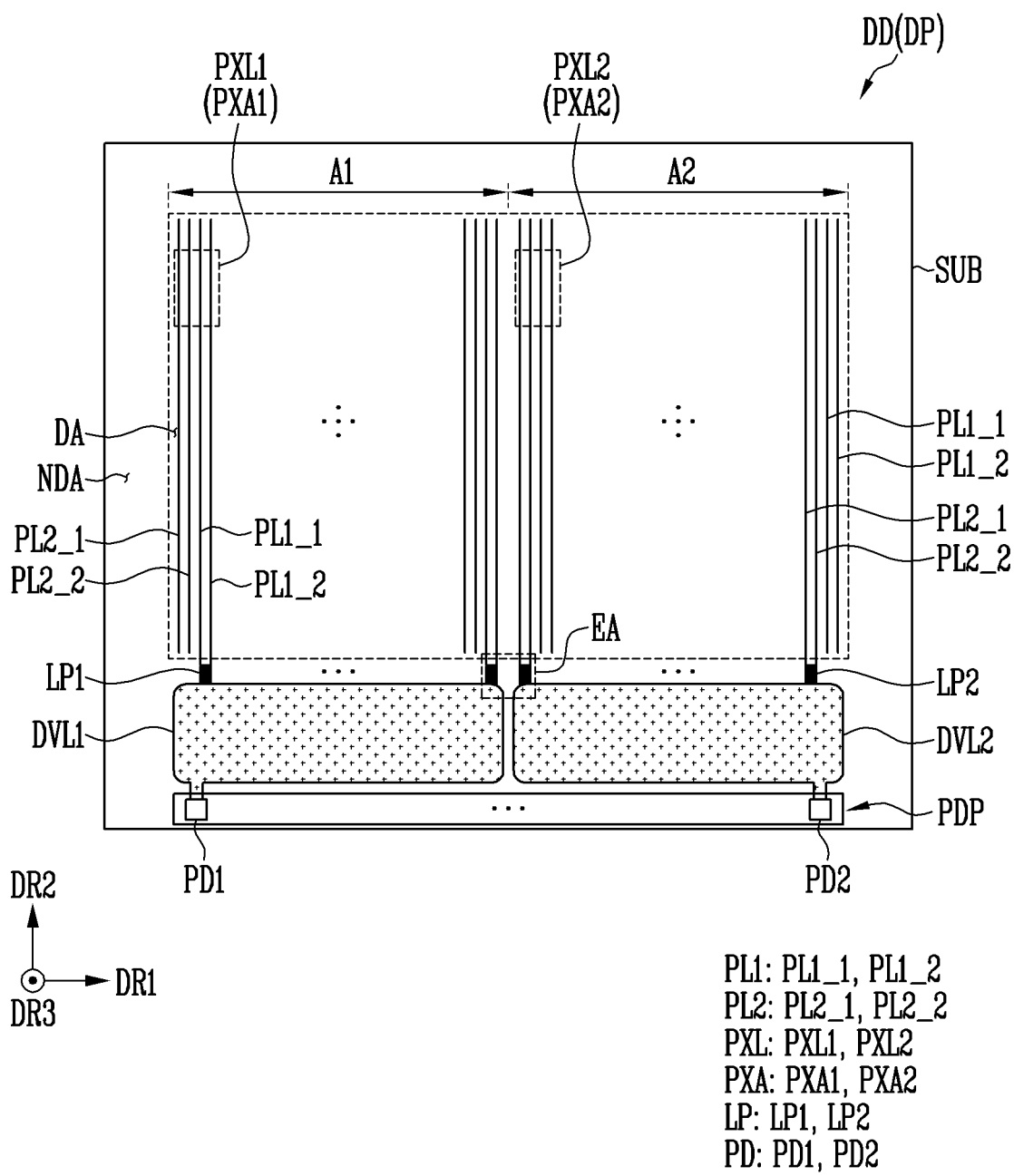
FIG. 4 is a plan view schematically illustrating a display device in accordance with an embodiment of the disclosure.

FIG. 4 is a plan view schematically illustrating a display device DD in accordance with an embodiment of the disclosure.

In FIG. 4, for convenience, a structure of the display device DD, particularly, a display panel DP provided in the display device DD is schematically illustrated based on a display area DA in which an image is displayed.

In an embodiment, the term "connection" between two components may include both electrical connection and physical connection, but the disclosure is not limited thereto.

The disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIGS. 1 to 4, the display device DD may include a substrate SUB, pixels PXL which are provided on the substrate SUB and each include at least one light emitting element LD, a driving part which is provided on the substrate SUB and drives the pixels PXL, and a line part LP which electrically connects the pixels PXL to the driving part.

The display device DD may be classified into a passive matrix type display device and an active matrix type display device according to a method of driving the light emitting element LD. In an example, in case that the display device DD is implemented as the active matrix type display device, each of the pixels PXL may include a driving transistor for controlling an amount of current supplied to the light emitting element LD, a switching transistor for transferring a data signal to the driving transistor, and the like.

The display device DD may be provided in various shapes. In an example, the display device DD may be provided in a rectangular plate shape having two pairs of sides parallel to each other, but the disclosure is not limited thereto. In case that the display device DD is provided in the rectangular plate shape, pair of sides among the two pairs of sides may be provided longer than the other pair of sides. For convenience, a case where the display device DD is provided in a rectangular shape having a pair of long sides and a pair of short sides is illustrated. An extending direction (or horizontal direction) of the long sides is represented as a first direction DR1, an extending direction (or vertical direction) of the short sides is represented as a second direction DR2, and a thickness direction of the substrate SUB is represented as a third direction DR3. In the display device DD provided in the rectangular plate shape, a corner portion at which a long side and a short side contact (or meet) each other may have a round shape.

The substrate SUB may include a transparent insulating material to enable light to be transmitted therethrough. The substrate SUB may be a rigid substrate or a flexible substrate.

An area on the substrate SUB may be provided as the display area DA such that the pixels PXL are disposed therein, and the other area on the substrate SUB may be provided as a non-display area NDA. In an example, the substrate SUB may include the display area DA including pixel areas PXA in which the respective pixels PXL are disposed, and the non-display area NDA disposed at the periphery of the display area DA (or adjacent to the display area DA).

Each of the pixels PXL may be provided in the display area DA on the substrate SUB. In an example, each of the pixels PXL may be provided in the pixel area PXA as an area of the display area DA. In an embodiment, the pixels PXL may be arranged in a stripe arrangement structure in the display area DA, but the disclosure is not limited thereto.

Each pixel PXL may include at least one light emitting element LD driven by a corresponding scan signal and a corresponding data signal. The light emitting element LD may have a size small to a degree of micrometer scale or nanometer scale and be electrically connected in parallel to light emitting elements disposed adjacent thereto. However, the disclosure is not limited thereto. The light emitting element LD may form a light source of each pixel PXL.

Each pixel PXL may include at least one light source, e.g., the light emitting element LD shown in FIGS. 1 to 3, which is driven by a predetermined signal (e.g., a scan signal, a data signal, and the like) and/or a power source (e.g., a first driving power source, a second driving power source, and the like). However, in the embodiment of the disclosure, the kind of the light emitting element LD which can be used as the light source of the pixel PXL is not limited thereto.

The substrate SUB may include the display area DA and the non-display area NDA.

The display area DA may be an area in which the pixels PXL for displaying an image are provided.

A power line for supplying a predetermined driving voltage to the pixels PXL may be provided in the display area DA. The power line may include a first power line PL1 and a second power line PL2.

The first power line PL1 and the second power line PL2 may extend in a direction, e.g., the second direction DR2. First and second power lines PL1 and PL2 may be arranged at a distance of at least one pixel PXL (or at least one pixel area PXA) in the first direction DR1 in the display area DA. A first power line PL1 provided in a pixel PXL may be electrically connected to a first power line PL1 provided in another pixel PXL adjacent to the pixel PXL. A second power line PL2 provided in a pixel PXL may be electrically connected to a second power line PL2 provided in a pixel adjacent to the pixel PXL.

The first power line PL1 may be commonly electrically connected to pixels PXL sequentially arranged in the same direction as an extending direction thereof. In an example, the first power line PL1 may extend in the second direction DR2 to be commonly electrically connected to pixels PXL sequentially arranged in the second direction DR2. Similar to the first power line PL1, the second power line PL2 may be commonly electrically connected to pixels PXL sequentially arranged in the same direction as an extending direction thereof. In an example, the second power line PL2 may extend in the second direction DR2 to be commonly electrically connected to pixels PXL sequentially arranged in the second direction DR2.

In an embodiment, the first power line PL1 may include at least two first sub-power lines. In an example, the first power line PL1 may include a (1-1)th sub-power line PL1_1 and a (1-2)th sub-power line PL1_2.

The (1-1)th sub-power line PL1_1 and the (1-2)th sub-power line PL1_2 may be located adjacent to each other in the pixel area PXA and be disposed to be spaced apart from each other. The (1-1)th sub-power line PL1_1 and the (1-2)th sub-power line PL1_2 may branch off toward the display area DA (or the pixel area PXA) from a first fan-out line LP1 of the line part LP. In an example, the (1-1)th sub-power line PL1_1 and the (1-2)th sub-power line PL1_2 may branch off to a corresponding pixel(s) PXL among the pixels PXL from the first fan-out line LP1. The (1-1)th sub-power line PL1_1, the (1-2)th sub-power line PL1_2, and the first fan-out line LP1 may be electrically and/or physically connected to each other.

The second power line PL2 may include at least two second sub-power lines. In an example, the second power line PL2 may include a (2-1)th sub-power line PL2_1 and a (2-2)th sub-power line PL2_2.

The (2-1)th sub-power line PL2_1 and the (2-2)th sub-power line PL2_2 may be located adjacent to each other in the pixel area PXA and be disposed to be spaced apart from each other. The (2-1)th sub-power line PL2_1 and the (2-2)th sub-power line PL2_2 may branch off toward the display area DA (or the pixel area PXA) from a second fan-out line LP2 of the line part LP.

In an example, the (2-1)th sub-power line PL2_1 and the (2-2)th sub-power line PL2_2 may branch off to a corresponding pixel(s) PXL among the pixels PXL from the second fan-out line LP2. The (2-1)th sub-power line PL2_1, the (2-2)th sub-power line PL2_2, and the second fan-out line LP2 may be electrically and/or physically connected to each other.

The non-display area NDA may be an area in which lines (e.g., fan-out lines), pads, and/or a built-in circuit, which are electrically connected to the pixels PXL, are provided to drive the pixels PXL. In an example, the line part LP, a first driving voltage line DVL1, a second driving voltage line DLV2, and a pad part PDP may be provided in the non-display area NDA.

The non-display area NDA may be provided at least one side of the display area DA. The non-display area NDA may surround the circumference (or edge) of the display area DA.

The line part LP may electrically connect the driving part to the pixels PXL to each other. The line part LP may include a fan-out line electrically connected to signal lines, e.g., a scan line, a data line, an emission control line, and the like, which provide a signal to each pixel PXL and are electrically connected to each pixel PXL. The line part LP may include a fan-out line electrically connected to signal lines, e.g., a control line, a sensing line, and the like, which are electrically connected to each pixel PXL so as to compensate for an electrical characteristic change of each pixel PXL. In an embodiment, the line part LP may include a fan-out line electrically connected to a power line electrically connected to each pixel PXL.

The line part LP may include the first fan-out line LP1 and the second fan-out line LP2. The first fan-out line LP1 and the second fan-out line LP2 may extend in a direction, e.g., the second direction DR2. The first and second fan-out lines LP1 and LP2 may be arranged at a distance in the first direction DR1 in the non-display area NDA.

The first fan-out line LP1 may be physically and/or electrically connected to the first power line PL1 provided in the pixels PXL to transfer a signal (e.g., a first power source) applied from the driving part to the first power line PL1. The second fan-out line LP2 may be physically and/or electrically connected to the second power line PL2 provided in the pixels PXL to transfer a signal (e.g., a second power source) applied from the driving part to the second power line PL2.

The pad part PDP may include pads PD. The pads PD may supply driving power sources and signals which are used to drive the pixels PXL provided in the display area DA and/or the built-in circuit. In some embodiments, in case that the driving part is mounted in the non-display area NDA of the substrate SUB, the pad part PDP may be applied with signals output from the driving part while overlapping an output pad of the driving part.

Each of the pads PD may be electrically connected to a corresponding fan-out line of the line part LP to supply the driving power sources and the signals to corresponding pixels PXL. The pads PD may be exposed to the outside to be electrically connected to the driving part through a separate connection member such as a conductive adhesive member.

At least one of the pads PD may be a first power pad PD1. The first power pad PD1 may be electrically connected to the first driving voltage line DVL1. The first power pad PD1 may supply a voltage of the first driving power source (or the first power source) to the first driving voltage line DVL1.

At least another of the pads PD may be a second power pad PD2. The second power pad PD2 may be electrically connected to the second driving voltage line DVL2. The second power pad PD2 may supply a voltage of the second driving power source (or the second power source) to the second driving voltage line DVL2.

The driving part may be located on the pad part PDP. The driving part may include input/output pads electrically connected to the pads PD included in the pad part PDP. The driving part may receive driving signals output from a printed circuit board, and output signals and a voltage of a driving power source to be provided to the pixels PXL, based on the received driving signals. The signals and the voltage of the driving power source, which are described above, may be supplied to a corresponding pad PD through some of the input/output pads. The driving part may include a power supply pad electrically connected to each of the first and second power pads PD1 and PD2 to supply a voltage of a driving power source to the first and second power pads PD1 and PD2 during driving of the display device DD.

The first driving voltage line DVL1 may be located in a portion of the non-display area NDA, which is disposed between a side of the line part LP and the pad part PDP. The first driving voltage line DVL1 may be electrically connected to the first power pad PD1 of the pad part PDP. The first driving voltage line DVL1 may be integrally or non-integrally provided with the first power pad PD1. The voltage of the first driving power source may be supplied to the first driving voltage line DVL1. The first driving voltage line DVL1 may be electrically connected to the first fan-out line LP1 through a separate connection member (e.g., a contact hole or the like).

The second driving voltage line DVL2 may be located in an area of the non-display area NDA, which is located between a side of the line part LP and the pad part PDP. The second driving voltage line DVL2 may be electrically connected to the second power pad PD2 of the pad part PDP. The second driving voltage line DVL2 may be integrally or non-integrally provided with the second power pad PD2. The second driving voltage line DVL2 may be electrically connected to the second fan-out line LP2 through a separate connection member (e.g., a contact hole or the like).

The first driving voltage line DVL1 and the second driving voltage line DVL2 may be disposed in the non-display area NDA to be spaced apart from each other and be electrically disconnected (or separated) from each other.

Each of the first driving voltage line DVL1 and the second driving voltage line DVL2 may be provided in a plate shape to be located in an area of the non-display area NDA. In a plan view, the first driving voltage line DVL1 may be located in a portion of the non-display area NDA located at a left lower end portion of the substrate SUB, and the second driving voltage line DVL2 may be located in the non-display area NDA located at a right lower end portion of the substrate SUB. However, the disclosure is not limited thereto.

In an embodiment, the display area DA may include a first area A1 corresponding to the first driving voltage line DVL1 and a second area A2 corresponding to the second driving voltage line DVL2. A first pixel PXL1 may be located in the first area A1, and a second pixel PXL2 may be located in the second area A2.

The first pixel PXL1 may be a pixel PXL in which the first power line PL1 branching off to the first area A1 from the first fan-out line LP1 electrically connected to the first driving voltage line DVL1 is proved. The second power line PL2 located adjacent to the first power line PL1 may be provided in a first pixel area PXA1 in which the first pixel PXL1 is provided. The second power line PL2 may be located in the first area A1 and be electrically connected to the second power line PL2 located in the second area A2.

The second pixel PXL2 may be a pixel PXL in which the second power line PL2 branching off to the second area A2 from the second fan-out line LP2 electrically connected to the second driving voltage line DVL2 is proved. The first power line PL1 located adjacent to the second power line PL2 may be provided in a second pixel area PXA2 in which the second pixel PXL2 is provided. The first power line PL1 may be located in the second area A2 and be electrically connected to the first power line PL1 located in the first area A1.

In an embodiment, the first fan-out line LP1 may be located in an area of the non-display area NDA, which corresponds to the first area A1. The first fan-out line LP1 may be directly electrically connected to the first power line PL1 provided in the first pixel PXL1 (or electrically connected to the first pixel PXL1). The voltage of the first driving power source, which is transferred to the first driving voltage line DVL1, may be transferred to the first fan-out line LP1 to be supplied to the (1-1)th and (1-2)th sub-power lines PL1_1 and PL1_2 located in the first area A1.

The second fan-out line LP2 may be located in a portion of the non-display area NDA which corresponds to the second area A2. The second fan-out line LP2 may be directly electrically connected to the second power line PL2 provided in the second pixel PXL2 (or electrically connected to the second pixel PXL2). The voltage of the second driving power source, which is transferred to the second driving voltage line DVL2, may be transferred to the second fan-out line LP2 to be supplied to the (2-1)th and (2-2)th sub-power lines PL2_1 and PL2_2 located in the second area A2.

The (1-1)th and (1-2)th sub-power lines PL1_1 and PL1_2, the first fan-out line LP1, the (2-1)th and (2-2)th sub-power lines PL2_1 and PL2_2, and the second fan-out line LP2 will be described in detail below with reference to FIG. 14.

Figure 5:
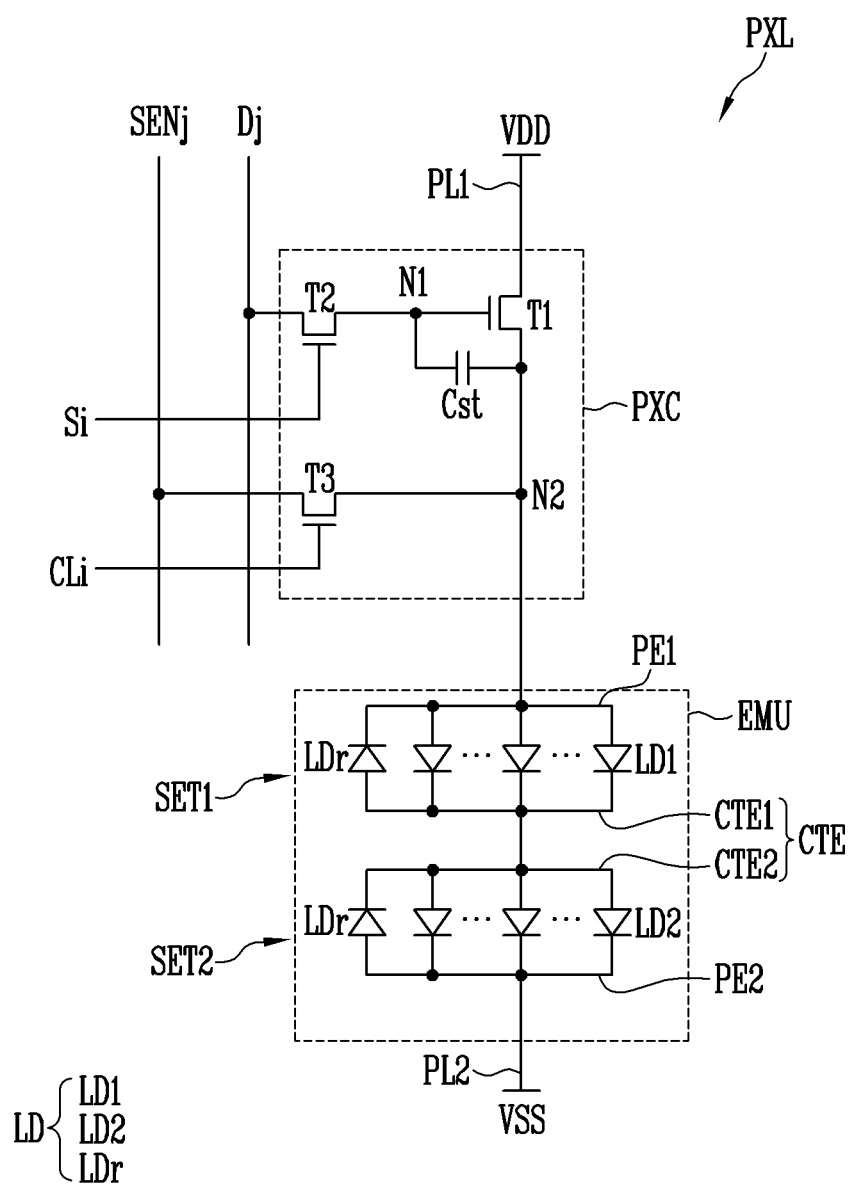
FIGS. 5 and 6 are circuit diagrams illustrating various embodiments of an electrical connection relationship between components included in a pixel shown in FIG. 4.
Figure 6:
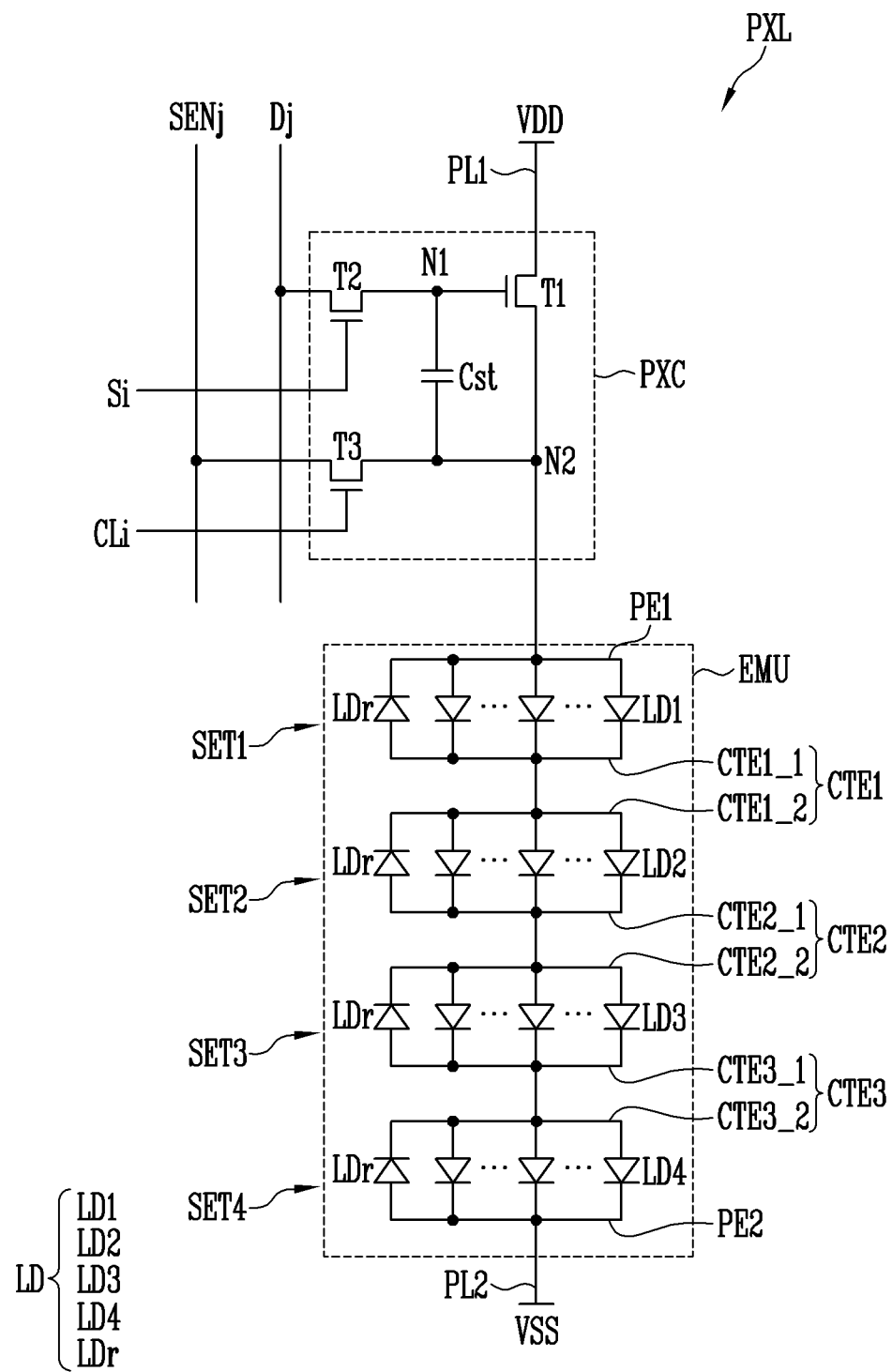

FIGS. 5 and 6 are schematic diagrams of equivalent circuits illustrating various embodiments of an electrical connection relationship between components included in the pixel PXL shown in FIG. 4.

For example, FIGS. 5 and 6 illustrate various embodiments of an electrical connection relationship between components included in the pixel PXL applicable to an active matrix type display device. However, the kinds of the components included in the pixel PXL applicable to the embodiment of the disclosure are not limited thereto.

In FIGS. 5 and 6, the pixel PXL comprehensively includes not only components included in the pixel PXL shown in FIG. 4 but also an area in which the components are provided.

Referring to FIGS. 1 to 6, the pixel PXL may include a light emitting part EMU (or light emitting part) which generates light with a luminance corresponding to a data signal. The pixel PXL may selectively further include a pixel circuit PXC for driving the light emitting part EMU.

In some embodiments, the light emitting part EMU may include light emitting elements LD electrically connected in parallel between a first power line PL1 electrically connected to a first driving power source VDD (or first power source) to be applied with a voltage of the first driving power source VDD and a second power line PL2 electrically connected to a second driving power source VSS (or second power source) to be applied with a voltage of the second driving power source VSS. For example, the light emitting part EMU may include a first pixel electrode PE1 (or first electrode) electrically connected to the first driving power source VDD via the pixel circuit PXC and the first power line PL1, a second pixel electrode PE2 (or second electrode) electrically connected to the second driving power source VSS through the second power line PL2, and light emitting elements LD electrically connected in parallel in a same direction between the first and second pixel electrodes PE1 and PE2. In an embodiment, the first pixel electrode PE1 may be an anode, and the second pixel electrode PE2 may be a cathode.

Each of the light emitting elements LD included in the light emitting part EMU may include one end portion (or first end portion) electrically connected to the first driving power source VDD through the first pixel electrode PE1 and the other end portion (or second end portion) electrically connected to the second driving power source VSS through the second pixel electrode PE2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to be equal to or higher than a threshold voltage of the light emitting elements LD during an emission period of the pixel PXL.

As described above, the light emitting elements LD electrically connected in parallel in a same direction (e.g., a forward direction) between the first pixel electrode PE1 and the second pixel electrode PE2, to which voltages having difference potentials are supplied, may form effective light sources, respectively.

Each of the light emitting elements LD of the light emitting part EMU may emit light with a luminance corresponding to a driving current supplied through a corresponding pixel circuit PXC. For example, the pixel circuit PXC may supply, to the light emitting part EMU, a driving current corresponding to a grayscale value of corresponding frame data during each frame period. The driving current supplied to the light emitting part EMU may be divided and flow through each of the light emitting elements LD. Accordingly, the light emitting part EMU can emit light with a luminance corresponding to the driving current while each light emitting element LD is emitting light with a luminance corresponding to a current flowing therethrough.

In the above, an embodiment in which both the end portions of the light emitting elements LD are electrically connected in a same direction between the first and second driving power sources VDD and VSS has been described, but the disclosure is not limited thereto. In some embodiments, the light emitting part EMU may further include at least one ineffective light source, e.g., a reverse light emitting element LDr, in addition to the light emitting elements LD forming the respective effective light sources. The reverse light emitting element LDr is electrically connected in parallel together with the light emitting elements LD forming the effective light sources between the first and second pixel electrodes PE1 and PE2, and may be electrically connected between the first and second pixel electrodes PE1 and PE2 in a direction opposite to that in which the light emitting elements LD are electrically connected. Although a predetermined driving voltage (e.g., a forward driving voltage) is applied between the first and second pixel electrodes PE1 and PE2, the reverse light emitting element LDr maintains an inactivated state, and accordingly, no current substantially flows through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. In an example, in case that the pixel PXL is disposed on an ith row and a jth column of the display area DA, the pixel circuit PXC of the pixel PXL may be electrically connected to an ith scan line Si, a jth data line Dj, an ith control line CLi, and a jth sensing line SENj of the display area DA.

The pixel circuit PXC may include first to third transistors T1 to T3 and a storage capacitor Cst.

The first transistor T1 is a driving transistor for controlling a driving current applied to the light emitting part EMU, and may be electrically connected between the first driving power source VDD and the light emitting part EMU. Specifically, a first terminal of the first transistor T1 may be electrically connected (or coupled) to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied to the light emitting part EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be the source electrode, and the second terminal may be the drain electrode.

The second transistor T2 is a switching transistor which selects a pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals. For example, in case that the first terminal is a drain electrode, the second terminal may be a source electrode.

The second transistor T2 may be turned on in case that a scan having a gate-on voltage (e.g., a high-level voltage) is supplied from the scan line Si, to electrically connect the data line Dj and the first node N1 to each other. The first node N1 is a point at which the second terminal of the second transistor T2 and the gate electrode of the first transistor T1 are electrically connected to each other, and the second transistor T2 may transfer a data signal to the gate electrode of the first transistor T1.

The third transistor T3 electrically connects the first transistor T1 to the sensing line SENj to acquire a sensing signal through the sensing line SENj and to detect a characteristic of the pixel PXL, including a threshold voltage of the first transistor, or the like, by using the sensing signal. Information on the characteristic of the pixel PXL may be used to convert image data such that a characteristic deviation between pixels PXL can be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. The first terminal of the third transistor T3 may be electrically connected to an initialization power source. The third transistor T3 is an initialization transistor capable of initializing the second node N2. The third transistor T3 may be turned on in case that a sensing control signal is supplied from the control line CLi, to transfer a voltage of the initialization power source to the second node N2. Accordingly, a second storage electrode of the storage capacitor Cst which is electrically connected to the second node N2 may be initialized.

A first storage electrode of the storage capacitor Cst may be electrically connected to the first node N1, and the second storage electrode of the storage capacitor Cst may be electrically connected to the second node N2. The storage capacitor Cst charges a data voltage corresponding to the data signal supplied to the first node N1 during a frame period. Accordingly, the storage capacitor Cst may store a voltage corresponding to the difference between a voltage of the gate electrode of the first transistor T1 and a voltage of the second node N2.

The light emitting part EMU may be configured to include at least one serial stage (or stage) including light emitting elements LD electrically connected in parallel to each other. In an example, the light emitting part EMU may be configured in a series-parallel hybrid structure as shown in FIGS. 5 and 6.

First, referring to FIG. 5, the light emitting part EMU may include first and second serial stages SET1 and SET2 sequentially electrically connected between the first and second driving power sources VDD and VSS. Each of the first and second serial stages SET1 and SET2 may include two electrodes PE1 and CTE1 or CTE2 and PE2 constituting an electrode pair of the corresponding serial stage, and light emitting elements LD electrically connected in parallel in a same direction between the two electrodes PE1 and CTE1 or CTE2 and PE2.

The first serial stage SET1 (or first stage) includes the first pixel electrode PE1 and a first intermediate electrode CTE1, and may include at least one first light emitting element LD1 electrically connected between the first pixel electrode PE1 and the first intermediate electrode CTE1. The first serial stage SET1 may include a reverse light emitting element LDr electrically connected to the first light emitting element LD1 in a direction opposite to that in which the first light emitting element LD1 is electrically connected between the first pixel electrode PE1 and the first intermediate electrode CTE1.

The second serial stage SET (or second stage) includes a second intermediate electrode CTE2 and the second pixel electrode PE2, and may include at least one second light emitting element LD2 electrically connected between the second intermediate electrode CTE2 and the second pixel electrode PE2. The second serial stage SET2 may include a reverse light emitting element LDr electrically connected to the second light emitting element LD2 in a direction opposite to that in which the second light emitting element LD2 is electrically connected between the second intermediate electrode CTE2 and the second pixel electrode PE2.

The first intermediate electrode CTE1 and the second intermediate electrode CTE2 may be electrically and/or physically connected to each other. The first intermediate electrode CTE1 and the second intermediate electrode CTE2 may constitute an intermediate electrode CTE which electrically connects the first serial stage SET1 to the second serial stage SET2, which are consecutive.

In the above-described embodiment, the first pixel electrode PE1 of the first serial stage SET1 may be an anode of each pixel PXL, and the second pixel electrode PE2 of the second serial stage SET2 may be a cathode of the corresponding pixel PXL.

As described above, the light emitting part EMU of the pixel PXL, which includes the serial stages SET1 and SET2 (or the light emitting elements LD) electrically connected in the series-parallel hybrid structure, can easily control driving current/voltage conditions to be suitable for specifications of a product to which the light emitting part EMU is applied.

The light emitting part EMU of the pixel PXL, which includes the serial stages SET1 and SET2 (or the light emitting elements LD) electrically connected in the series-parallel hybrid structure, can decrease a driving current, as compared with a light emitting part EMU having a structure in which light emitting elements LD are electrically connected only in parallel. The light emitting part EMU of the pixel PXL, which includes the serial stages SET1 and SET2 electrically connected in the series-parallel hybrid structure, can decrease a driving voltage applied to both ends of the light emitting part EMU, as compared with a light emitting part EMU having a structure in which the same number of light emitting elements LD are electrically connected only in series. Further, the light emitting part EMU of the pixel PXL, which includes the serial stages SET1 and SET2 (or the light emitting elements LD) electrically connected in the series-parallel hybrid structure, can include a larger number of light emitting elements LD between the same number of electrodes PE, CTE1, CTE2, and PE2, as compared with a light emitting part EMU having a structure in which serial stages (or stages) are all electrically connected in series. Thus, the light emission efficiency of the light emitting element LD can be improved, and the ratio of light emitting elements LD which do not emit light because of a failure can be relatively decreased even in case that the failure occurs in a specific serial stage (or stage). Accordingly, the deterioration of the light emission efficiency of light emitting elements LD can be reduced.

Although the light emitting part EMU including the first serial stage SET1 and the second serial stage SET2 has been described in the above-described embodiment, the disclosure is not limited thereto. In some embodiments, the light emitting part EMU may include a first serial stage SET1, a second serial stage SET2, a third serial stage SET3, and a fourth serial stage SET4 as shown in FIG. 6.

Referring to FIG. 6, the light emitting part EMU may include first to fourth serial stages SET1, SET2, SET3, and SET4 sequentially electrically connected between the first and second driving power sources VDD and VSS. Each of the first to fourth serial stages SET1, SET2, SET3, and SET4 may include two electrodes PE1 and CTE1_1, CTE1_2 and CTE2_1, CTE2_2 and CTE3_1, or CTE3_2 and PE2 constituting an electrode pair of the corresponding serial stage, and light emitting elements LD electrically connected in a same direction in parallel between the two electrodes PE1 and CTE1_1, CTE1_2 and CTE2_1, CTE2_2 and CTE3_1, or CTE3_2 and PE2.

The first serial stage SET1 (or first stage) includes the first pixel electrode PE1 and a (1-1)th intermediate electrode CTE1_1, and may include at least one first light emitting element LD1 electrically connected between the first pixel electrode PE1 and the (1-1)th intermediate electrode CTE1_1. The first serial stage SET1 may include a reverse light emitting element LDr electrically connected in a direction opposite to that in which the first light emitting element LD1 is electrically connected between the first pixel electrode PE1 and the (1-1)th intermediate electrode CTE1_1.

The second serial stage SET2 (or second stage) includes a (1-2)th intermediate electrode CTE1_2 and a (2-1)th intermediate electrode CTE2_1, and may include at least one second light emitting element LD2 electrically connected between the (1-2)th intermediate electrode CTE1_2 and the (2-1)th intermediate electrode CTE2_1. The second serial stage SET2 may include a reverse light emitting element LDr electrically connected in a direction opposite to that in which the second light emitting element LD2 is electrically connected between the (1-2)th intermediate electrode CTE1_2 and the (2-1)th intermediate electrode CTE2_1.

The (1-1)th intermediate electrode CTE1_1 and the (1-2)th intermediate electrode CTE1_2 may be electrically and/or physically connected to each other. The (1-1)th intermediate electrode CTE1_1 and the (1-2)th intermediate electrode CTE1_2 may constitute a first intermediate electrode CTE1 which electrically connects the first serial stage SET1 to the second serial stage SET2, which are consecutive.

The third serial stage SET3 (or third stage) includes a (2-2)th intermediate electrode CTE2_2 and a (3-1)th intermediate electrode CTE3_1, and may include at least one third light emitting element LD3 electrically connected between the (2-2)th intermediate electrode CTE2_2 and the (3-1)th intermediate electrode CTE3_1. The third serial stage SET3 may include a reverse light emitting element LDr electrically connected in a direction opposite to that in which the third light emitting element LD3 is electrically connected between the (2-2)th intermediate electrode CTE2_2 and the (3-1)th intermediate electrode CTE3_1.

The (2-1)th intermediate electrode CTE2_1 and the (2-2)th intermediate electrode CTE2_2 may be electrically and/or physically connected to each other. The (2-1)th intermediate electrode CTE2_1 and the (2-2)th intermediate electrode CTE2_2 may constitute a second intermediate electrode CTE2 which electrically connects the second serial state SET2 to the third serial stage SET3, which are consecutive.

The fourth serial stage SET4 (or fourth stage) includes a (3-2)th intermediate electrode CTE3_2 and the second pixel electrode PE2, and may include at least one fourth light emitting element LD4 electrically connected between the (3-2)th intermediate electrode CTE3_2 and the second pixel electrode PE2. The fourth serial stage SET4 may include a reverse light emitting element LDr electrically connected in a direction opposite to that in which the fourth light emitting element LD4 is electrically connected between the (3-2)th intermediate electrode CTE3_2 and the second pixel electrode PE2.

The (3-1)th intermediate electrode CTE3_1 and the (3-2)th intermediate electrode CTE3_2 may be electrically and/or physically connected to each other. The (3-1)th intermediate electrode CTE3_1 and the (3-2)th intermediate electrode CTE3_2 may constitute a third intermediate electrode CTE3 which electrically connects the third serial stage SET3 to the fourth serial stage SET4, which are consecutive.

In the above-described embodiment, the first pixel electrode PE1 of the first serial stage SET1 may be an anode of the light emitting part EMU, and the second pixel electrode PE2 of the fourth serial stage SET4 may be a cathode of the light emitting part EMU.

Although an embodiment in which all the first to third transistors T1, T2, and T3 included in the pixel circuit PXC are N-type transistors is illustrated in FIGS. 5 and 6, the disclosure is not limited thereto. For example, at least one of the first to third transistors T1, T2, and T3 may be replaced with a P-type transistor. Also, although an embodiment in which the light emitting part EMU is electrically connected between the pixel circuit PXC and the second driving power source VSS is illustrated in FIGS. 5 and 6, the light emitting part EMU may be electrically connected between the first driving power source VDD and the pixel circuit PXC.

The structure of the pixel circuit PXC may be variously modified and embodied. In an example, the pixel circuit PXC may additionally further include at least one transistor element such as a transistor element for initializing the first node N1 and/or a transistor element for controlling an emission time of the light emitting elements LD, or other circuit elements such as a boosting capacitor for boosting the voltage of the first node N1.

The structure of a pixel PXL applied to the disclosure is not limited to the embodiments shown in FIGS. 5 and 6, and the corresponding pixel PXL may have various structures. For example, each pixel PXL may be configured in a passive type light emitting display device, etc. The pixel circuit PXC may be omitted, and both end portions of the light emitting element LD included in the light emitting part EMU may be directly electrically connected to the scan line Si, the data line Dj, the first power line PL1 to which the first driving power source VDD is applied, the second power line PL2 to which the second driving power source VSS is applied, and/or a control line.

Figure 7:
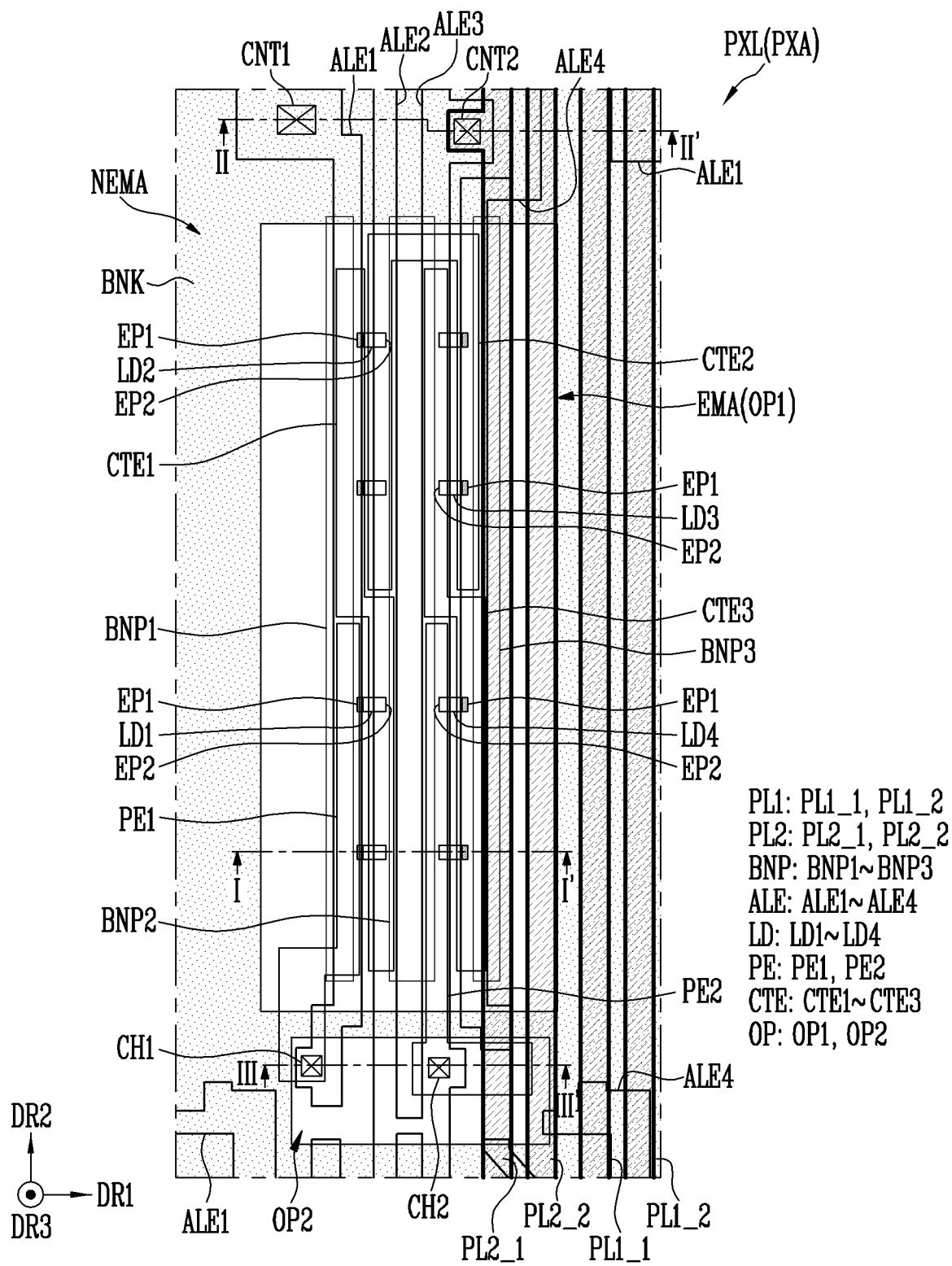
FIG. 7 is a plan view schematically illustrating a pixel in accordance with an embodiment of the disclosure.

FIG. 7 is a plan view schematically illustrating a pixel PXL in accordance with an embodiment of the disclosure.

In FIG. 7, for convenience, illustration of transistors electrically connected to light emitting elements LD will be omitted. Also, in FIG. 7, for convenience, only a first power line PL1 and a second power line PL2 among signal lines provided to the pixel PXL are illustrated.

In an embodiment, for convenience of description, a lateral direction (or horizontal direction) on a plane is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may mean directions respectively indicated by the first to third directions DR1, DR2, and DR3.

In an embodiment, the term "connection" between two components may include both electrical connection and physical connection, but the disclosure is not limited thereto.

Referring to FIGS. 4, 6, and 7, the pixel PXL may be located in a pixel area PXA provided on the substrate SUB. The pixel area PXA may include an emission area EMA and a non-emission area NEMA.

The pixel PXL may include a bank BNK located in the non-emission area NEMA.

The bank BNK is a structure which defines (or partitions) a pixel area PXA (or emission area EMA) of each of the pixel PXL and pixels PXL adjacent thereto, and may be, for example, a pixel defining layer.

In an embodiment, the bank BNK may be a pixel defining layer or a dam structure, which defines each emission area EMA to which light emitting elements LD are to be supplied, in a process of supplying (or inputting) the light emitting elements LD to the pixel PXL. In an example, the emission area EMA of the pixel PXL is partitioned by the bank BNK, so that a mixed liquor (e.g., ink) including a desired amount and/or a desired kind of light emitting elements LD can be supplied (or input) to the emission area EMA.

The bank BNK includes at least one light blocking material and/or at least one reflective material to prevent a light leakage defect in which light (or beam) is leaked between the pixel PXL and pixels PXL adjacent thereto. In some embodiments, the bank BNK may include a transparent material (or substance). In an example, the transparent material may include polyamides resin, polyimides resin, etc., but the disclosure is not limited thereto. In an embodiment, a reflective material layer (or reflective layer) may be separately provided and/or formed on the bank BNK so as to further improve the efficiency of light emitted from the pixel PXL.

The bank BNK may include at least one opening OP exposing components located thereunder in the pixel area PXA. In an example, the bank BNK may include a first opening OP1 and a second opening OP2 which expose the components located under the bank BNK. In an embodiment, the emission area EMA of the pixel PXL and the first opening OP1 of the bank BNK may correspond to each other.

In the pixel area PXA, the second opening OP2 is located to be spaced apart from the first opening OP1 and may be located adjacent to a side, e.g., a lower side of the pixel area PXA. In an embodiment, the second opening OP2 may be an electrode separation area in which at least one alignment electrode ALE is separated from at least one alignment electrode ALE provided in pixels PXL adjacent thereto in the second direction DR2.

The pixel PXL may include pixel electrodes PE and intermediate electrodes CTE, which are provided in at least the emission area EMA, light emitting elements LD electrically connected between the pixel electrode PE and the intermediate electrodes CTE, alignment electrodes ALE provided at positions corresponding to the pixel electrode PE and the intermediate electrodes CTE, and bank patterns BNP provided on the bottom of the alignment electrodes ALE such that each of the bank patterns BNP overlaps at least one alignment electrode ALE. In an example, the pixel PXL may include first and second pixel electrodes PE1 and PE2, first to third intermediate electrodes CTE1, CTE2, and CTE3, light emitting elements LD, first to fourth alignment electrodes ALE1, ALE2, ALE3, and ALE4, and first to third bank patterns BNP1, BNP2, and BNP3, which are provided in at least the emission area EMA.

The pixel PXL may include at least one pair of pixel electrodes PE, at least one pair of intermediate electrodes CTE, at least one pair of alignment electrode ALE, and/or at least one pair of bank patterns BNP. The number, shape, size, and arrangement structure of each of the pixel electrodes PE, the intermediate electrodes CTE, the alignment electrodes ALE, and/or the bank patterns BNP may be variously changed according to the structure of the pixel PXL (particularly, the light emitting part EMU).

In an embodiment, the bank patterns BNP, the alignment electrodes ALE, the light emitting elements LD, the pixel electrodes PE, and/or the intermediate electrodes CTE may be sequentially provided with respect to a surface of the substrate SUB on which the pixel PXL is provided, but the disclosure is not limited thereto. In some embodiments, the positions and formation order of electrode patterns and/or an insulating layer constituting the pixel PXL may be variously changed. A stacking structure of the pixel PXL will be described below with reference to FIGS. 8 to 13.

The bank patterns BNP may be provided in at least the emission area EMA, be spaced apart from each other in the first direction DR1 in the emission area EMA, and each extend in the second direction DR2.

Each bank pattern BNP (also referred to as a "wall pattern," "protrusion pattern," "supporting pattern," or "pattern") may have a uniform width in the emission area EMA. In an example, when viewed on a plane (or in a plan view), each of the first, second, and third bank patterns BNP1, BNP2, and BNP3 may have a bar-like shape having a constant width in a direction in which the corresponding bank pattern extends in the emission area EMA.

The bank patterns BNP may have widths equal to or different from each other. For example, the first and third bank patterns BNP1 and BNP3 may have a same width in the first direction DR1 in at least the emission area EMA and face each other with the second bank pattern BNP2 interposed therebetween. In an example, the first and third bank patterns BNP1 and BNP3 may be formed symmetrical to each other with respect to the second bank pattern BNP2 in the emission area EMA.

The bank patterns BNP may be arranged at uniform distances in the emission area EMA. For example, the first, second, and third bank patterns BNP1, BNP2, and BNP3 may be sequentially arranged at a constant distance in the first direction in the emission area EMA.

Each of the first and third bank patterns BNP1 and BNP3 may partially overlap at least one alignment electrode ALE in at least the emission area EMA. For example, the first bank pattern BNP1 may be located on the bottom of the first alignment electrode ALE1 to overlap a portion of the first alignment electrode ALE1, and the third bank pattern BNP3 may be located on the bottom of the fourth alignment electrode ALE4 to overlap a portion of the fourth alignment electrode ALE4.

The second bank pattern BNP2 may partially overlap the second and third alignment electrodes ALE2 and ALE3 in at least the emission area EMA. For example, the second bank pattern BNP2 may be provided on the bottoms of the second and third alignment electrodes ALE2 and ALE3 to overlap each of a portion of the second alignment electrode ALE2 and a portion of the third alignment electrode ALE3.

As the bank patterns BNP are provided on the bottom of a portion of each of the alignment electrodes ALE in the emission area EMA, a portion of each of the alignment electrodes ALE may protrude in an upward direction of the pixel PXL in areas in which the bank patterns BNP are formed. Accordingly, a wall structure may be formed at the periphery of the light emitting elements LD. For example, the wall structure may be formed in the emission area EMA to face first and second end portions EP1 and EP2 of the light emitting elements LD. The wall structure may correspond to the bank patterns BNP.

In an embodiment, in case that the bank patterns BNP and/or the alignment electrodes ALE include a reflective material, a reflective wall structure may be formed at the periphery of the light emitting elements LD. Accordingly, light emitted from the light emitting elements LD is oriented in the upward direction of the pixel PXL (e.g., an image display direction of the display device), thereby further improving the light efficiency of the pixel PXL.

The alignment electrodes ALE may be located in at least the emission area EMA. In the emission area EMA, the alignment electrodes ALE may be spaced apart from each other in the first direction DR1, and each of the alignment electrodes ALE may extend in the second direction DR2. Portions of the alignment electrodes ALE may be removed in the second opening OP2 of the bank BNK such that the alignment electrodes ALE are separated from alignment electrodes ALE provided in pixels PXL adjacent to the pixel PXL in the second direction DR2.

In an embodiment, the alignment electrodes ALE may include the first alignment electrode ALE1 (or first alignment line), the second alignment electrode ALE2 (or second alignment line), the third alignment electrode ALE3 (or third alignment line), and the fourth alignment electrode ALE4 (or fourth alignment line), which are arranged to be spaced apart from each other in the first direction DR1.

The first alignment electrode ALE1 may be located on the first bank pattern BNP1 and overlap the first bank pattern BNP1. The first alignment electrode ALE1 may be separated from a first alignment electrode ALE1 provided in adjacent pixels PXL adjacent to the pixel PXL in the second direction DR2 in the second opening OP2 (or the electrode separation area) of the bank BNK.

The second alignment electrode ALE2 may be located on a side surface of the second bank pattern BNP2 and to partially overlap the second bank pattern BNP2. The second alignment electrode ALE2 may be electrically connected to a second alignment electrode ALE2 provided in adjacent pixels PXL adjacent to the pixel PXL in the second direction DR2 in the second opening OP2 (or the electrode separation area) of the bank BNK. The second alignment electrode ALE2 may be integrally formed with a third alignment electrode ALE3 provided in a corresponding pixel PXL to be electrically and/or physically connected to the third alignment electrode ALE3.

The third alignment electrode ALE3 may be located on the other side surface (or another side surface) of the second bank pattern BNP2 and partially overlap the second bank pattern BNP2. The third alignment electrode ALE3 may be electrically connected to a third alignment electrode ALE3 provided in adjacent pixels PXL adjacent to the pixel PXL in the second direction DR2 in the second opening OP2 (or the electrode separation area) of the bank BNK. The third alignment electrode ALE3 may be integrally formed with a second alignment electrode ALE2 provided in a corresponding pixel PXL to be electrically and/or physically connected to the second alignment electrode ALE2.

The fourth alignment electrode ALE4 may be located on the third bank pattern BNP3 and overlap the third bank pattern BNP3. The fourth alignment electrode ALE4 may be separated from a fourth alignment electrode ALE4 provided in adjacent pixels PXL adjacent to the pixel PXL in the second direction DR2 in the second opening OP2 (or the electrode separation area) of the bank BNK.

In an embodiment, the first alignment electrode ALE1 may be electrically connected to a pixel circuit PXC and/or the first power line PL1 through a first contact part CNT1 at an upper end portion of the non-emission area NEMA. The first contact part CNT1 may be formed by removing a portion of at least one insulating layer located between the first alignment electrode ALE1 and a component of the pixel circuit PXC. The first alignment electrode ALE1 may be electrically connected to the first pixel electrode PE1 through a first contact hole CH1 in the second opening OP2 of the bank BNK. The first contact hole CH1 may be formed by removing a portion of at least one insulating layer located between the first alignment electrode ALE1 and the first pixel electrode PE1.

The third alignment electrode ALE3 may be electrically connected to a (2-1)th sub-power line PL2_1 through a second contact part CNT2 at an upper end portion of the non-emission area NEMA. The second contact part CNT2 may be formed by removing a portion of at least one insulating layer located between the third alignment electrode ALE3 and the (2-1)th sub-power line PL2_1. The third alignment electrode ALE3 may be electrically connected to the second pixel electrode PE2 through a second contact hole CH2 in the second opening OP2 of the bank BNK. The second contact hole CH2 may be formed by removing a portion of at least one insulating layer located between the third alignment electrode ALE3 and the second pixel electrode PE2.

The first contact part CNT1 and the second contact part CNT2 may be located in the non-emission area NEMA to overlap the bank BNK. However, the disclosure is not limited thereto. In some embodiments, the first contact part CNT1 and the second contact part CNT2 may be located in the second opening OP2 as the electrode separation area.

The first contact hole CH1 and the second contact hole CH2 may be located in the second opening OP2 of the bank BNK, but the disclosure is not limited thereto. In some embodiments, the first contact hole CH1 and the second contact hole CH2 may be located in the emission area EMA.

A pair of alignment electrodes ALE adjacent to each other may be supplied with different signals in an alignment process of light emitting elements LD and be spaced apart from each other at a uniform distance in the emission area EMA. When assuming that at least two pairs of alignment electrodes ALE are provided in the emission area EMA, each pair of alignment electrodes ALE may be spaced apart from each other at a same distance.

The first and second alignment electrodes ALE1 and ALE2 may form a pair and be supplied with different alignment signals, and the third and fourth alignment electrodes ALE3 and ALE4 may form a pair and be supplied with different alignment signals. In the emission area EMA, the first and second alignment electrodes ALE1 and ALE2 may be spaced apart from each other at a constant distance in the first direction DR1, and the third and fourth alignment electrodes ALE3 and ALE4 may also be spaced apart from each other at a constant distance in the first direction DR1.

The second and third alignment electrodes ALE2 and ALE3 may be supplied with a same signal in a process of aligning the light emitting elements LD.

The above-described alignment signals may be signals having a voltage difference and/or a phase difference to a degree to which the light emitting elements LD can be aligned between the alignment electrodes ALE. At least one of the alignment signals may be an alternating current (AC) signal (or voltage), but the disclosure is not limited thereto.

The first alignment electrode ALE1 may be electrically connected to each of a component of the pixel circuit PXC and the first pixel electrode PE1. The first alignment electrode ALE1 may be electrically connected to the component of the pixel circuit PXC through the first contact part CNT1 and be electrically connected to the first pixel electrode PE1 through the first contact hole CH1.

The third alignment electrode ALE3 may be electrically connected to each of the second power line PL2 and the second pixel electrode PE2. The third alignment electrode ALE3 may be electrically connected to the second power line PL2 through the second contact part CNT2 and be electrically connected to the second pixel electrode PE2 through the second contact hole CH2.

At least two to a few tens of light emitting elements LD may be aligned and/or provided in the pixel area PXA, but the number of the light emitting elements LD is not limited thereto. In some embodiments, the number of light emitting elements LD aligned and/or provided in the emission area EMA (or the pixel area PXA) may be variously changed.

The light emitting elements LD may include a first light emitting element LD1, a second light emitting element LD2, a third light emitting element LD3, and a fourth light emitting element LD4.

The first light emitting element LD1 may be aligned between the first alignment electrode ALE1 and the second alignment electrode ALE2 to be electrically connected between the first pixel electrode PE1 and the first intermediate electrode CTE1, and the second light emitting element LD2 may be aligned between the first alignment electrode ALE1 and the second alignment electrode ALE2 to be electrically connected between the first intermediate electrode CTE1 and the second intermediate electrode CTE2. In a plan view, the first light emitting element LD1 may be aligned at a lower end in an area between the first alignment electrode ALE1 and the second alignment electrode ALE2, and the second light emitting element LD2 may be aligned at an upper end in the area.

In an embodiment, each of the first light emitting element LD1 and the second light emitting element LD2 may be provided in plurality. A first end portion EP1 of each of the first light emitting elements LD1 may be electrically connected to the first pixel electrode PE1, and a second end portion EP2 of each of the first light emitting elements LD1 may be electrically connected to the first intermediate electrode CTE1. A first end portion EP1 of each of the second light emitting elements LD2 may be electrically connected to the first intermediate electrode CTE1, and a second end portion EP2 of each of the second light emitting elements LD2 may be electrically connected to the second intermediate electrode CTE2.

The third light emitting element LD3 may be aligned between the third alignment electrode ALE3 and the fourth alignment electrode ALE4 to be electrically connected between the second intermediate electrode CTE2 and the third intermediate electrode CTE3, and the fourth light emitting element LD4 may be aligned between the third alignment electrode ALE3 and the fourth alignment electrode ALE4 to be electrically connected between the third intermediate electrode CTE3 and the second pixel electrode PE2. In a plan view, the third light emitting elements LD3 may be aligned at an upper end in an area between the third alignment electrode ALE3 and the fourth alignment electrode ALE4, and the fourth light emitting element LD4 may be aligned at a lower end in the area.

In an embodiment, each of the third light emitting element LD3 and the fourth light emitting element LD4 may be provided in plurality. A first end portion EP1 of each of the third light emitting elements LD3 may be electrically connected to the second intermediate electrode CTE2, and a second end portion EP2 of each of the third light emitting elements LD3 may be electrically connected to the third intermediate electrode CTE3. A first end portion EP1 of each of the fourth light emitting elements LD4 may be electrically connected to the third intermediate electrode CTE3, and a second end portion EP2 of each of the fourth light emitting elements LD4 may be electrically connected to the second pixel electrode PE2.

As described above, first light emitting elements LD1 may be located at a left lower end of the emission area EMA, second light emitting elements LD2 may be located at a left upper end of the emission area EMA, third light emitting elements LD3 may be located at a right upper end of the emission area EMA, and fourth light emitting elements LD4 may be located at a right lower end of the emission area EMA. However, the arrangement and/or connection structure of the light emitting elements LD is not limited to the above-described embodiment. In some embodiments, the arrangement and/or connection structure of the light emitting elements LD may be variously changed according to the number of components and/or serial stages (or stages), which are included in the light emitting part EMU.

The first light emitting elements LD1 may be electrically connected in parallel to each other between the first pixel electrode PE1 and the first intermediate electrode CTE1, and constitute a first serial stage SET1. The second light emitting elements LD2 may be electrically connected in parallel to each other between the first intermediate electrode CTE1 and the second intermediate electrode CTE2, and constitute a second serial stage SET2. The third light emitting elements LD3 may be electrically connected in parallel to each other between the second intermediate electrode CTE2 and the third intermediate electrode CTE3, and constitute a third serial stage SET3. The fourth light emitting elements LD4 may be electrically connected in parallel to each other between the third intermediate electrode CTE3 and the second pixel electrode PE2, and constitute a fourth serial stage SET4.

In some embodiments, each of the first light emitting element LD1, the second light emitting element LD2, the third light emitting element LD3, and the fourth light emitting element LD4 may be a light emitting diode having a subminiature size, e.g., a size small to a degree of nanometer scale to micrometer scale, which is fabricated by using a material having an inorganic crystalline structure. For example, each of the first light emitting element LD1, the second light emitting element LD2, the third light emitting element LD3, and the fourth light emitting element LD4 may be the light emitting element LD described with reference to FIGS. 1 to 3.

The pixel electrodes PE and the intermediate electrodes CTE may be provided in at least the emission area EMA and be respectively provided at positions corresponding to at least one alignment electrode ALE and at least one light emitting element LD. For example, each pixel electrode PE and each intermediate electrode CTE may be formed on each alignment electrode ALE and corresponding light emitting elements LD to overlap the alignment electrode ALE and the corresponding light emitting elements LD. Therefore, the pixel electrode PE and the intermediate electrode CTE may be electrically connected to at least the light emitting elements LD.

The first pixel electrode PE1 (or a first electrode) may be formed on a portion (e.g., a lower end portion) of the first alignment electrode ALE1 and the first end portion EP1 of each of the first light emitting elements LD1 to be electrically connected to the first end portion EP1 of each of the first light emitting elements LD1.

The second pixel electrode PE2 (or second electrode) may be formed on a portion (e.g., a lower end portion) of the third alignment electrode ALE3 and the second end portion EP2 of each of the fourth light emitting elements LD4 to be electrically connected to the second end portion EP2 of each of the fourth light emitting elements LD4. The second pixel electrode PE2 may be electrically connected to the first, second, and third light emitting elements LD1, LD2, and LD3 via at least one intermediate electrode CTE and/or at least one light emitting elements LD. In an example, the second pixel electrode PE2 may be electrically connected to the second end portion EP2 of each first light emitting element LD1 via the first intermediate electrode CTE1, the second light emitting element LD2, the second intermediate electrode CTE2, the third light emitting element LD3, the third intermediate electrode CTE3, and the fourth light emitting element LD4.

The first intermediate electrode CTE1 may be formed on a portion (e.g., a lower end portion) of the second alignment electrode ALE2 and the second end portion EP2 of each of the first light emitting elements LD1 to be electrically connected to the second end portion EP2 of each of the first light emitting elements LD1. The first intermediate electrode CTE1 may be formed on another portion (e.g., an upper end portion) of the first alignment electrode ALE1 and the first end portion EP1 of each of the second light emitting element LD2 to be electrically connected to the first end portion EP1 of each of the second light emitting elements LD2. The above-described first intermediate electrode CTE1 may be a first bridge electrode which electrically connects the first serial stage SET1 (or the first light emitting elements LD1) and the second serial stage SET2 (or the second light emitting elements LD2) to each other.

To this end, the first intermediate electrode CTE1 may have a shape bent at least once. In an example, the first intermediate electrode CTE1 may have a shape bent, warped or curved at least once between an area in which at least one first light emitting element LD1 is arranged and an area in which at least one second light emitting element LD2 is arranged (e.g., at a boundary between the areas), but the disclosure is not limited thereto. In some embodiments, the first intermediate electrode CTE1 may be modified in various shapes within a range in which the first serial stage SET1 and the second serial stage SET2, which are consecutive, are stably electrically connected to each other.

The first intermediate electrode CTE1 may be located between the first pixel electrode PE1 and the second pixel electrode PE2 and be electrically connected between the first pixel electrode PE1 and the second pixel electrode PE2 through light emitting electrodes LD. For example, the first intermediate electrode CTE1 may be electrically connected to the first pixel electrode PE1 through at least one first light emitting element LD1, and be electrically connected to the second pixel electrode PE2 through at least one second light emitting element LD2, at least one third light emitting element LD3, and/or at least one fourth light emitting element LD4.

The second intermediate electrode CTE2 may be formed on another portion (e.g., an upper end portion) of the second alignment electrode ALE2 and the second end portion EP2 of each of the light emitting elements LD2 to be electrically connected to the second end portion EP2 of each of the second light emitting elements LD2. The second intermediate electrode CTE2 may be formed on a portion (e.g., an upper end portion) of the fourth alignment electrode ALE4 and the first end portion EP1 of each of the third light emitting element LD3 to be electrically connected to the first end portion EP1 of each of the third light emitting element LD3. For example, the second intermediate electrode CTE2 may be electrically connected to the second end portion EP2 of each of the second light emitting elements LD2 and the first end portion EP1 of each of the third light emitting elements LD3 in the emission area EMA. The above-described second intermediate electrode CTE2 may be a second bridge electrode which electrically connects the second serial stage SET2 (or the second light emitting elements LD2) and the third serial stage SET3 (or the third light emitting elements) to each other.

To this end, the second intermediate electrode CTE2 may have a shape bent at least once. For example, the second intermediate electrode CTE2 may have a shape bent, warped, or curved at a boundary between an area in which at least one second light emitting element LD2 is arranged and an area in which at least one third light emitting element LD3 is arranged (or between the areas) or at the periphery thereof, but the disclosure is not limited thereto. In some embodiments, the second intermediate electrode CTE2 may be modified in various shapes within a range in which the second serial stage SET2 and the third serial stage SET3, which are consecutive, are stably electrically connected to each other. In an embodiment, the second intermediate electrode CTE2 does not extend to the second opening OP2 of the bank BNK as the electrode separation area but may be located only in the emission area EMA. However, the disclosure is not limited thereto.

The second intermediate electrode CTE2 may be electrically connected between the first and second pixel electrodes PE1 and PE2 through light emitting elements LD. For example, the second intermediate electrode CTE2 may be electrically connected to the first pixel electrode PE1 through at least one first light emitting element LD1 and/or at least one second light emitting element LD2, and be electrically connected to the second pixel electrode PE2 through at least one third light emitting element LD3 and/or at least one fourth light emitting element LD4.

The third intermediate electrode CTE3 may be formed on another portion (e.g., an upper end portion) of the third alignment electrode ALE3 and the second end portion EP2 of each of the third light emitting elements LD3 to be electrically connected to the second end portion EP2 of each of the third light emitting elements LD3. The third intermediate electrode CTE3 may be formed on another portion (e.g., a lower end portion) of the fourth alignment electrode ALE4 and the first end portion EP1 of each of the fourth light emitting elements LD4 to be electrically connected to the first end portion EP1 of each of the fourth light emitting elements LD4. For example, the third intermediate electrode CTE3 may be electrically connected to the second end portion EP2 of each of the third light emitting elements LD3 and the first end portion EP1 of each of the fourth light emitting elements LD4 in the emission area EMA. The above-described third intermediate electrode CTE3 may be a third bridge electrode which electrically connects the third serial stage SET3 (or the third light emitting elements LD3) and the fourth serial stage SET4 (or the fourth light emitting elements LD4) to each other.

To this end, the third intermediate electrode CTE3 may have a shape bent at least once. For example, the third intermediate electrode CTE3 may have a shape bent, warped, or curved between an area in which at least one third light emitting element LD3 is arranged and an area in which at least one fourth light emitting element LD4 is arranged (or at a boundary between the areas), but the disclosure is not limited thereto. In some embodiments, the third intermediate electrode CTE3 may be modified in various shapes within a range in which the third serial stage SET3 and the fourth serial stage SET4, which are consecutive, are stably electrically connected to each other.

The third intermediate electrode CTE3 may be electrically connected between the first pixel electrode PE1 and the second pixel electrode PE2 through light emitting elements LD. For example, the third intermediate electrode CTE3 may be electrically connected to the first pixel electrode PE1 through at least one first light emitting element LD1, at least one second light emitting element LD2, and/or at least one third light emitting element LD3, and be electrically connected to the second pixel electrode PE2 through at least one fourth light emitting element LD4.

As described above, the first light emitting element LD1 may be electrically connected in series to the second light emitting element LD2 through the first intermediate electrode CTE1, the second light emitting element LD2 may be electrically connected in series to the third light emitting element Ld3 through the second intermediate electrode CTE2, and the third light emitting element LD3 may be electrically connected in series to the fourth light emitting element LD4 through the third intermediate electrode CTE3.

In the pixel PXL, a driving current may flow from the first pixel electrode PE1 to the second pixel electrode PE2 via the first light emitting element LD1, the first intermediate electrode CTE1, the second light emitting element LD2, the second intermediate electrode CTE2, the third light emitting element LD3, the third intermediate electrode CTE3, and the fourth light emitting element LD4 during each frame period.

The first light emitting element LD1, the second light emitting element LD2, the third light emitting element LD3, and the fourth light emitting element LD4 may be electrically connected in series to each other through the first intermediate electrode CTE1, the second intermediate electrode CTE2, and the third intermediate electrode CTE3 between the first pixel electrode PE1 and the second pixel electrode PE2. In this manner, light emitting elements LD aligned in the emission area EMA are electrically connected in a series-parallel hybrid structure to form the light emitting part EMU of the pixel PXL. Accordingly, the light emitting part EMU can be configured in a series-parallel hybrid structure including four serial stages SET1, SET2, SET3, and SET4 while minimizing the area occupied by alignment electrodes ALE (or not increasing the number of alignment electrodes ALE). Accordingly, a display device having high resolution and high definition can be easily implemented.

The first power line PL1 and the second power line PL2 may be located in the pixel area PXA in which the pixel PXL is provided.

The first power line PL1 may extend in a direction, e.g., the second direction DR3. The voltage of the first driving power source VDD may be applied to the first power line PL1. The first power line PL1 may be disposed between the substrate SUB and the bank pattern BNP and overlap the bank BNK. The first power line PL1 may be the first power line PL1 described with reference to FIG. 4.

The second power line PL2 may extend in the same direction (e.g., the second direction DR2) as an extending direction of the first power line PL1, and be disposed to be spaced apart from the first power line PL1. The voltage of the second driving power source VSS may be applied to the second power line PL2. The second power line PL2 may be disposed between the substrate SUB and the bank pattern BNP and partially overlap the alignment electrode ALE. The second power line PL2 may be the second power line PL2 described with reference to FIG. 4.

In an embodiment, each of the first and second power lines PL1 and PL2 may include at least two sub-power lines. In an example, the first power line PL1 may include a (1-1)th sub-power line PL1_1 and a (1-2)th sub-power line PL1_2, and the second power line PL2 may include a (2-1)th sub-power line PL2_1 and a (2-2)th sub-power line PL2_2.

In the pixel area PXA, the (2-1)th sub-power line PL2_1, the (2-2)th sub-power line PL2_2, the (1-1)th sub-power line PL1_1, and the (1-2)th sub-power line PL1_2 may be sequentially arranged in the first direction DR1.

The (2-1)th sub-power line PL2_1 may have a bar-like shape which is located on the substrate SUB and has a constant width in an extending direction thereof (e.g., the second direction DR2) in the pixel area PXA, but the disclosure is not limited thereto. In some embodiments, the (2-1)th sub-power line PL2_1 may have a shape bent at least once or have a shape having no constant width in the extending direction. The (2-1)th sub-power line PL2_1 may be variously modified within a range in which the (2-1)th sub-power line PL2_1 has no influence on components formed on the top thereof (e.g., an insulating layer or a conductive pattern to which a predetermined signal is applied). The (2-1)th sub-power line PL2_1 may be electrically and/or physically connected to the third alignment electrode ALE3 through the second contact part CNT2.

The (2-2)th sub-power line PL2_2 may have a bar-like shape which is located to be spaced apart from the (2-1)th sub-power line PL2_1 in the first direction DR1 on the substrate SUB and has a constant width in an extending direction thereof (e.g., the second direction DR2), but the disclosure is not limited thereto. In some embodiments, the (2-2)th sub-power line PL2_2 may have a shape bent at least once or have a shape having no constant width in the extending direction.

In case that the pixel PXL in which the (2-1)th and (2-2)th sub-power lines PL2_1 and PL2_2 are disposed is the second pixel PXL2, the (2-1)th sub-power line PL2_1 and the (2-2)th sub-power line PL2_2 may be directly electrically connected to the second fan-out line LP2 located in the non-display area NDA of the substrate SUB to be directly supplied with the voltage of the second driving power source VSS from the second fan-out line LP2. In an embodiment, the (2-1)th sub-power line PL2_1 and the (2-2)th sub-power line PL2_2 may branch off to the second pixel area PXA2 in which the second pixel PXL2 is provided from the second fan-out line LP2. Accordingly, the second fan-out line LP2, the (2-1)th sub-power line PL2_1, and the (2-2)th sub-power line PL2_2 may be electrically and/or physically connected to each other.

In case that the pixel PXL in which the (2-1)th and (2-2)th sub-power lines PL2_1 and PL2_2 are disposed is the first pixel PXL1, the (2-1)th and (2-2)th sub-power lines PL2_1 and PL2_2 may be electrically connected to the second power line PL2 disposed in the second pixel PXL2 to be supplied with the voltage of the second driving power source VSS from the second power line PL2.

The (2-1)th sub-power line PL2_1 may be spaced apart from the (2-2)th sub-power line PL2_2 at a distance in the first direction DR1. A line width of the (2-1)th sub-power line PL2_1 and a line width of the (2-2)th sub-power line PL2_2 may be equal to each other, but the disclosure is not limited thereto. In some embodiments, the line width of the (2-1)th sub-power line PL2_1 and the line width of the (2-2)th sub-power line PL2_2 may be different from each other. A distance between the (2-1)th sub-power line PL2_1 and the (2-2)th sub-power line PL2_2 may be equal to or different from the line width of each of the (2-1)th and (2-2)th sub-power lines PL2_1 and PL2_2.

The (1-1)th sub-power line PL1_1 may have a bar-like shape which is located to be spaced apart from the (2-2)th sub-power line PL2_2 in the first direction DR1 on the substrate SUB and has a constant width in an extending direction thereof (e.g., the second direction DR2), but the disclosure is not limited thereto. In some embodiments, the (1-1)th sub-power line PL1_1 may have a shape bent at least once or have a shape having varying widths in the extending direction.

The (1-2)th sub-power line PL1_2 may have a bar-like shape which is located to be spaced apart from the (1-1)th sub-power line PL1_1 in the first direction DR1 on the substrate SUB and has a constant width in an extending direction thereof (e.g., the second direction DR2), but the disclosure is not limited thereto. In some embodiments, the (1-2)th sub-power line PL1_2 may have a shape bent at least once or have a shape having varying widths in the extending direction.

Although not illustrated in the drawings, the (1-1)th sub-power line PL1_1 and the (1-2)th sub-power line PL1_2 may be electrically connected to the first alignment electrode ALE1.

In case that the pixel PXL in which the (1-1)th and (1-2)th sub-power lines PL1_1 and PL1_2 are disposed is the first pixel PXL1, the (1-1)th sub-power line PL1_1 and the (1-2)th sub-power line PL1_2 may be directly electrically connected to the first fan-out line LP1 located in the non-display area NDA of the substrate SUB to be directly supplied with the voltage of the first driving power source VDD from the first fan-out line LP1. The (1-1)th sub-power line PL1_1 and the (1-2)th sub-power line PL1_2 may branch off to the first pixel area PXA1 in which the first pixel PXL1 is provided from the first fan-out line LP1. Accordingly, the first fan-out line LP1, the (1-1)th sub-power line PL1_1, and the (1-2)th sub-power line PL1_2 may be electrically and/or physically connected to each other.

In case that the pixel PXL in which the (1-1)th and (1-2)th sub-power line PL1_1 and PL1_2 are disposed is the second pixel PXL2, the (1-1)th and (1-2)th sub-power line PL1_1 and PL1_2 may be electrically connected to the first power line PL1 disposed in the first pixel PXL1 to be supplied with the voltage of the first driving power source VDD from the first power line PL1.

The (1-1)th sub-power line PL1_1 may be spaced apart from the (1-2)th sub-power line PL1_2 at a distance in the first direction DR1. A line width of the (1-1)th sub-power line PL1_1 and a line width of the (1-2)th sub-power line PL1_2 may be equal to each other, but the disclosure is not limited thereto. In some embodiments, the line width of the (1-1)th sub-power line PL1_1 and the line width of the (1-2)th sub-power line PL1_2 may be different from each other. A distance between the (1-1)th sub-power line PL1_1 and the (1-2)th sub-power line PL1_2 may be equal to or different from the line width of each of the (1-1)th and (1-2)th sub-power line PL1_1 and PL1_2.

The first power line PL1 configured with the (1-1)th and (1-2)th sub-power lines PL1_1 and PL1_2 and the second power line PL2 configured with the (2-1)th and (2-2)th sub-power lines PL2_1 and PL2_2 may be spaced apart from each other at a distance in the first direction DR1 to be electrically disconnected from each other. In an example, the (1-1)th sub-power line PL1_1 and the (2-1)th sub-power line PL2_1 may be adjacent to each other, and be provided on the substrate SUB to be spaced apart from each other at a distance in the first direction DR1 and to be electrically disconnected from each other.

A distance between the first power line PL1 and the second power line PL2 may be greater than the line width of each of the (1-1)th, (1-2)th, (2-1)th, and (2-2)th sub-power lines PL1_1, PL1_2, PL2_1, and PL2_2, but the disclosure is not limited thereto. In some embodiments, the distance between the first power line PL1 and the second power line PL2 may be variously changed within a range in which the first power line PL1 and the second power line PL2 are completely electrically disconnected from each other.

In the above-described embodiment, each of the (1-1)th, (1-2)th, (2-1)th, and (2-2)th sub-power lines PL1_1, PL1_2, PL2_1, and PL2_2 located in the pixel area PXA may be designed to have an intentionally narrow line width. For example, each of the (1-1)th and (1-2)th sub-power lines PL1_1 and PL1_2 may be designed to have a line width smaller than that of the first fan-out line LP1. Each of the (2-1)th and (2-2)th sub-power lines PL2_1 and PL2_2 may be designed to have a line width smaller than that of the second fan-out line LP2. Designing each of the (1-1)th, (1-2)th, (2-1)th, and (2-2)th sub-power lines PL1_1, PL1_2, PL2_1, and PL2_2 to have a narrow line width is for the purpose of preventing a defect of insulating layers located on the (1-1)th, (1-2)th, (2-1)th, and (2-2)th sub-power lines PL1_1, PL1_2, PL2_1, and PL2_2. This will be described in detail below with reference to FIGS. 8 to 13.

Hereinafter, a stacked structure of the pixel PXL in accordance with the above-described embodiment will be described with reference to FIGS. 8 to 13.

Figure 12:
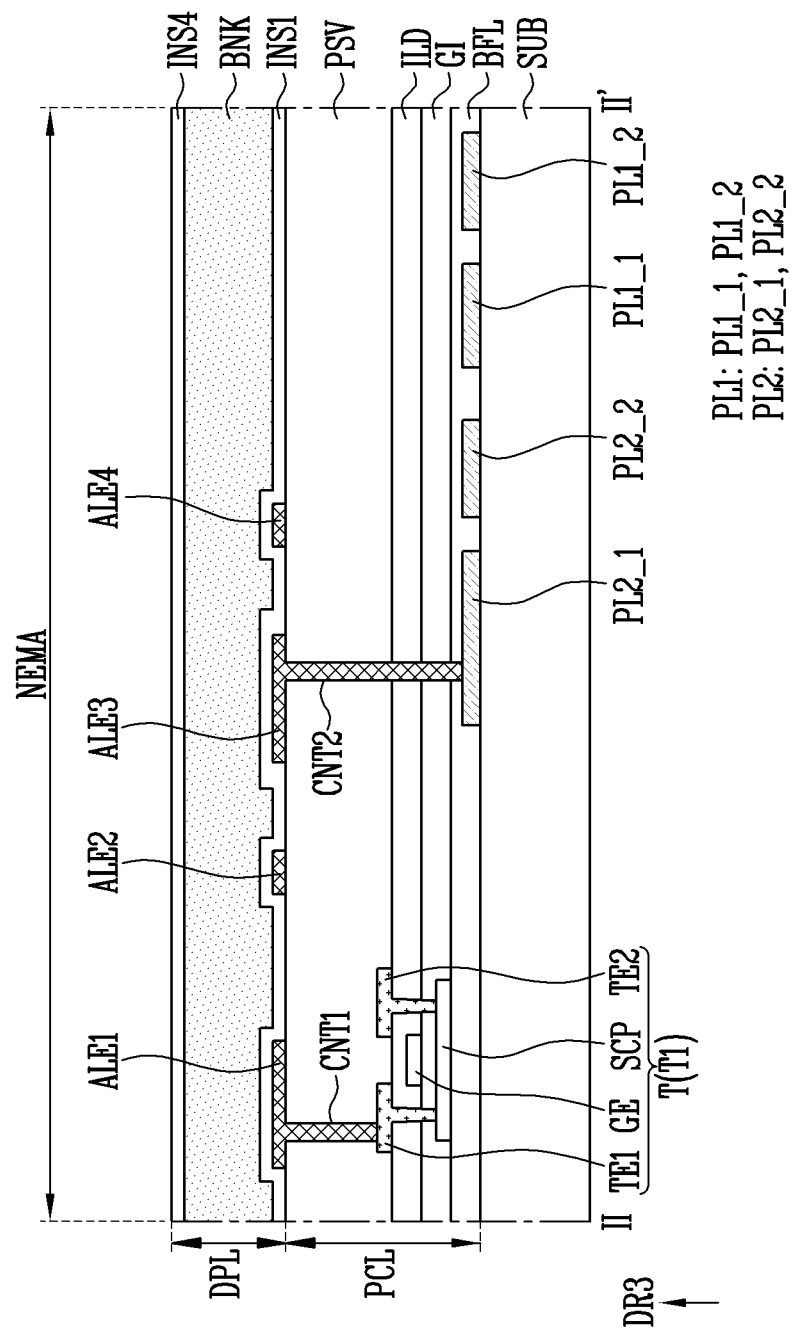
FIG. 12 is a cross-sectional view taken along line II-II' shown in FIG. 7
Figure 13:
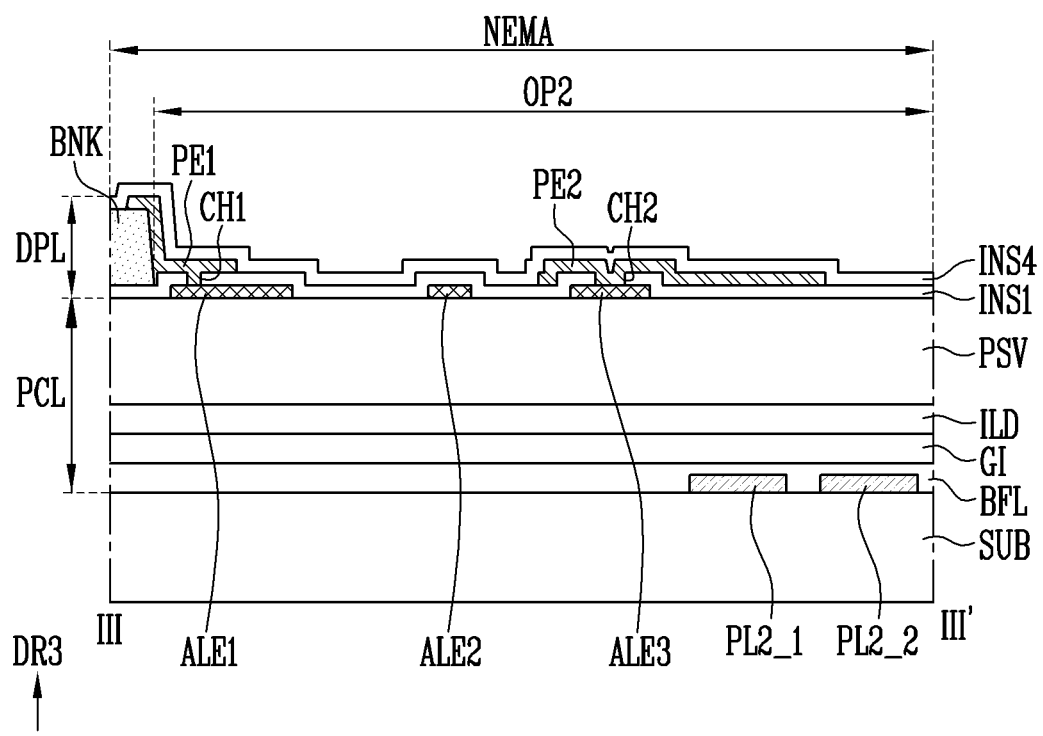
FIG. 13 is a cross-sectional view taken along line shown in FIG. 7.

FIGS. 8 to 11 are schematic sectional views taken along line I-I' shown in FIG. 7. FIG. 12 is a schematic sectional view taken along line II-II' shown in FIG. 7 FIG. 13 is a schematic sectional view taken along line shown in FIG. 7.

In description of embodiments, the term "being formed and/or provided in a same layer" may mean being formed by a same process, and the term "being formed and/or provided in different layers" may mean being formed by different processes.

Figure 8:
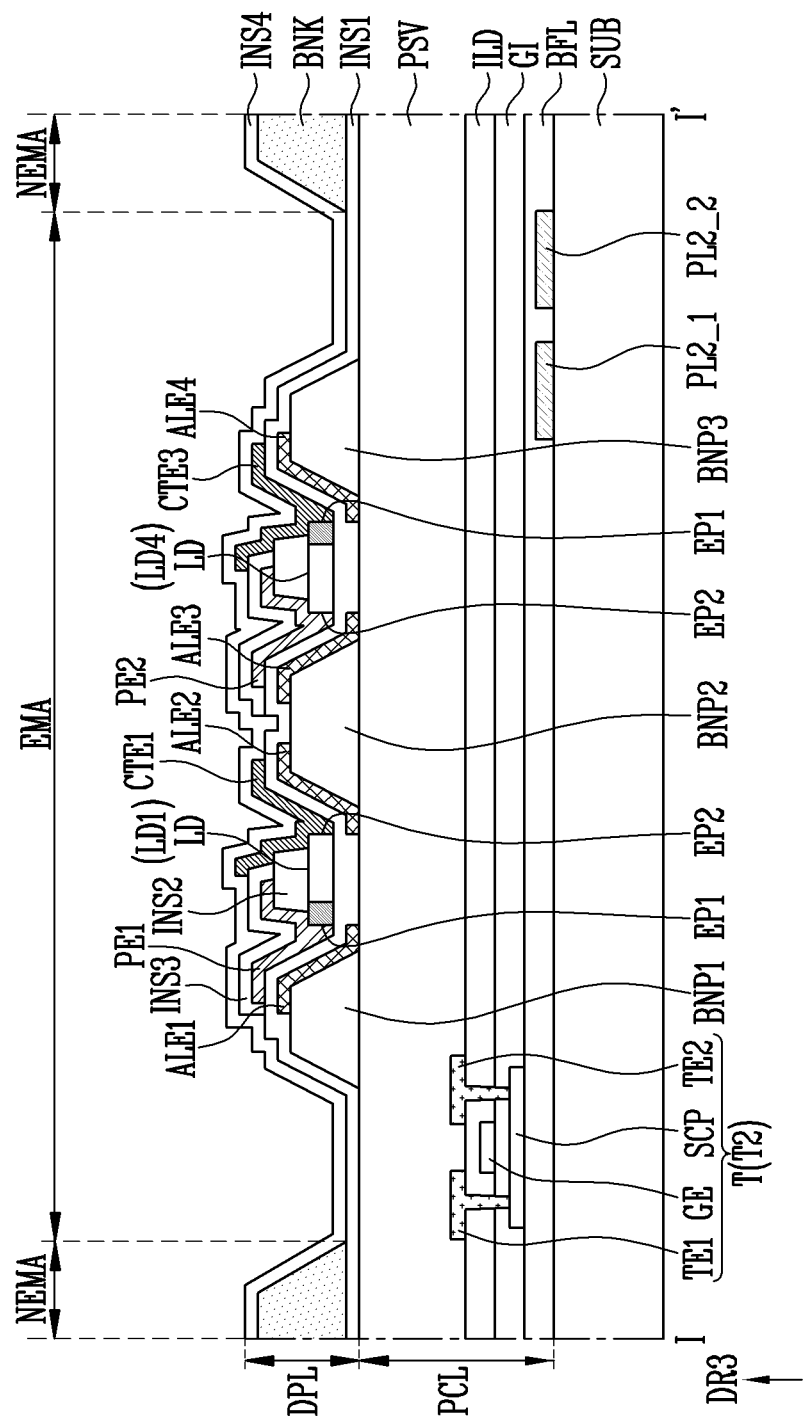
FIGS. 8 to 11 are sectional views taken along line I-I' shown in FIG. 7.
Figure 9:
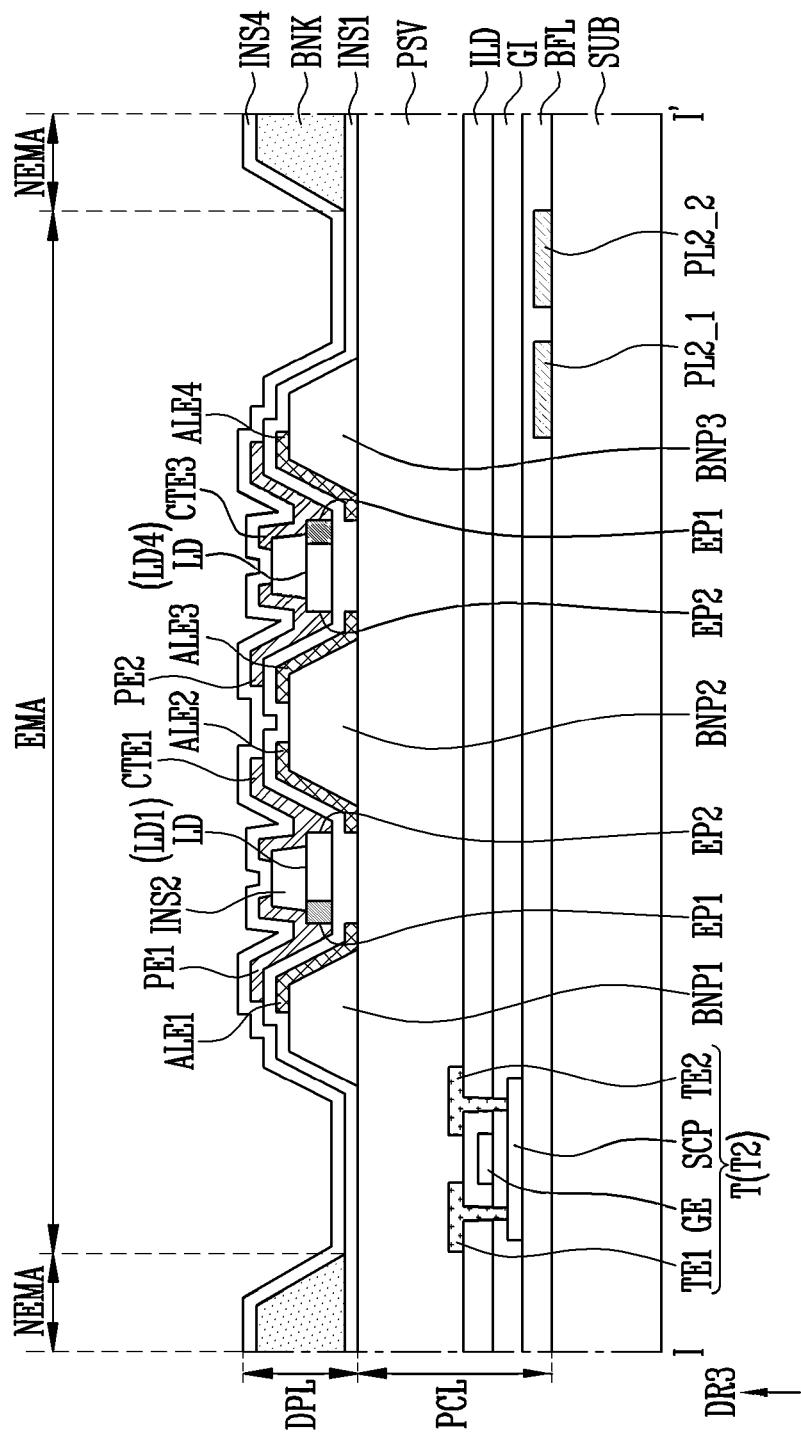

Embodiments shown in FIGS. 8 and 9 represent different embodiments in relation to a process of forming pixel electrodes PE and intermediate electrodes CTE and whether a third insulating layer INS3 is present. For example, an embodiment in which some components CTE1 and CTE3 of the intermediate electrodes CTE are formed after the pixel electrodes PE and the third insulating layer INS3 are formed is illustrated in FIG. 8, and an embodiment in which the pixel electrodes PE and the intermediate electrodes CTE are formed in the same layer is illustrated in FIG. 9.

Figure 10:
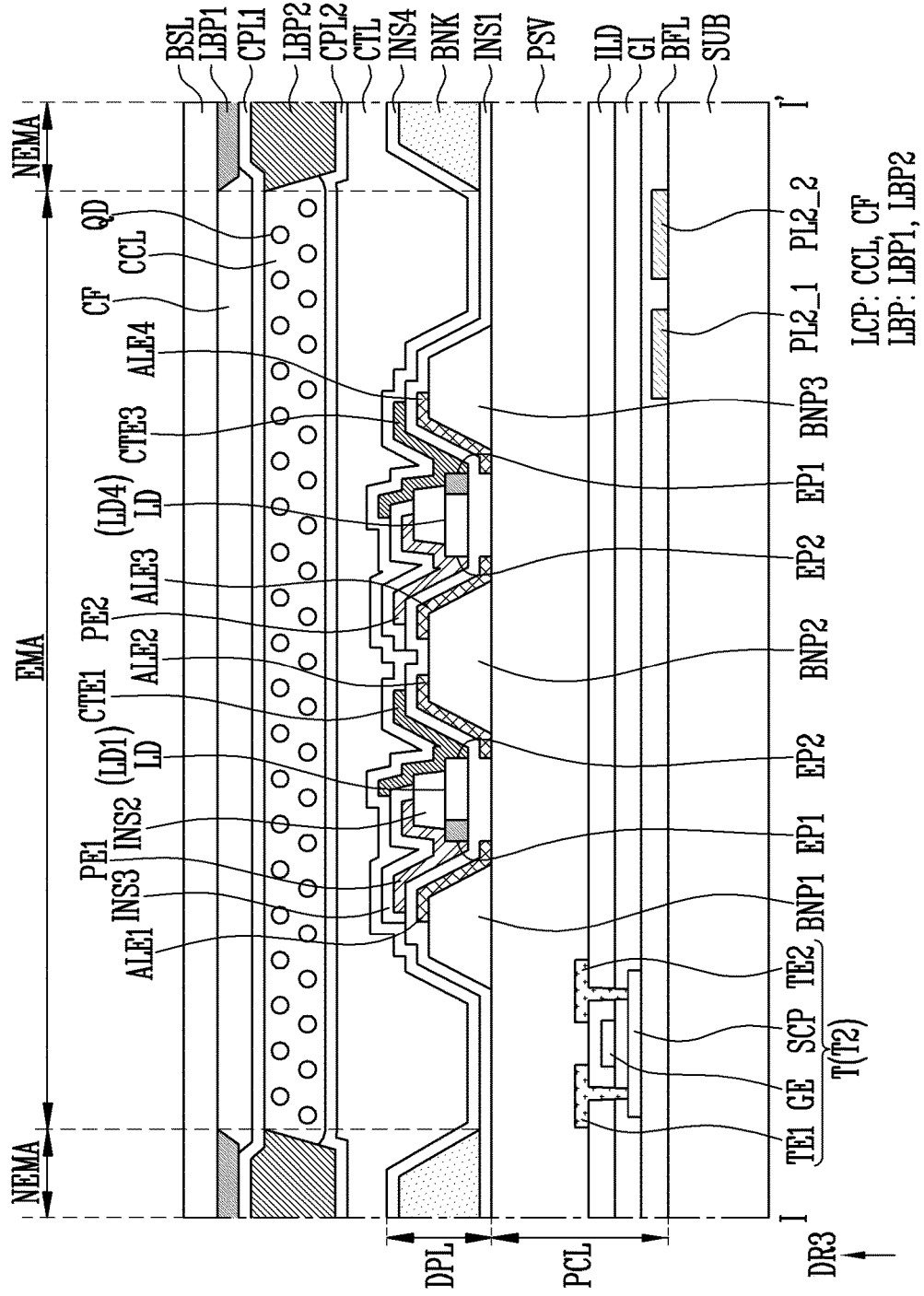
Figure 11:
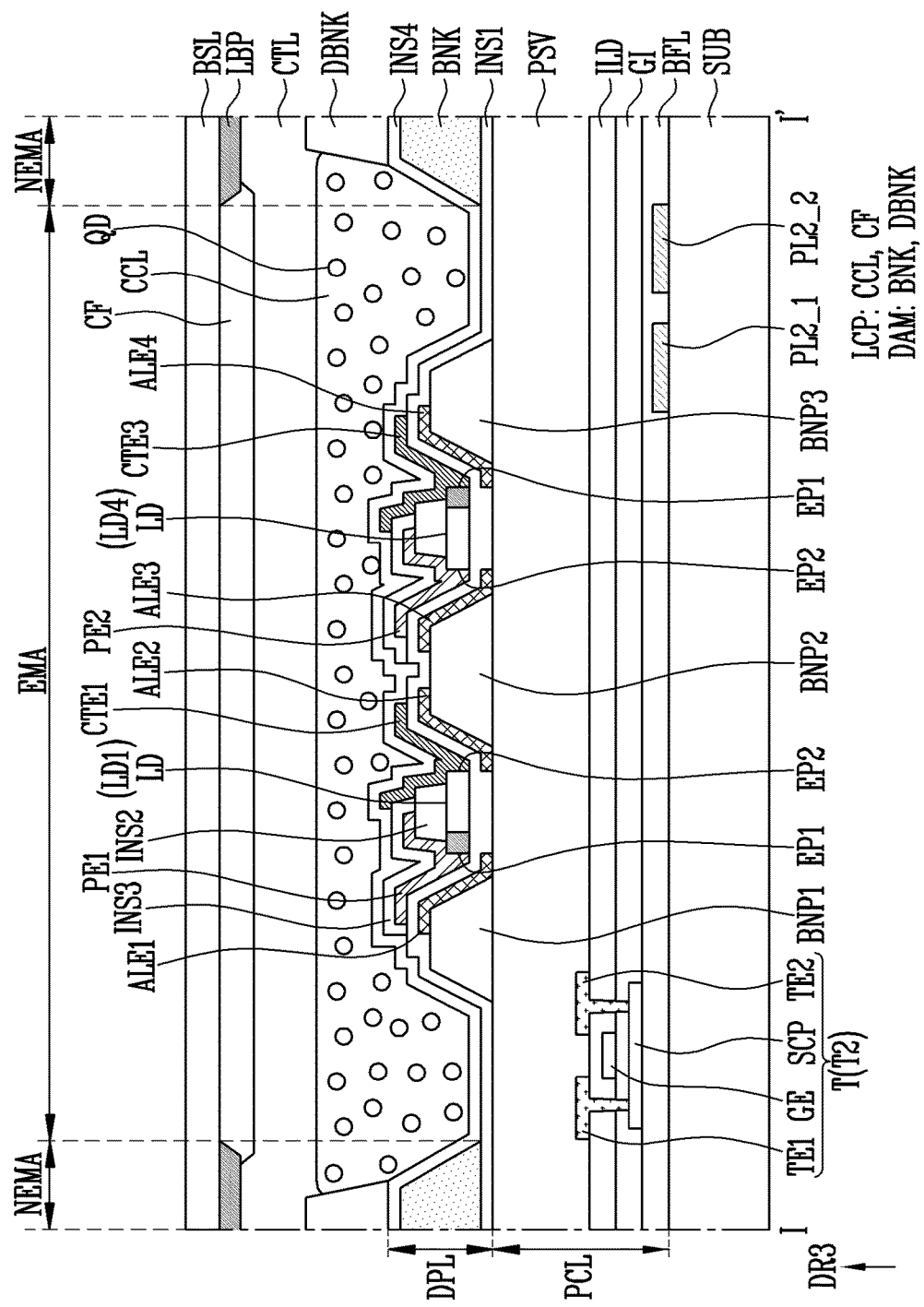

FIGS. 10 and 11 illustrate modified embodiments of the embodiment shown in FIG. 8 in relation to a light conversion pattern LCP, etc. For example, an embodiment in which an upper substrate including the light conversion pattern LCP is located on a display element layer DPL by an adhesion process using an adhesive layer is illustrated in FIG. 10, and an embodiment in which a color conversion layer CCL and a color filter CF face each other with an intermediate layer CTL interposed therebetween is illustrated in FIG. 11.

In FIGS. 8 to 13, the pixel PXL is simplified and illustrated. For example, each electrode is illustrated as an electrode having a signal layer (or single film) and each insulating layer is illustrated as an insulating layer provided as a single layer (or single film), but the disclosure is not limited thereto.

Also, in FIGS. 8 to 13, a longitudinal direction (or vertical direction) on a section is represented as a third direction DR3.

Referring to FIGS. 1 to 4 and 6 to 13, the pixel PXL may include the substrate SUB, a pixel circuit layer PCL, and a display element layer DPL. The pixel circuit layer PCL and the display element layer DPL may be disposed on one surface of the substrate SUB to overlap each other. In an example, the display area DA of the substrate SUB may include the pixel circuit layer PCL disposed on the one surface of the substrate SUB and the display element layer DPL disposed on the pixel circuit layer PCL. However, mutual positions of the pixel circuit layer PCL and the display element layer DPL on the substrate SUB may be changed in some embodiments. In case that the pixel circuit layer PCL and the display element layer DPL overlap each other in layers thereof separate from each other, each layout space for forming the pixel circuit PXC and the light emitting part EMU can be sufficiently secured on a plane.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Insulating layers and conductive layers may be disposed on the substrate SUB. The insulating layers may include, for example, a buffer layer BFL, a gate insulating layer GI, an interlayer insulating layer ILD, a passivation layer PSV, and first to fourth insulating layers INS1, INS2, INS3, and INS4. The conductive layers may be provided and/or formed between the above-described insulating layers. The conductive layers may include, for example, a first conductive layer provided on the substrate SUB, a second conductive layer provided on the gate insulating layer GI, a third conductive layer provided on the interlayer insulating layer ILD, a fourth conductive layer provided on the passivation layer PSV, and a fifth conductive layer provided on the second insulating layer INS2. However, the insulating layers and the conductive layers, which are provided on the substrate SUB, are not limited to the above-described embodiment. In some embodiments, another insulating layer and another conductive layer in addition to the insulating layers and the conductive layers may be provided on the substrate SUB.

Circuit elements (e.g., transistors T and a storage capacitor Cst) constituting a pixel circuit PXC of a corresponding pixel PXL and signal lines (e.g., first and second power lines PL1 and PL2) electrically connected to the circuit elements may be disposed in each pixel area PXA of the pixel circuit layer PCL. Alignment electrodes ALE, light emitting elements LD, and/or pixel electrodes PE, which constitute a light emitting part EMU of the corresponding pixel PXL, may be disposed in each pixel area PXA of the display element layer DPL.

The first power line PL1 and the second power line PL2 may be provided and/or formed on the substrate SUB. The voltage of the first driving power source VDD may be applied to the first power line PL1, and the voltage of the second driving power source VSS may be applied to the second power line PL2.

Each of the first power line PL1 and the second power line PL2 may include a conductive material (or substance). In an example, each of the first power line PL1 and the second power line PL2 may be formed in a single layer including at least one selected from the group consisting of copper (Cu), molybdenum (Mo), tungsten (W), aluminum neodymium (AlNd), titanium (Ti), aluminum (Al), silver (Ag), and any alloy thereof, or a mixture thereof, or be formed in a double- or multi-layered structure including molybdenum (Mo), titanium (Ti), copper (Cu), aluminum (Al) or silver (Ag), which is a low-resistance material, so as to decrease wiring resistance. In an example, each of the first power line PL1 and the second power line PL2 may be configured as a double layer in which titanium (Ti)/copper (Cu) are sequentially stacked.

The first power line PL1 may be electrically connected to a component, e.g., a first alignment electrode ALE1, of the display element layer DPL, and the second power line PL2 may be electrically connected to another component, e.g., a third alignment electrode ALE3, of the display element layer DPL.

The first power line PL1 may include (1-1)th and (1-2)th sub-power lines PL1_1 and PL1_2 electrically connected to each other, and the second power line PL2 may include (2-1)th and (2-2)th sub-power lines PL2_1 and PL2_2 electrically connected to each other. The (1-1)th, (1-2)th, (2-1)th, and (2-2)th sub-power lines PL1_1, PL1_2, PL2_1, and PL2_2 may constitute the first conductive layer located between the substrate SUB and the buffer layer BFL.

Each of the (1-1)th, (1-2)th, (2-1)th, and (2-2)th sub-power lines PL1_1, PL1_2, PL2_1, and PL2_2 may be located on the substrate SUB to be spaced apart from an adjacent sub-power line. In an example, the (2-1)th sub-power line PL2_1 may be located on the substrate SUB to be spaced apart from the (2-2)th sub-power line PL2_2, the (2-2)th sub-power line PL2_2 may be located on the substrate SUB to be spaced apart from each of the (2-1)th sub-power line PL2_1 and the (1-1)th sub-power line PL1_1, the (1-1)th sub-power line PL1_1 may be located on the substrate SUB to be spaced apart from each of the (2-2)th sub-power line PL2_2 and the (1-2)th sub-power line PL1_2, and the (1-2)th sub-power line PL1_2 may be located on the substrate SUB to be spaced apart from the (1-1)th sub-power line PL1_1.

The buffer layer BFL may be provided and/or formed on the substrate SUB and the first and second power lines PL1 and PL2.

The buffer layer BFL may prevent an impurity from diffusing into a transistor T included in the pixel circuit PXC. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, but be provided in a multi-layer including at least two layers. In case that the buffer layer BFL is provided in the multi-layer, the layers may be formed of a same material or be formed of different materials. The buffer layer BFL may be omitted according to the material and process conditions of the substrate SUB. In an embodiment, the buffer layer BFL may be partially opened to include a second contact part CNT2 exposing a portion of the (2-1)th sub-power line PL2_1.

The pixel circuit PXC may include a first transistor T1 (or driving transistor) for controlling a driving current of the light emitting elements LD located on the buffer layer BFL and a second transistor T2 (or switching transistor) electrically connected to the first transistor T1. However, the disclosure is not limited thereto, and the pixel circuit PXC may further include circuit elements for performing other functions in addition to the first transistor T1 and the second transistor T2. In the following embodiment, in case that the first transistor T1 and the second transistor T2 are inclusively designated, each of the first transistor T1 and the second transistor T2 or both the first transistor T1 and the second transistor T2 are referred to as a transistor T or transistors T.

Each of the transistors T may include a semiconductor pattern SCP, a gate electrode GE, a first terminal TE1, and a second terminal TE2. The first terminal TE1 may be one of a source electrode and a drain electrode, and the second terminal TE2 may be the other of the source electrode and the drain electrode. In an example, in case that the first terminal TE1 is the drain electrode, the second terminal TE2 may be the source electrode.

The semiconductor pattern SCP may be provided and/or formed on the buffer layer BFL. The semiconductor pattern SCP may include a first contact region contacting the first terminal TE1 and a second contact region in contact with the second terminal TE2. A region between the first contact region and the second contact region may be a channel region. The channel region may overlap the gate electrode GE of a corresponding transistor T. The semiconductor pattern SCP may be a semiconductor pattern made of polysilicon, amorphous silicon, oxide semiconductor, or the like. The channel region is a semiconductor pattern undoped with an impurity and may be an intrinsic semiconductor. Each of the first contact region and the second contact region may be a semiconductor pattern doped with an impurity.

The gate electrode GE may constitute the second conductive layer provided and/or formed on the gate insulating layer GI to correspond to the channel region of the semiconductor pattern SCP. The gate electrode GE may be provided on the gate insulating layer GI to overlap the channel region of the semiconductor pattern SCP. The gate electrode GE may be formed in a single layer including at least one selected from the group consisting of copper (Cu), molybdenum (Mo), tungsten (W), aluminum neodymium (AlNd), titanium (Ti), aluminum (Al), silver (Ag), and any alloy thereof, or a mixture thereof, or be formed in a double- or multi-layered structure including molybdenum (Mo), titanium (Ti), copper (Cu), aluminum (Al), or silver (Ag), which is a low-resistance material so as to decrease wiring resistance.

The gate insulating layer GI may be an inorganic insulating layer including an inorganic material. In an example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In some embodiments, the gate insulating layer GI may be an organic insulating layer including an organic material. The gate insulating layer GI may be provided as a single layer, but be provided as a multi-layer including at least two layers. In an embodiment, the gate insulating layer GI may include a second contact part CNT2 corresponding to the second contact part CNT2 of the buffer layer BFL, and be partially opened to expose the (2-1)th sub-power line PL2_1.

The first terminal TE1 and the second terminal TE2 may constitute the third conductive layer provided and/or formed on the interlayer insulating layer ILD. The first terminal TE1 and the second terminal TE2 may respectively contact the first contact region and the second contact region of the semiconductor pattern SLP through contact holes sequentially penetrating the gate insulating layer GI and the interlayer insulating layer ILD. In an example, the first terminal TE1 may contact the first contact region of the semiconductor pattern SCP, and the second terminal TE2 may contact the second contact region of the semiconductor pattern SCP. Each of the first and second terminals TE1 and TE2 and the gate electrode GE may include a same material. In another example, each of the first and second terminals TE1 and TE2 may include at least one selected from the materials that may be used to form the gate electrode GE, e.g., as described herein.

The interlayer insulating layer ILD may be provided and/or formed on the gate electrode GE and the gate insulating layer GI. The interlayer insulating layer ILD and the gate insulating layer GI may include a same material. In another example, the interlayer insulating layer ILD may include at least one selected from the materials that may be used to form the gate insulating layer GI, e.g., as described herein. In an embodiment, the interlayer insulating layer ILD may include a second contact part CNT2 corresponding to the second contact part CNT2 of the gate insulating layer GI, and be partially opened to expose a portion of the (2-1)th sub-power line PL2_1.

Although it has been described that the first and second terminals TE1 and TE2 of each of the transistors T are separate electrodes electrically connected to the semiconductor pattern SCP through contact holes sequentially penetrating the gate insulating layer GI and the interlayer insulating layer ILD, the disclosure is not limited thereto. In some embodiments, the first terminal TE1 of each of the transistors T may be the first contact region adjacent to the channel region of the corresponding semiconductor pattern SCP, and the second terminal TE2 of each of the transistors T may be the second contact region adjacent to the channel region of the corresponding semiconductor pattern SCP. The first terminal TE1 of the first transistor T1 as the driving transistor may be electrically connected to the light emitting elements LD by a separate connection means such as a bridge electrode.

In an embodiment, the transistors T may be implemented with a low-temperature polysilicon (LTPS) thin-film transistor, but the disclosure is not limited thereto. In some embodiments, the transistors T may be implemented with an oxide semiconductor thin-film transistor. In the above-described embodiment, in case that the transistors T are implemented with a thin-film transistor having a top gate structure has been described as an example. However, the disclosure is not limited thereto, and the structure of the transistors T may be variously modified.

In some embodiments, a bottom metal layer overlapping the first transistor T1 may be provided and/or formed between the substrate SUB and the buffer layer BFL. The bottom metal layer may be the first conductive layer among the conductive layers provided on the substrate SUB, and the bottom metal layer and the first and second power lines PL1 and PL2 may be provided in a same layer and include a same material. Although not directly shown in the drawings, the bottom metal layer may be electrically connected to the first transistor T1 to widen the driving range of a predetermined voltage supplied to the gate electrode GE of the first transistor T1. In an example, the bottom metal layer may be electrically and/or physically connected to one of the first and second terminals TE1 and TE2 of the first transistor T1.

Although not directly shown in the drawings, a power pattern may be provided and/or formed on the interlayer insulating layer ILD. The power pattern may be electrically connected to each of the first power line PL1 and the first transistor T1. In an example, the power pattern may be a connection means for electrically connecting the first transistor T1 and the first power line PL1 to each other.

The passivation layer PSV may be provided and/or formed on the transistors T and the interlayer insulating layer ILD.

The passivation layer PSV (also referred to as a "protective layer" or "via layer") may be an inorganic layer (or inorganic insulating layer) including an inorganic material or an organic layer (or organic insulating layer) including an organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, polyphenylene sulfides resin, and benzocyclobutene resin.

The passivation layer PSV and the interlayer insulating layer ILD may include a same material, but the disclosure is not limited thereto. The passivation layer PSV may be provided as a single layer, but be provided as a multilayer including at least two layers. The passivation layer PSV may be partially opened to include a first contact part CNT1 exposing the first terminal TE1 of the first transistor T1 and a second contact part CNT2 exposing a portion of the (2-1)th sub-power line PL2_1. The second contact part CNT2 of the passivation layer PSV may correspond to the second contact part CNT2 of the interlayer insulating layer ILD.

The display element layer DPL may be provided and/or formed on the passivation layer PSV.

The display element layer DPL may include bank patterns BNP, alignment electrodes ALE, a bank BNK, light emitting elements LD, pixel electrodes PE, and intermediate electrodes CTE. The display element layer DPL may include at least one insulating layer located between the above-described components. In an example, the display element layer DPL may include the first insulating layer INS1, the second insulating layer INS2, the third insulating layer INS3, and the fourth insulating layer INS4. In some embodiments, the third insulating layer INS3 may be selectively provided.

The bank patterns BNP may be provided and/or formed on the passivation layer PSV The bank patterns BNP may be disposed on one surface of the passivation layer PSV. In an example, the bank patterns BNP may protrude in the third direction DR3 on the one surface of the passivation layer PSV. Accordingly, portions of the alignment electrodes ALE disposed on the bank patterns BNP may protrude in the third direction DR3 (or a thickness direction of the substrate SUB).

The bank patterns BNP may be an inorganic insulating layer including an inorganic material or an organic insulating layer including an organic material. In some embodiments, the bank patterns BNP may include an organic insulating layer provided as a single layer and/or an inorganic insulating layer provided as a single layer, but the disclosure is not limited thereto. In some embodiments, the bank patterns BNP may be provided in the form of a multi-layer in which at least one organic insulating layer and at least one inorganic insulating layer are stacked. However, the material of the bank patterns BNP is not limited to the above-described embodiment. In some embodiments, the bank patterns BNP may include a conductive material (or substance).

The bank patterns BNP may have a section of a trapezoidal shape of which a width becomes narrower toward the top thereof in the third direction DR3 from one surface (e.g., an upper surface) of the passivation layer PSV, but the disclosure is not limited thereto. In some embodiments, the bank patterns BNP may include a curved surface having a section of a semi-elliptical shape, a semicircular shape (or hemispherical shape), or the like, a width of which becomes narrower toward the top thereof in the third direction DR3 from the one surface of the passivation layer PSV. In a cross-sectional view, the shape of the bank patterns BNP is not limited to the above-described embodiments and may be variously changed within a range in which the efficiency of light emitted from each of the light emitting elements LD can be improved. In some embodiments, at least one of the bank patterns BNP may be omitted, or the position of the at least one of the bank patterns BNP may be changed.

In an embodiment, the bank patterns BNP may be used as a reflection member. In an example, the bank patterns BNP along with the alignment electrodes ALE provided on the top thereof may be used as a reflection member which guides light emitted from each light emitting element LD in a desired direction, thereby improving the light emission efficiency of the pixel PXL.

The alignment electrodes ALE may be provided and/or formed on the bank patterns BNP and the passivation layer PSV. The alignment electrodes ALE may constitute the fourth conductive layer.

The first alignment electrode ALE1 may be provided and/or formed on the passivation layer PSV and a first bank pattern BNP1. A second alignment electrode ALE2 may be provided and/or formed on the passivation layer PSV and a second bank BNP2. The third alignment electrode ALE3 may be provided and/or formed on the passivation layer PSV and the second bank BNP2. A fourth alignment electrode ALE4 may be provided and/or formed on the passivation layer PSV and a third bank pattern BNP3.

The first alignment electrode ALE1 may have a shape corresponding to a gradient of the first bank pattern BNP1 located on the bottom thereof, the second alignment electrode ALE2 may have a shape corresponding to a gradient of the second bank pattern BNP2 located on the bottom thereof, a third alignment electrode ALE3 may have a shape corresponding to a gradient of the second bank pattern BNP2 located on the bottom thereof, and the fourth alignment electrode ALE4 may have a shape corresponding to a gradient of the third bank pattern BNP3 located on the bottom thereof.

The alignment electrodes ALE may be disposed on a same plane and have a same thickness in the third direction DR3. The alignment electrodes ALE may be simultaneously formed by a same process.

The alignment electrodes ALE may be made of a material having a level of (or uniform) reflexibility so as to allow light emitted from the light emitting elements LD to advance in the image display direction of the display device DD. In an example, the alignment electrodes ALE may be made of a conductive material. The conductive material (or substance) may include an opaque metal advantageous in reflecting light emitted from the light emitting elements LD in the image display direction of the display device DD. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the material of the alignment electrodes ALE is not limited to the above-described embodiment.

Each of the alignment electrodes ALE may be provided and/or formed as a single layer, but the disclosure is not limited thereto. In some embodiments, each of the alignment electrodes ALE may be provided and/or formed as a multi-layer in which at least two materials among metals, alloys, conductive oxide, and conductive polymers are stacked. Each of the alignment electrodes ALE may be formed as a multi-layer having at least two layers so as to minimize distortion caused by a signal delay in case that a signal (or voltage) is transferred to both end portions EP1 and EP1 of each of the light emitting elements LD. In an example, each of the alignment electrodes ALE may include at least one reflective electrode layer. Each of the alignment electrodes ALE may selectively further include at least one of at least one transparent electrode layer disposed on the top and/or bottom of the reflective electrode layer and at least one conductive capping layer covering the top of the transparent electrode layer.

As described above, in case that the alignment electrodes ALE is made of a conductive material having a constant reflexibility, the alignment electrodes ALE enable light emitted from both the end portions, for example, first and second end portions EP1 and EP2, of each of the light emitting elements LD to further advance in the image display direction of the display device DD (or the third direction DR3). In case that the alignment electrodes ALE are disposed to face the first and second end portions EP1 and EP2 of the light emitting elements LD while having an inclined or curved surface corresponding to the shape of the bank pattern BNP, the light emitted from the first and second end portions EP1 and EP2 of each of the light emitting elements LD is reflected by the alignment electrodes ALE to further advance in the image display direction of the display device DD. Accordingly, the efficiency of light emitted from the light emitting elements LD can be improved.

The first insulating layer INS1 may be provided and/or formed over the alignment electrodes ALE.

The first insulating layer INS1 may be partially opened to expose components located on the bottom thereof in at least the non-emission area NEMA. In an example, the first insulating layer INS1 may be partially opened to include a first contact hole CH1 exposing a portion of the alignment electrode ALE1 as a portion of the first insulating layer INS1 is removed in at least the non-emission area NEMA (or a second opening OP2 of the bank BNK) and a second contact hole CH2 exposing a portion of the third alignment electrode ALE3 as another portion of the first insulating layer INS1 is removed in the non-emission area NEMA (or the second opening OP2 of the bank BNK).

The first insulating layer INS1 may include an inorganic insulating layer made of an inorganic material or an organic insulating layer made of an organic material. The first insulating layer INS1 may be configured as an inorganic insulating layer advantageous in protecting the light emitting elements LD from the pixel circuit layer PCL. In an example, the first insulating layer INS1 may include at least one of silicon oxide ($SiO_x$), silicon nitride ($SiN_x$), silicon oxynitride ($SiO_xN_y$), and metal oxide such as aluminum oxide ($AlO_x$), but the disclosure is not limited thereto. In some embodiments, the first insulating layer INS1 may be configured as an organic insulating layer advantageous in planarizing a supporting surface of the light emitting elements LD.

The first insulating layer INS1 may be provided as a single layer or a multi-layer. In case that the first insulating layer INS1 is provided as the multi-layer, the first insulating layer INS1 may be provided in a Distributed Bragg Reflector (DBR) in which a first layer and a second layer, which are configured as inorganic insulating layers having different refractive indices, are alternately stacked. In an example, the first insulating layer INS1 may be provided in a structure in which the first layer having a low refractive index and the second layer having a refractive index higher than that of the first layer are alternately stacked. As described above, in case that the first insulating layer INS1 is provided as the multi-layer, the first insulating layer INS1 may be used as a reflection member which reflects light emitted from the light emitting elements LD in a desired direction by using constructive interference caused by a refractive index difference between the first layer and the second layer. Each of the first and second layers may include at least one of silicon oxide ($SiO_x$), silicon nitride ($SiN_x$), silicon oxynitride ($SiO_xN_y$), silicon oxycabonitride ($SiO_xC_y$), silicon carbonitride ($SiC_xN_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

The bank BNK may be provided and/or formed on the first insulating layer INS1.

The bank BNK may be formed between other pixels PXL to surround the emission area EMA of a pixel PXL. Therefore, the bank BNK may form a pixel defining layer partitioning the emission area EMA of the corresponding pixel PXL. The bank BNK may serve as a dam structure which prevents a solution in which light emitting elements LD are mixed from being introduced to an emission area EMA of an adjacent pixel PXL or controls a constant amount of solution to be supplied to each emission area EMA, in a process of forming the light emitting elements LD to the emission area EMA.

Light emitting elements LD may be supplied and aligned in an emission area EMA of a pixel PXL, in which the first insulating layer INS1 is formed. In an example, the light emitting elements LD are supplied (or input) to the emission area EMA by an inkjet printing process or the like, and may be aligned between the alignment electrodes ALE by a predetermined alignment voltage (or alignment signal) applied to each of the alignment electrodes ALE. A same alignment signal may be applied to the first alignment electrode ALE1 and the fourth alignment electrode ALE4. In an example, a ground voltage may be applied to the first alignment electrode ALE1 and the fourth alignment electrode ALE4. A same alignment signal may be applied to the second alignment electrode ALE2 and the third alignment electrode ALE3. In an example, an AC signal may be applied to the second alignment electrode ALE2 and the third alignment electrode ALE3.

The second insulating layer INS2 may be provided and/or formed on the light emitting elements LD in the emission area EMA. The second insulating layer INS2 is provided and/or formed on the light emitting elements LD to partially cover an outer circumferential surface (or surface) of each of the light emitting elements LD and to expose the first end portion EP1 and the second end portion EP2 of each of the light emitting elements LD to the outside.

The second insulating layer INS2 may be configured as a single layer or a multi-layer, and include an inorganic insulating layer including at least one inorganic material or an organic insulating layer including at least one organic material. The second insulating layer INS2 may include an inorganic insulating layer advantageous in protecting the active layer 12 (see FIG. 1) of each of the light emitting elements LD from external oxygen, moisture, and the like. However, the disclosure is not limited thereto. The second insulating layer INS2 may be configured as an organic insulating layer including an organic material according to design conditions of the display device to which the light emitting elements LD are applied. After alignment of light emitting elements LD in the pixel area PXA (or emission area EMA) of the pixel PXL is completed, the second insulating layer INS2 is formed on the light emitting elements LD, so that the light emitting elements LD can be prevented from being separated from positions at which the light emitting elements LD are aligned.

In case that an empty gap (or space) exists between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured as an organic insulating layer advantageous in filling the empty gap between the first insulating layer INS1 and the light emitting elements LD, but the disclosure is not limited thereto.

The third insulating layer INS3 may be disposed to cover (or overlap) any of the pixel electrodes PE and at least one of the intermediate electrodes CTE, which are disposed on the first and second end portions EP1 and EP2 of the light emitting elements LD. In an example, as shown in FIGS. 8, 10, and 11, the third insulating layer INS3 may be disposed on first and second pixel electrodes PE1 and PE2 to cover each of the first and second pixel electrodes PE1 and PE2. The third insulating layer INS3 may include an inorganic insulating layer made of an inorganic material or an organic insulating layer made of an organic material. In an example, the third insulating layer INS2 may include at least one of silicon oxide ($SiO_x$), silicon nitride ($SiN_x$), silicon oxynitride ($SiO_xN_y$), and metal oxide such as aluminum oxide ($AlO_x$), but the disclosure is not limited thereto. The third insulating layer INS3 may be formed as a single layer or a multi-layer.

In case that the second insulating layer INS2 and/or the third insulating layer INS3 are/is formed on the top of the light emitting elements LD, the electrical stability between the first and second end portions EP1 and EP2 of the light emitting elements LD can be ensured. For example, a pixel electrode PE and an intermediate electrode CTE, which are adjacent to each other, can be stably separated from each other by the second insulating layer INS2 and/or the third insulating layer INS3. Accordingly, a short-circuit defect can be prevented from occurring between the first and second end portions EP1 and EP2 of the light emitting elements LD.

As shown in FIG. 9, the third insulating layer INS3 may not be provided in an embodiment in which the pixel electrodes PE and the intermediate electrodes CTE are disposed in a same layer.

The pixel electrodes PE may be disposed on the light emitting elements LD, the second insulating layer INS2 on the light emitting elements LD, and the first insulating layer INS1 on the alignment electrodes ALE in at least the emission area EMA. In an embodiment, the pixel electrodes PE may constitute the fifth conductive layer provided and/or formed on the second insulating layer INS2.

The first pixel electrode PE1 may be disposed on a first end portion EP1 of a first light emitting element LD1, the second insulating layer INS2 on the first light emitting element LD1, and the first insulating layer INS1 on the first alignment electrode ALE1 in at least the emission area EMA. The first pixel electrode PE1 may be disposed on the first alignment electrode ALE1 exposed by the first contact hole CH1 in at least the non-emission area NEMA (or the second opening OP2 of the bank BNK). The first pixel electrode PE1 may be electrically connected to the first alignment electrode ALE1 while directly contacting the first alignment electrode ALE1 by the first contact hole CH1.

The second pixel electrode PE2 may be disposed on a second end portion EP2 of a fourth light emitting element LD4, the second insulating layer INS2 on the fourth light emitting element LD4, and the first insulating layer INS1 on the third alignment electrode ALE3 in at least the emission area EMA. The second pixel electrode PE2 may be disposed on the third alignment electrode ALE3 exposed by the second contact hole CH2 in at least the non-emission area NEMA (or the second opening OP2 of the bank BNK). The second pixel electrode PE2 may be electrically connected to the third alignment electrode ALE3 while directly contacting the third alignment electrode ALE3 by the second contact hole CH2.

The first pixel electrode PE1 and the second pixel electrode PE2 may be formed by a same process to be provided in a same layer. However, the disclosure is not limited thereto. In some embodiments, the first pixel electrode PE1 and the second pixel electrode PE2 may be formed by different processes to be provided in different layers.

The pixel electrodes PE may be made of various transparent conductive materials. In an example, the pixel electrodes PE may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and be substantially transparent or translucent to satisfy a predetermined transmittance (or transmittancy). However, the material of the pixel electrodes PE is not limited to the above-described embodiment. In some embodiments, the pixel electrodes PE may be made of various opaque conductive materials (or substances). The pixel electrodes PE may be formed as a single layer or a multi-layer.

At least one of the intermediate electrodes CTE and the pixel electrodes PE may be formed by a same process to be formed in a same layer, and the other of the intermediate electrodes CTE and the pixel electrodes PE may be formed by different processes to be formed in different layers. In an example, first and third intermediate electrodes CTE1 and CTE3 may be formed on the third insulating layer INS3 to be spaced apart from the pixel electrodes PE covered by the third insulating layer INS3. A second intermediate electrode CTE2 and the pixel electrodes PE may be formed by a same process to be provided in a same layer. However, the disclosure is not limited to the above-described embodiments. In some embodiments, as shown in FIG. 9, all the first, second, and third intermediate electrodes CTE1, CTE2, and CTE3 and the pixel electrodes PE may be formed by a same process to be provided in a same layer.

The intermediate electrodes CTE may be made of various transparent conductive materials. The intermediate electrodes CTE and the pixel electrodes PE may include a same material. In another example, the intermediate electrodes CTE may include at least one material selected from the materials that may be used to form the pixel electrodes PE, e.g., as described herein.

The fourth insulating layer INS4 may be provided and/or formed over the intermediate electrodes CTE. The fourth insulating layer INS4 may be an inorganic insulating layer including an inorganic material or an organic insulating layer including an organic material. In an example, the fourth insulating layer INS4 may have a structure in which at least one inorganic insulating layer and at least one organic insulating layer are alternately stacked. The fourth insulating layer INS4 entirely covers (or overlaps) the display element layer DPL to block moisture, humidity or the like from being introduced into the display element layer DPL including the light emitting elements LD from the outside. In some embodiments, at least one overcoat layer (e.g., a layer planarizing a top surface of the display element layer DPL) may be further disposed on the top of the fourth insulating layer INS4.

In some embodiments, an upper substrate may be further disposed on the fourth insulating layer INS4 as shown in FIG. 10. The upper substrate may be provided on the display element layer DPL to cover the display area DA of the substrate SUB on which the pixel PXL is disposed. An intermediate layer CTL may be disposed on the display element layer DPL.

The intermediate layer CTL may be a transparent adhesive layer (or cohesive layer), e.g., an optically clear adhesive for reinforcing adhesion between the display element layer DPL and the upper substrate, but the disclosure is not limited thereto. In some embodiments, the intermediate layer CTL may be a refractive index conversion layer for converting the refractive index of light which is emitted from the light emitting elements LD and advances toward the upper substrate, thereby improving the light emission luminance of each pixel PXL.

The upper substrate may be configured as an encapsulation substrate (or a thin-film encapsulation layer) and/or a window member of the display device DD. The upper substrate may include a base layer BSL, a light conversion pattern LCP, and a light blocking pattern LBP.

The base layer BSL may be a rigid substrate or a flexible substrate, and the material or physical property of the base layer BSL is not particularly limited. The base layer BSL and the substrate SUB may be made of (or include) a same material or different materials.

The light conversion pattern LCP may be disposed on a surface of the base layer BSL to face the pixels PXL of the substrate SUB. The light conversion pattern LCP may include a color conversion layer CCL and a color filter CF.

The color conversion layer CCL may include color conversion particles QD corresponding to a specific color. The color filter CF may allow light of the specific color to be selectively transmitted therethrough. In some embodiments, the color conversion layer CCL may include a scattering material.

The color conversion layer CCL may be disposed on the one surface of the base layer BSL to face a pixel PXL and include color conversion particles QD for converting light of a first color, which is emitted from light emitting elements LD disposed in the corresponding pixel PXL, into light of a second color. In an example, in case that the pixel PXL is a red pixel (or red sub-pixel), the color conversion layer CCL of the corresponding pixel PXL may include color conversion particles QD of a red quantum dot which convert light of a first color, which is emitted from the light emitting elements LD, into light of a second color, e.g., light of red. In another example, in case that the pixel PXL is a green pixel (or green sub-pixel), the color conversion layer CCL of the corresponding pixel PXL may include color conversion particles QD of a green quantum dot which convert light of a first color, which is emitted from the light emitting elements LD, into light of a second color, e.g., light of green. In still another example, in case that the pixel PXL is a blue pixel (or blue sub-pixel), the color conversion layer CCL of the corresponding pixel PXL may include color conversion particles QD of a blue quantum dot which convert light of a first color, which is emitted from the light emitting elements LD, into light of a second color, e.g., light of blue. In some embodiments, in case that the pixel PXL is the blue pixel (or blue sub-pixel), a light scattering layer including light scattering particles may be provided instead of the color conversion layer CCL including the color conversion particles QD. In an example, in case that the light emitting elements LD emit blue series light, the pixel PXL may include a light scattering layer including light scattering particles. The above-described light scattering layer may be omitted in some embodiments. In some embodiments, in case that the pixel PXL is the blue pixel (or blue sub-pixel), a transparent polymer may be provided instead of the color conversion layer CCL.

The color filter CF may allow light of a specific color to be selectively transmitted therethrough. The color filter CF along with the color conversion layer CCL form the light conversion pattern LCP and may include a color filter material for allowing light of a specific color, which is converted by color conversion layer CCL, to be selectively transmitted therethrough. The color filter CF may include a red color filter, a green color filter, and a blue color filter. The above-described color filter CF may be provided on one surface of the base layer BSL to correspond to the color conversion layer CCL.

The light conversion pattern LCP including the color conversion layer CCL and the color filter CF may correspond to the emission area EMA of the pixel PXL.

A first capping layer CPL1 may be provided and/or formed between the color filter CF and the color conversion layer CCL.

The first capping layer CPL1 covers (or overlaps) the color filter CF while being located over the color filter CF, to protect the color filter CF. The first capping layer CPL1 may be an inorganic insulating layer including an inorganic material or an organic insulating layer including an organic material.

The light blocking pattern LBP may be disposed adjacent to the light conversion pattern LCP. In an embodiment, the light blocking pattern LBP may be disposed on one surface of the base layer BSL to correspond to the non-emission area NEMA of the pixel PXL. The light blocking pattern LBP may correspond to the bank BNK of the display element layer DPL.

The light blocking pattern LBP may include a first light blocking pattern LBP1 and a second light blocking pattern LBP2.

The first light blocking pattern LBP1 may be located on the one surface of the base layer BSL and be located adjacent to the color filter CF.

In some embodiments, the first light blocking pattern LBP1 may be provided in the form of a multi-layer in which at least two color filters which allow beams of light of different colors to be selectively transmitted therethrough, among a red color filter, a green color filter, and a blue color filter overlap each other. In an example, the first light blocking pattern LBP1 may include a red color filter, a green color filter located on the red color filter to overlap the red color filter, and a blue color filter located on the green color filter to overlap the green color filter. For example, the first light blocking pattern LBP1 may be provided in the form of a structure in which a red color filter, a green color filter, and a blue color filter are sequentially stacked. The red color filter, the green color filter, and the blue color filter may be used as the first light blocking pattern LBP1 which blocks transmission of light in the non-emission area of the pixel area PXA.

In some embodiments, the first capping layer CPL1 may be provided and/or formed on the first light blocking pattern LBP1. The first capping layer CPL1 may be entirely located on the first light blocking pattern LBP1 and the color filter CF.

The second light blocking pattern LBP2 may be provided and/or formed on one surface of the first capping layer CPL1 to correspond to the first light blocking pattern LBP1. The second light blocking pattern LBP2 may be a black matrix.

The first light blocking pattern BLP1 and the second light blocking pattern BLP2 may include a same material. In an embodiment, the second light blocking pattern LBP2 may be a structure which finally defines the emission area EMA of the pixel PXL. In an example, the second light blocking pattern LBP2 may be a dam structure which finally defines the emission area EMA to which the color conversion layer CCL is to be supplied in a process of supplying the color conversion layer CCL including the color conversion particles QD.

A second capping layer CPL2 may be entirely provided and/or formed on the color conversion layer CCL and the second light blocking pattern LBP2.

The second capping layer CPL2 may include at least one of silicon nitride ($SiN_x$), silicon oxide ($SiO_x$), silicon oxynitride ($SiO_xN_y$), and metal oxide such as aluminum oxide ($AlO_x$), but the disclosure is not limited thereto. In some embodiments, the second capping layer CPL2 may be configured as an organic layer (or organic insulating layer) including an organic material. The second capping layer CPL2 may be located on the color conversion layer CCL to protect the color conversion layer CCL from external moisture, humidity, and the like, thereby further improving the reliability of the color conversion layer CCL.

The above-described upper substrate may be coupled (or connected) to the display element layer DPL while being located on the intermediate layer CTL. To this end, the intermediate layer CTL may include a transparent adhesive layer (or cohesive layer) for reinforcing adhesion between the display element layer DPL and the upper substrate.

In the display device DD in accordance with the above-described embodiment, the light conversion pattern LCP is disposed on the light emitting element LD, so that light having desirable color reproducibility is emitted through the light conversion pattern LCP, thereby improving light emission efficiency.

In the above-described embodiment, it has been described that the upper substrate including the base layer BSL and the light conversion pattern LCP is located on the top of the display element layer DPL. However, the disclosure is not limited thereto.

In some embodiments, the light conversion pattern LCP may be formed on the one surface of the substrate SUB, on which the display element layer DPL is provided.

In an embodiment, as shown in FIG. 11, a component, e.g., the color conversion layer CCL, of the light conversion pattern LCP may be formed on the one surface of the substrate SUB, on which the pixel PXL is provided, and another component (or the other component), e.g., the color filter CF, of the light conversion pattern LCP may be formed on the one surface of the base layer BSL, so that the color filter CF and the color conversion layer CCL face each other with the intermediate layer CTL interposed therebetween.

A dummy bank DBNK may be provided and/or formed on the bank BNK. The dummy bank DBNK may be located on the fourth insulating layer INS4 on the bank BNK. Therefore, the dummy bank DBNK along with the bank BNK may form a dam part DAM (or dam structure). The dam part DAM may be a structure which finally defines the emission area EMA in which light is emitted in the pixel PXL. In an embodiment, the dam part DAM may be a structure which finally defines the emission area EMA in which the color conversion layer CCL is to be supplied in a process of supplying the color conversion particles QD to the pixel area PXA. In an example, the emission area EMA of the pixel PXL is finally defined by the dam part DAM, so that the color conversion layer CCL including a desired amount and/or a desired kind of color conversion particles QD can be supplied (or input) to the emission area EMA.

The dummy bank DBNK may be provided and/or formed on the bank BNK on the fourth insulating layer INS4. The dummy bank DBNK may include a light blocking material. In an example, the dummy bank DBNK may be a black matrix. In some embodiments, the dummy bank DBNK may be configured to include at least one light blocking material and/or at least one reflective material to allow light emitted from the light emitting elements LD to further advance in the image display direction of the display device DD (or the third direction DR3), thereby improving the light emission efficient of the light emitting elements LD.

In the embodiment shown in FIG. 11, the color conversion layer CCL may be provided and/or formed on the fourth insulating layer INS4 to fill a portion surrounded by the dam part DAM.

An intermediate layer CTL may be located on the color conversion layer CCL. The intermediate layer CTL may be at least one insulating layer, but the disclosure is not limited thereto. In some embodiments, the intermediate layer CTL may be the intermediate layer CTL described with reference to FIG. 10. A base layer BSL including a color filter CF and the light blocking pattern LBP may be provided and/or formed on the intermediate layer CTL.

The color filter CF and the light blocking pattern LBP may be disposed on one surface of the base layer BSL to face the color conversion layer CCL and the bank BNK with the intermediate layer CTL interposed therebetween. In an example, the color filter CF may face the color conversion layer CCL with the intermediate layer CTL interposed therebetween, and the light blocking pattern LBP may face the bank BNK with the intermediate layer CTL interposed therebetween.

The light blocking pattern LBP may correspond to the non-emission area NEMA of the pixel PXL, and the color filter CF may correspond to the emission area EMA of the pixel PXL.

The light blocking pattern LBP may include a light blocking material for preventing a light leakage defect in which light (or beam) leaks between the pixel PXL and pixels PXL adjacent thereto. The light blocking pattern LBP may be a black matrix. The light blocking pattern LBP may prevent mixture of beams of light emitted from the respective adjacent pixels PXL. The light blocking pattern LBP may be a component corresponding to the first light blocking pattern LBP1 described with reference to FIG. 10.

Although a case where the color conversion layer CCL and the color filter CF face each other with the intermediate layer CTL interposed therebetween has been described, the disclosure is not limited thereto. In some embodiments, the light conversion pattern LCP including the color conversion layer CCL and the color filter CF may be formed on the one surface of the substrate SUB, on which the display element layer DPL is provided.

In the above-described embodiment, at least two sub-power lines disposed in the pixel area PXA may be electrically and/or physically connected to a fan-out line. In an example, the (1-1)th sub-power line PL1_1 and the (1-2)th sub-power line PL1_2 may be electrically and/or physically connected to a first fan-out line LP1, and the (2-1)th sub-power line PL2_1 and the (2-2)th sub-power line PL2_2 may be electrically and/or physically connected to a second fan-out line LP2.

Each of the (1-1)th, (1-2)th, (2-1)th, and (2-2)th sub-power lines PL1_1, PL1_2, PL2_1, and PL2_2 may be designed to have an intentionally narrow line width. In an example, each of the (1-1)th, (1-2)th, (2-1)th, and (2-2)th sub-power lines PL1_1, PL1_2, PL2_1, and PL2_2 may be designed to have a line width to a degree to which particles having various sizes, which are present in a manufacturing process, are not attached to the top thereof.

In the existing display device, in case that a first power line to which the voltage of the first driving power source VDD is applied and a second power line to which the voltage of the second driving power source VSS is applied are disposed in a pixel area, each of the first power line and the second power line may be designed to have a relatively wide line width so as to prevent a signal delay of the applied voltage. Particles having various sizes, which are generated during a process of forming the first power line and the second power line, may be attached to the first and second power lines having a wide line width. In a cleaning process performed after the first and second power lines are formed, the particles attached to the first and second power lines are not easily removed, and a portion of the particles may remain on the first and second power lines even in case that the particles are removed.

The particles remaining on the first and second power lines are not completely covered by insulating layers including an inorganic material but may be separated in a process of forming the insulating layers on the first and second power lines. In this case, an unintended through hole (or hole) may be formed in the insulating layers, and a defect may occur in the first and second power lines located below the insulating layers while a subsequent process is performed.

In order to prevent the above-described defect, in an embodiment of the disclosure, the first power line PL1 to which the voltage of the first driving power source VDD is applied may be divided into the (1-1)th and (1-2)th sub-power lines PL1_1 and PL1_2 in the pixel area PXA, the second power line PL2 to which the voltage of the second driving power source VSS is applied may be divided into the (2-1)th and (2-2)th sub-power lines PL2_1 and PL2_2 in the pixel area PXA, and each of the sub-power lines may be designed to have a line width narrow to a degree to which particles generated during a manufacturing process are not attached thereto.

Accordingly, in the above-described embodiment, a defect, e.g., a crack or the like in insulating layers (e.g., the buffer layer BFL, the gate insulating layer GI, and the interlayer insulating layer ILD) formed on the first and second power lines PL1 and PL2 can be prevented.

In the above-described embodiment, the first and second power lines PL1 and PL2 are stably protected, so that the reliability of the first and second power lines PL1 and PL2 can be improved and the display quality of the display device DD.

Hereinafter, the first and second fan-out lines LP1 and LP2 located in the non-display area NDA and the first and second power lines PL1 and PL2 located in the pixel area PXA will be described in more detail with reference to FIGS. 14 to 19.

Figure 14:
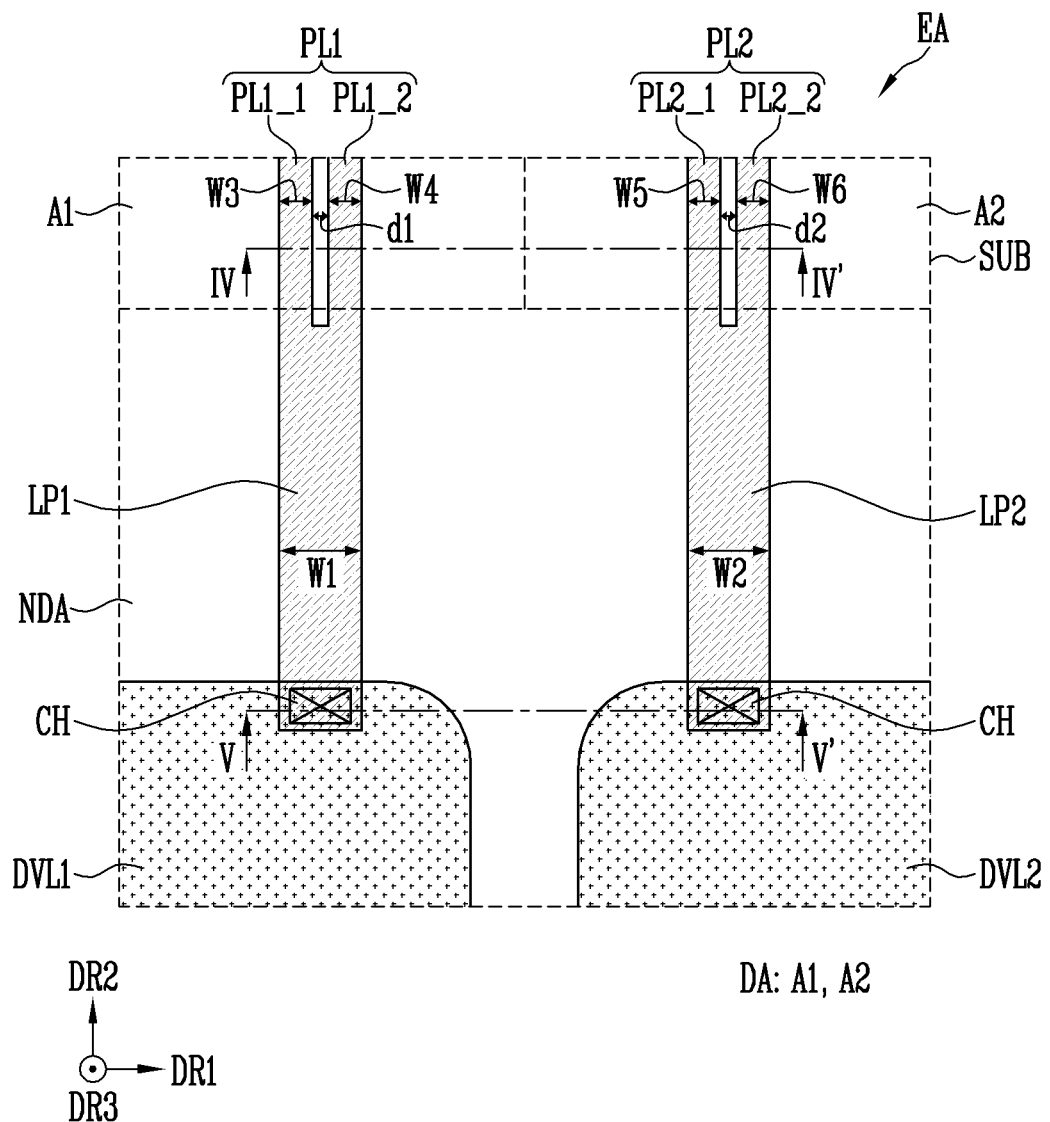
FIG. 14 is a schematic enlarged view of portion EA shown in FIG. 4.
Figure 15:
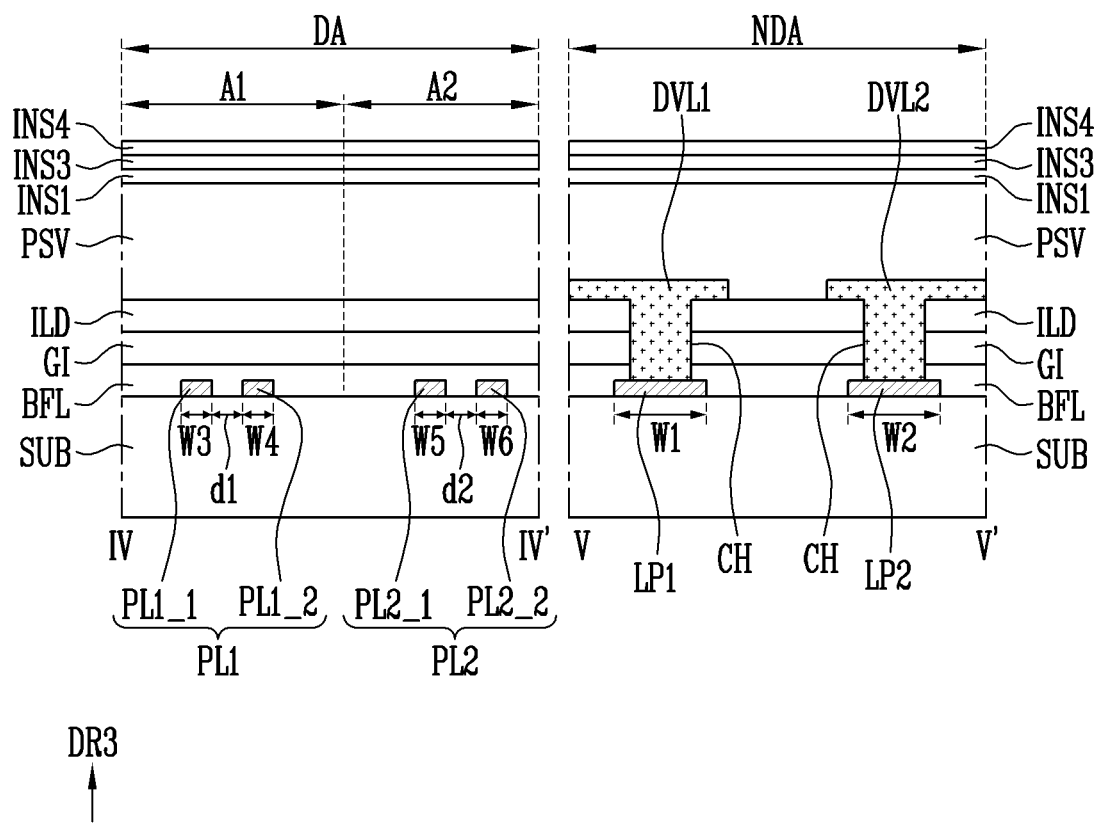
FIG. 15 is a cross-sectional view taken along lines IV-IV' and V-V' shown in FIG. 14.

FIG. 14 is a schematic enlarged view of portion EA shown in FIG. 4. FIG. 15 is a sectional view taken along lines IV-IV' and V-V' shown in FIG. 14.

As illustrated in FIGS. 14 and 15, differences from the above-described embodiment will be mainly described to avoid redundancy.

Referring to FIGS. 4, 14, and 15, a first power line PL1 and a second power line PL2 may be disposed in the display area DA of the substrate SUB. The first power line PL1 may be provided in the first pixel PXL1 located in the first area A1, and the second power line PL2 may be provided in the second pixel PXL2 located in the second area A2.

The first power line PL1 may be electrically and/or physically connected to a first fan-out line LP1 located in the non-display area NDA of the substrate SUB. The first power line PL1 may include a (1-1)th sub-power line PL1_1 and a (1-2)th sub-power line PL1_2, which branch off to the first area A1 from the first fan-out line LP1. The (1-1)th and (1-2)th sub-power lines PL1_1 and PL1_2 may be integral with the first fan-out line LP1.

The (1-1)th sub-power line PL1_1 and the (1-2)th sub-power line PL1_2 may be disposed on the substrate SUB of the first area A1 (or the pixel area PXA) to be spaced apart from each other at a first distance d1. The (1-1)th sub-power line PL1_1 and the (1-2)th sub-power line PL1_2 may be integral with the first fan-out line LP1 to be electrically and/or physically connected to the first fan-out line LP1. A line width W3 of the (1-1)th sub-power line PL1_1 in the first direction DR1 and a line width W4 of the (1-2)th sub-power line PL1_2 in the first direction DR1 may be equal to or different from each other.

The first fan-out line LP1 may be located in the non-display area NDA and partially overlap a first driving voltage line DVL1. The first fan-out line LP1 may be electrically and/or physically connected to the first driving voltage line DVL1. In an embodiment, the first fan-out line LP1 may form the first conductive layer located between the substrate SUB and the buffer layer BFL.

The first driving voltage line DVL1 may be located adjacent to the pad part PDP in the non-display area NDA and be supplied with the voltage of the first driving power source VDD from the first power pad PD1 of the pad part PDP. The first driving voltage line DVL1 may partially overlap the first fan-out line LP1 in the non-display area NDA and be electrically connected to the first fan-out line LP1 through a contact hole CH.

The first driving voltage line DVL1 may form the third conductive layer provided and/or formed on the interlayer insulating layer ILD. The first driving voltage line DVL1 may be electrically and/or physically connected to the first fan-out line LP1 through a corresponding contact hole CH sequentially penetrating the buffer layer BFL, the gate insulating layer GI, and the interlayer insulating layer ILD. The first driving voltage line DVL1 may supply the voltage of the first driving power source VDD, which is transferred from the first power pad PD1, to the (1-1)th and (1-2)th sub-power lines PL1_1 and PL1_2 through the first fan-out line LP1.

A first fan-out line LP1 may have a line width W1 constant in the first direction DR1. Each of the line width W3 of the (1-1)th sub-power line PL1_1 and the line width W4 of the (1-2)th sub-power line PL1_2 may be equal to the line width W1 of the first fan-out line LP1, or be greater or smaller than the line width W1 of the first fan-out line LP1. In an example, each of the line width W3 of the (1-1)th sub-power line PL1_1 in the first direction DR1 and the line width W4 of the (1-2)th sub-power line PL1_2 in the first direction DR1 may be smaller than the line width W1 of the first fan-out line LP1 in the first direction DR1, but the disclosure is not limited thereto.

For convenience, it has been illustrated that the line width W1 of the first fan-out line LP1 in the first direction DR1 is equal to a sum of the line width W3 of the (1-1)th sub-power line PL1_1 in the first direction DR1, the line width W4 of the (1-2)th sub-power line PL1_2 in the first direction DR1, and the distance d1 between the (1-1)th and (1-2)th sub-power lines PL1_1 and PL1_2. However, the disclosure is not limited thereto.

Each of the (1-1)th and (1-2)th sub-power lines PL1_1 and PL1_2 may be designed to have a line width narrow to a degree to which particles having various sizes, which are present in a manufacturing process, are not attached to the top thereof.

The number of first power lines PL1 branching off to the display area DA from the first fan-out line LP1 located in the non-display area NDA may be at least two. In an example, two of the (1-1)th and (1-2)th sub-power lines PL1_1 and PL1_1 may branch off to the display area DA from a first fan-out line LP1 located in the non-display area NDA. In an embodiment, a ratio of the number of the first fan-out line LP1 and the number of the first power lines PL1, which are integrally formed (or integral with each other) to be electrically and/or physically connected to each other, so that a same signal (e.g., the voltage of the first driving power source VDD) is applied thereto, may be 1:2.

The second power line PL2 may be electrically and/or physically connected to a second fan-out line LP2 located in the non-display area NDA of the substrate SUB. The second power line PL2 may include a (2-1)th sub-power line PL2_1 and a (2-2)th sub-power line PL2_2, which branch off to the second area A2 from the second fan-out line LP2. The (2-1)th and (2-2)th sub-power lines PL2_1 and PL2_2 may be integral with the second fan-out line LP2.

The (2-1)th sub-power line PL2_1 and the (2-2)th sub-power line PL2_2 may be disposed on the substrate SUB of the second area A2 (or the pixel area PXA) to be spaced apart from each other at a second distance d2. The (2-1)th sub-power line PL2_1 and the (2-2)th sub-power line PL2_2 may be integral with the second fan-out line LP2 to be electrically and/or physically connected to the second fan-out line LP2. A line width W5 of the (2-1)th sub-power line PL2_1 in the first direction DR1 and a line width W6 of the (2-2)th sub-power line PL2_2 in the first direction DR1 may be equal to or different from each other.

The second fan-out line LP2 may be located in the non-display area NDA and partially overlap a second driving voltage line DVL2. The second fan-out line LP2 may be electrically and/or physically connected to the second driving voltage line DVL2. In an embodiment, the second fan-out line LP2 may form the first conductive layer located between the substrate SUB and the buffer layer BFL.

The second driving voltage line DVL2 may be located adjacent to the pad part PDP in the non-display area NDA and be supplied with the voltage of the second driving power source VSS from the second power pad PD2 of the pad part PDP. The second driving voltage line DVL2 may overlap the second fan-out line LP2 in the non-display area NDA and be electrically connected to the second fan-out line LP2 through a contact hole CH.

The second driving voltage line DVL2 may form the third conductive layer provided and/or formed on the interlayer insulating layer ILD. The second driving power line DVL2 may be electrically and/or physically connected to the second fan-out line PL2 through a corresponding contact hole sequentially penetrating the buffer layer BFL, the gate insulating layer GI, and the interlayer insulating layer ILD. The second driving voltage line DVL2 may supply the voltage of the second driving power source VSS, which is transferred from the second power pad PD2, to the (2-1)th and (2-2)th sub-power lines PL2_1 and PL2_2 through the second fan-out line LP2.

The second fan-out line LP2 may have a line width W2 constant in the first direction DR1. Each of the line width W5 of the (2-1)th sub-power line PL2_1 and the line width W6 of the (2-2)th sub-power line PL2_2 may be equal to the line width W2 of the second fan-out line LP2, or be greater or smaller than the line width W2 of the second fan-out line LP2. In an example, each of the line width W5 of the (2-1)th sub-power line PL2_1 in the first direction DR1 and the line width W6 of the (2-2)th sub-power line PL2_2 in the first direction DR1 may be smaller than the line width W2 of the second fan-out line LP2 in the first direction DR1, but the disclosure is not limited thereto.

For convenience, it has been illustrated that the line width W2 of the second fan-out line LP2 in the first direction DR1 is equal to a sum of the line width W5 of the (2-1)th sub-power line PL2_1 in the first direction DR1, the line width W6 of the (2-2)th sub-power line PL2_2 in the first direction DR1, and the distance d2 between the (2-1)th and (2-2)th sub-power lines PL2_1 and PL2_2. However, the disclosure is not limited thereto.

Each of the (2-1)th and (2-2)th sub-power lines PL2_1 and PL2_2 may be designed to have a line width narrow to a degree to which particles having various sizes, which are present in a manufacturing process, are not attached to the top thereof.

The number of second power lines PL2 branching off to the display area DA from the second fan-out line LP2 located in the non-display area NDA may be at least two. In an example, two of the (2-1)th and (2-2)th sub-power lines PL2_1 and PL2_1 may branch off to the display area DA from a second fan-out line LP2 located in the non-display area NDA. In an embodiment, a ratio of the number of the second fan-out line LP2 and the number of the second power lines PL2, which are integrally formed to be electrically and/or physically connected to each other, so that a same signal (e.g., the voltage of the second driving power source VSS) is applied thereto, may be 1:2.

The passivation layer PSV, the first insulating layer INS1, the third insulating layer INS3, and the fourth insulating layer INS4 may be provided and/or formed on the first driving voltage line DVL1 and the second driving voltage line DVL2. The third insulating layer INS3 may be selectively provided.

As described above, each of the (1-1)th and (1-2)th sub-power lines PL1_1 and PL1_2 is designed to have a narrow line width, so that particles generated in a process of forming the (1-1)th and (1-2)th sub-power lines PL1_1 and PL1_2 are not attached to the (1-1)th and (1-2)th sub-power lines PL1_1 and PL1_2. Accordingly, a defect in each of the buffer layer BFL, the gate insulating layer GI, and the interlayer insulating layer ILD, which are located on the (1-1)th and (1-2)th sub-power lines PL1_1 and PL1_2, can be prevented.

Similarly, each of the (2-1)th and (2-2)th sub-power lines PL2_1 and PL2_2 is designed to have a narrow line width, so that particles generated in a process of forming the (2-1)th and (2-2)th sub-power lines PL2_1 and PL2_2 are not attached to the (2-1)th and (2-2)th sub-power lines PL2_1 and PL2_2. Accordingly, a defect in each of the buffer layer BFL, the gate insulating layer GI, and the interlayer insulating layer ILD, which are located on the (2-1)th and (2-2)th sub-power lines PL2_1 and PL2_2, can be prevented.

Figure 16:
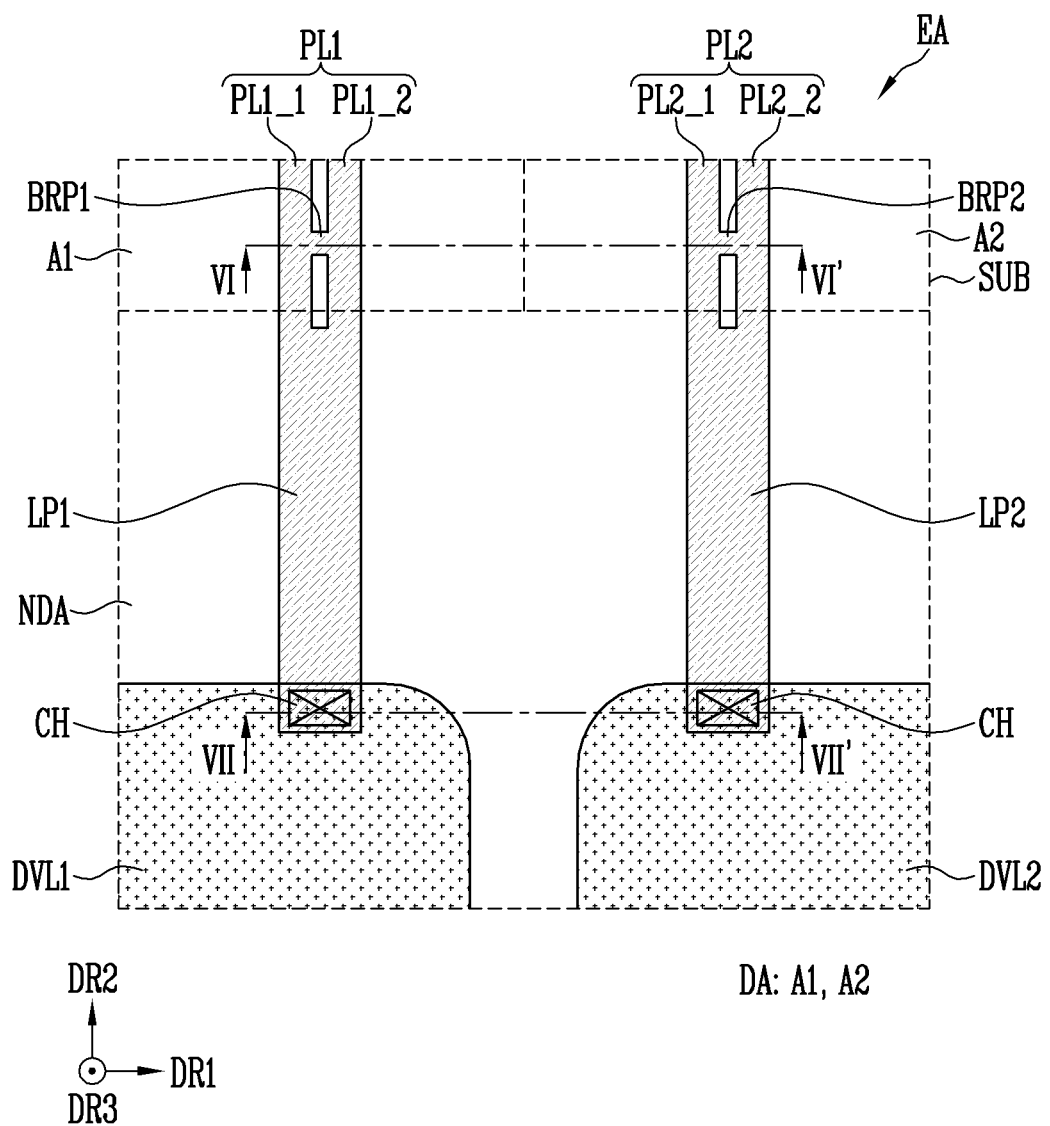
FIG. 16 is a schematic enlarged view of the portion EA shown in FIG. 4.
Figure 17:
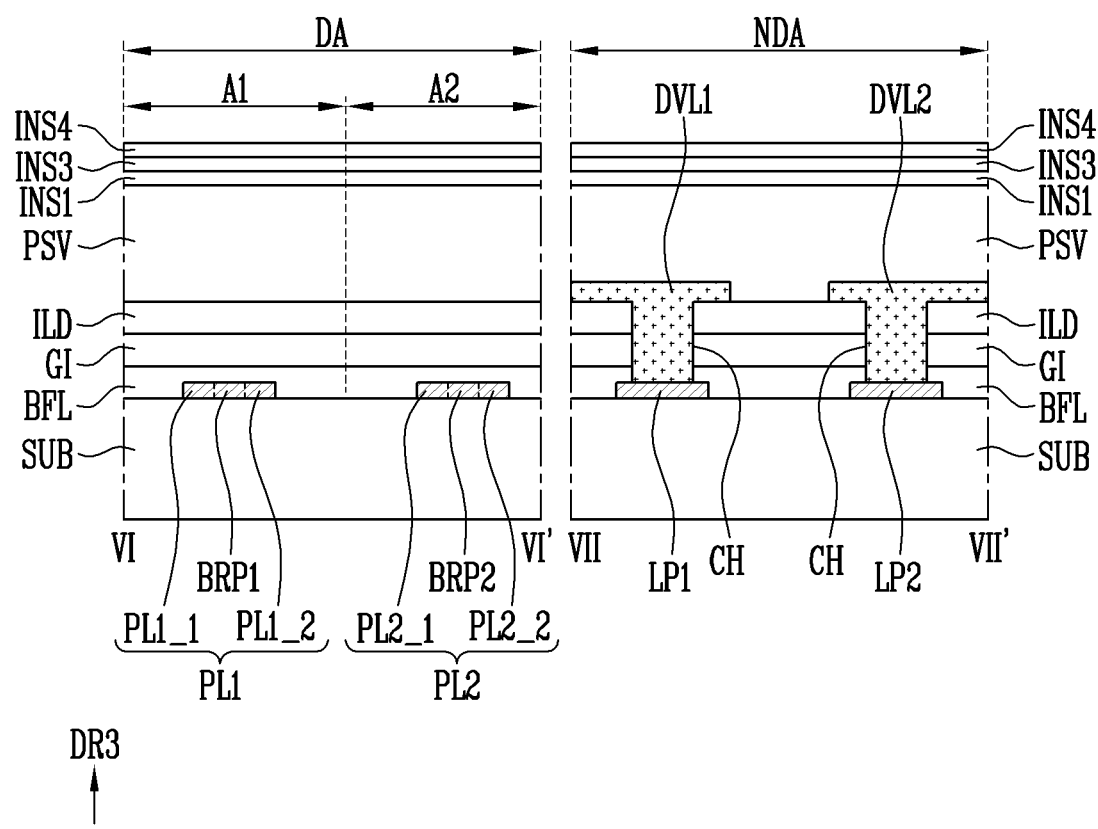
FIG. 17 is a cross-sectional view taken along lines VI-VI' and VII-VII' shown in FIG. 16.
Figure 18:
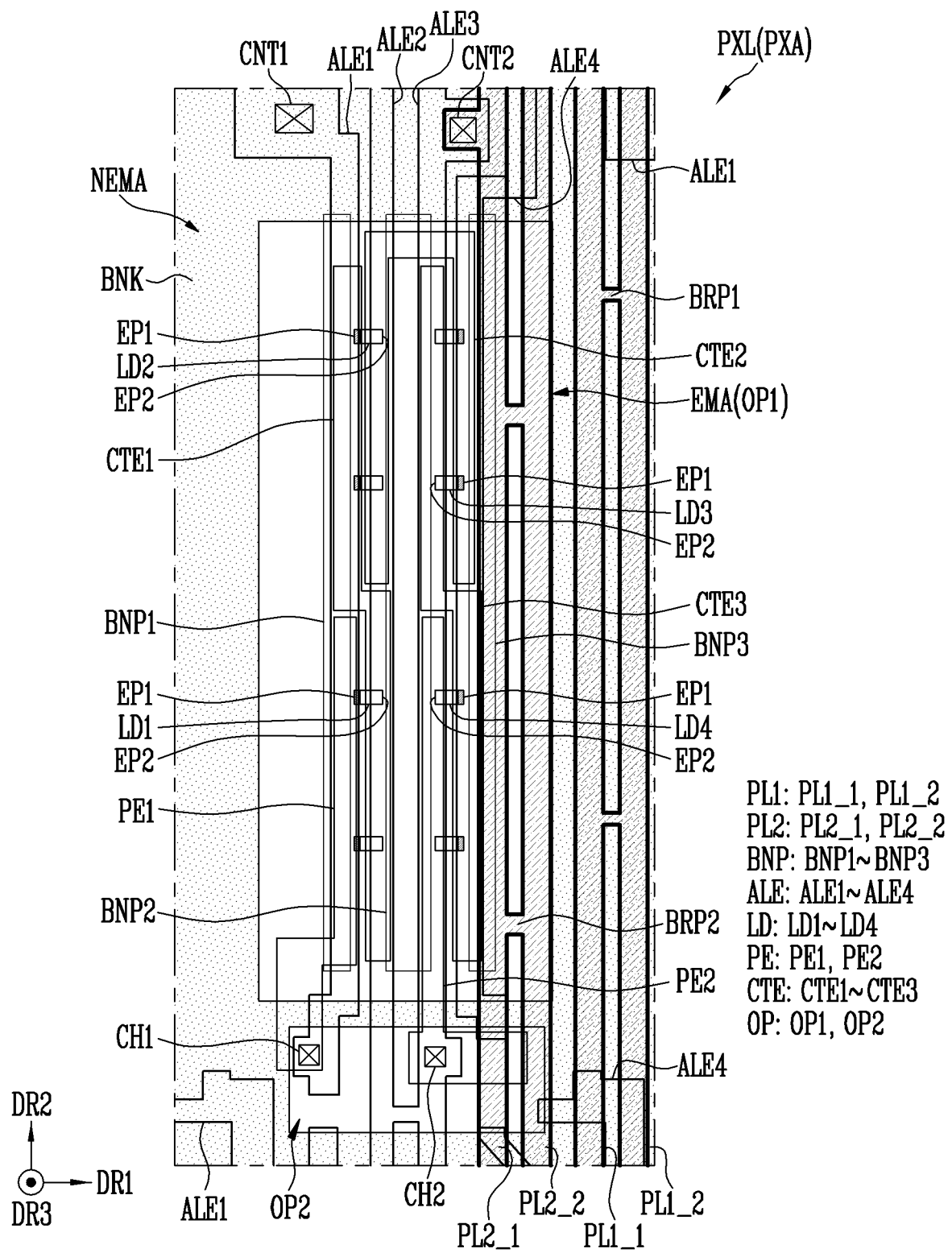
FIG. 18 is a plan view schematically illustrating a pixel in accordance with an embodiment of the disclosure.

FIG. 16 is a schematic enlarged view of the portion EA shown in FIG. 4. FIG. 17 is a schematic sectional view taken along lines VI-VI' and VII-VII' shown in FIG. 16. FIG. 18 is a plan view schematically illustrating a pixel PXL in accordance with an embodiment of the disclosure.

FIG. 18 illustrates a modified embodiment of the embodiment shown in FIG. 7 in relation to a first power line PL1 including a first bridge pattern BRP1 and a second power line PL2 including a second bridge pattern BRP2.

As illustrated in FIGS. 16 to 18, differences from the above-described embodiment will be mainly described to avoid redundancy.

Referring to FIGS. 4 and 16 to 18, the first power line PL1 and the second power line PL2 may be disposed in the display area DA of the substrate SUB.

The first power line PL1 may include a (1-1)th sub-power line PL1_1, a (1-2)th sub-power line PL1_2, and the first bridge pattern BRP1.

The first bridge pattern BRP1 may be located between the (1-1)th sub-power line PL1_1 and the (1-2)th sub-power line PL1_2 to be electrically connected to the (1-1)th sub-power line PL1_1 and the (1-2)th sub-power line PL1_2. One end (or first end) of the first bridge pattern BRP1 may be electrically connected to the (1-1)th sub-power line PL1_1, and the other end (or second end) of the first bridge pattern BRP1 may be electrically connected to the (1-2)th sub-power line PL1_2. The first bridge pattern BRP1 may be integral with the (1-1)th and (1-2)th sub-power lines PL1_1 and PL1_2 and be electrically connected to a first fan-out line LP1. In an embodiment, the first bridge pattern BRP1 may be provided in plurality.

In the display area DA, the first power line PL1 including the (1-1)th sub-power line PL1_1, the first bridge pattern BRP1, and the (1-2)th sub-power line PL1_2 may have a mesh shape (or structure). The voltage of the first driving power source VDD is supplied to the first power line PL1 having the mesh shape to be uniformly supplied to each pixel PXL of the display device DD. Accordingly, the display device DD can provide a uniform luminance throughout the display area DA.

For convenience, it has been illustrated that a line width of the first fan-out line LP1 in the first direction DR1 is equal to a sum of a line width of the (1-1)th sub-power line PL1_1 in the first direction DR1, a width of the first bridge pattern BRP1 in the first direction DR1, and a line width of the (1-2)th sub-power line PL1_1 in the first direction DR1. However, the disclosure is not limited thereto.

The second power line PL2 may include a (2-1)th sub-power line PL2_1, a (2-2)th sub-power line PL2_2, and the second bridge pattern BRP2.

The second bridge pattern BRP2 may be located between the (2-1)th sub-power line PL2_1 and the (2-2)th sub-power line PL2_2 to be electrically connected to the (2-1)th sub-power line PL2_1 and the (2-2)th sub-power line PL2_2. One end (or first end) of the second bridge pattern BRP2 may be electrically connected to the (2-1)th sub-power line PL2_1, and the other end (or second end) of the second bridge pattern BRP2 may be electrically connected to the (2-2)th sub-power line PL2_2. The second bridge pattern BRP2 may be integral with the (2-1)th and (2-2)th sub-power lines PL2_1 and PL2_2 and be electrically connected to a second fan-out line LP2. In an embodiment, second bridge patterns BRP2 may be provided in plurality.

In the display area DA, the second power line PL2 including the (2-1)th sub-power line PL2_1, the second bridge pattern BRP2, and the (2-2)th sub-power line PL2_2 may have a mesh shape (or structure). The voltage of the second driving power source VSS is supplied to the second power line PL2 having the mesh shape to be uniformly supplied to each pixel PXL of the display device DD. Accordingly, the display device DD can provide a uniform luminance throughout the display area DA.

For convenience, it has been illustrated that a line width of the second fan-out line LP2 in the first direction DR1 is equal to a sum of a line width of the (2-1)th sub-power line PL2_1 in the first direction DR1, a width of the second bridge pattern BRP2 in the first direction DR1, and a line width of the (2-2)th sub-power line PL2_1 in the first direction DR1. However, the disclosure is not limited thereto.

Figure 19:
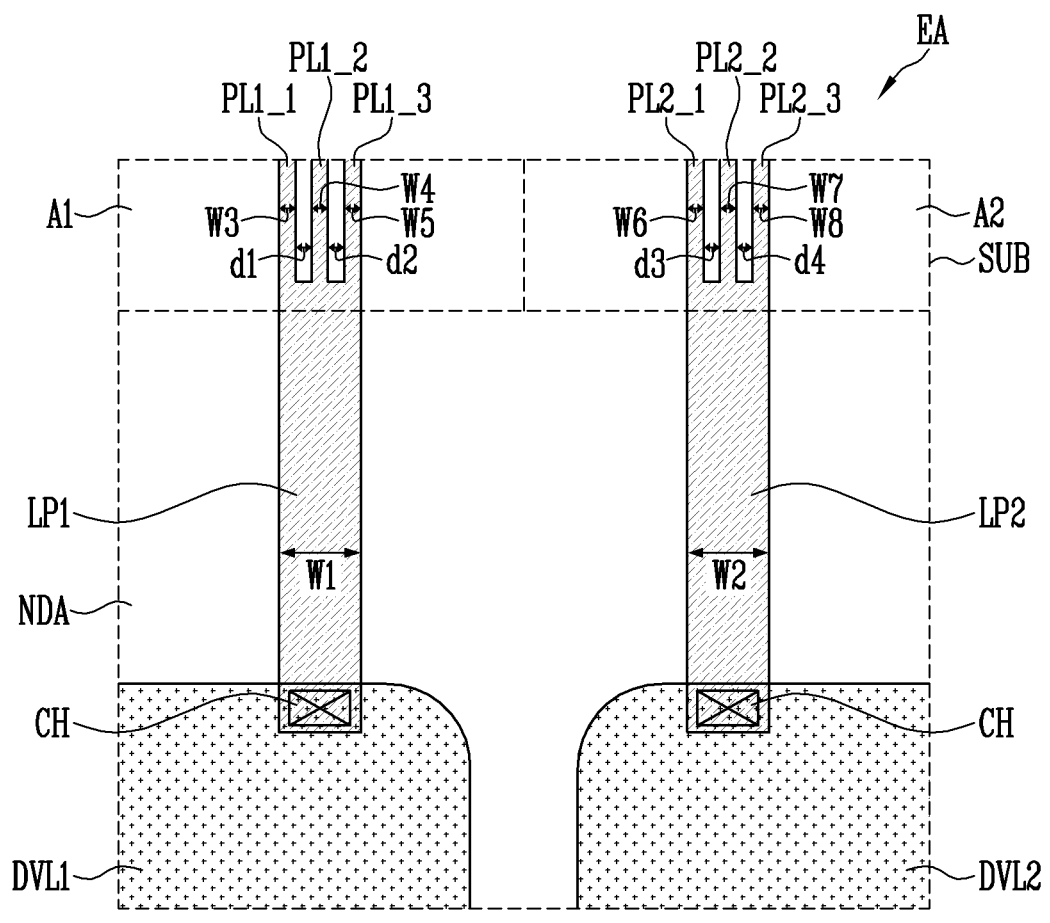
FIG. 19 is a schematic enlarged view of the portion EA shown in FIG. 4.

FIG. 19 is a schematic enlarged view of the portion EA shown in FIG. 4.

In FIG. 19, differences from the above-described embodiment will be mainly described to avoid redundancy.

Referring to FIGS. 4 and 19, a first power line PL1 and a second power line PL2 may be disposed in the display area DA of the substrate SUB.

The first power line PL1 may include a (1-1)th sub-power line PL1_1, a (1-2)th sub-power line PL1_2, and a (1-3)th sub-power line PL1_3 which branch off to the first area A1 of the display area DA from a first fan-out line LP1. The (1-1)th, (1-2)th, and (1-3)th sub-power lines PL1_1, PL1_2, and PL1_3 may be integral with the first fan-out line LP1 to be electrically and/or physically connected to the first fan-out line LP1.

The (1-1)th sub-power line PL1_1 and the (1-2)th sub-power line PL1_2 may be disposed on the substrate SUB to be spaced apart from each other at a first distance d1 in the first direction DR1. The (1-2)th sub-power line PL1_2 and the (1-3)th sub-power line PL1_3 may be disposed on the substrate SUB to be spaced apart from each other at a second distance d2 in the first direction DR1.

A line width W3 of the (1-1)th sub-power line PL1_1 in the first direction DR1, a line width W4 of the (1-2)th sub-power line PL1_2 in the first direction DR1, and a line width W5 of the (1-3)th sub-power line PL1_3 in the first direction DR1 may be equal to or different from each other. Each of the line width W3 of the (1-1)th sub-power line PL1_1, the line width W4 of the (1-2)th sub-power line PL1_2, and the line width W5 of the (1-3)th sub-power line PL1_3 may be equal to a line width W1 of the first fan-out line LP1, or be greater or smaller than the line width W1 of the first fan-out line LP1. In an example, each of the line width W3 of the (1-1)th sub-power line PL1_1 in the first direction DR1, the line width W4 of the (1-2)th sub-power line PL1_2 in the first direction DR1, and the line width W5 of the (1-3)th sub-power line PL1_3 in the first direction DR1 may be smaller than the line width W1 of the first fan-out line LP1 in the first direction DR1, but the disclosure is not limited thereto.

For convenience, it has been illustrated that the line width W1 of the first fan-out line LP1 in the first direction DR1 is equal to a sum of the line width W3 of the (1-1)th sub-power line PL1_1 in the first direction DR1, the line width W4 of the (1-2)th sub-power line PL1_2 in the first direction DR1, the distance d1 between the (1-1)th and (1-2)th sub-power lines PL1_1 and PL1_2, the line width W5 of the (1-3)th sub-power line PL1_3 in the first direction DR1, and the distance d2 between the (1-2)th and (1-3)th sub-power lines PL1_2 and PL1_3. However, the disclosure is not limited thereto.

Each of the (1-1)th, (1-2)th, and (1-3)th sub-power lines PL1_1, PL1_2, and PL1_3 may be designed to have a line width narrow to a degree to which particles having various sizes, which are present in a manufacturing process, are not attached to the top thereof.

The number of first power lines PL1 which branch off to the display area DA from a first fan-out line LP1 located in the non-display area NDA may be at least three. Three of the (1-1)th, (1-2)th, and (1-3)th sub-power lines PL1_1, PL1_2, and PL1_3 may branch off to the display area DA from a first fan-out line LP1 located in the non-display area NDA. In an embodiment, a ratio of the number of the first fan-out line LP1 and the number of the first power lines PL1, which are integrally formed to be electrically and/or physically connected to each other, so that a same signal (e.g., the voltage of the first driving power source VDD) is applied thereto, may be 1:3.

The second power line PL2 may include a (2-1)th sub-power line PL2_1, a (2-2)th sub-power line PL2_2, and a (2-3)th sub-power line PL2_3 which branch off to the second area A2 of the display area DA from a second fan-out line LP2. The (2-1)th, (2-2)th, and (2-3)th sub-power lines PL2_1, PL2_2, and PL2_3 may be integral with the second fan-out line LP2 to be electrically and/or physically connected to the second fan-out line LP2.

The (2-1)th sub-power line PL2_1 and the (2-2)th sub-power line PL2_2 may be disposed on the substrate SUB to be spaced apart from each other at a third distance d3 in the first direction DR1. The (2-2)th sub-power line PL2_2 and the (2-3)th sub-power line PL2_3 may be disposed on the substrate SUB to be spaced apart from each other at a fourth distance d4 in the first direction DR1.

A line width W6 of the (2-1)th sub-power line PL2_1 in the first direction DR1, a line width W7 of the (2-2)th sub-power line PL2_2 in the first direction DR1, and a line width W8 of the (2-3)th sub-power line PL2_3 in the first direction DR1 may be equal to or different from each other. Each of the line width W6 of the (2-1)th sub-power line PL2_1, the line width W7 of the (2-2)th sub-power line PL2_2, and the line width W8 of the (2-3)th sub-power line PL2_3 may be equal to a line width W2 of the second fan-out line LP2, or be greater or smaller than the line width W2 of the second fan-out line LP2. In an example, each of the line width W6 of the (2-1)th sub-power line PL2_1 in the first direction DR1, the line width W7 of the (2-2)th sub-power line PL2_2 in the first direction DR1, and the line width W8 of the (2-3)th sub-power line PL2_3 in the first direction DR1 may be smaller than the line width W2 of the second fan-out line LP2 in the first direction DR1, but the disclosure is not limited thereto.

For convenience, it has been illustrated that the line width W2 of the second fan-out line LP2 in the first direction DR1 is equal to a sum of the line width W6 of the (2-1)th sub-power line PL2_1 in the first direction DR1, the line width W7 of the (2-2)th sub-power line PL2_2 in the first direction DR1, the distance d3 between the (2-1)th and (2-2)th sub-power lines PL2_1 and PL2_2, the line width W8 of the (2-3)th sub-power line PL2_3 in the first direction DR1, and the distance d4 between the (2-2)th and (2-3)th sub-power lines PL2_2 and PL2_3. However, the disclosure is not limited thereto.

Each of the (2-1)th, (2-2)th, and (2-3)th sub-power lines PL2_1, PL2_2, and PL2_3 may be designed to have a line width narrow to a degree to which particles having various sizes, which are present in a manufacturing process, are not attached to the top thereof.

The number of second power lines PL2 which branch off to the display area DA from a second fan-out line LP2 located in the non-display area NDA may be at least three. Three of the (2-1)th, (2-2)th, and (2-3)th sub-power lines PL2_1, PL2_2, and PL2_3 may branch off to the display area DA from a second fan-out line LP2 located in the non-display area NDA. In an embodiment, a ratio of the number of the second fan-out line LP2 and the number of the second power lines PL2, which are integrally formed to be electrically and/or physically connected to each other, so that a same signal (e.g., the voltage of the second driving power source VSS) is applied thereto, may be about 1:3.

In accordance with the disclosure, it can be prevented that particles generated in a process of forming sub-power lines branching off to the display area (or the pixel area) in the non-display area by reducing line widths of the sub-power lines are attached onto the sub-power lines.

In accordance with the disclosure, a crack or the like of an insulating layer (e.g., an inorganic layer or an inorganic insulating layer) formed on the sub-power lines can be prevented, thereby improving the reliability of the sub-power lines.

In addition, in accordance with the disclosure, the display quality of the display device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the scope of the disclosure.

What is claimed is:

1. A display device comprising:
    a substrate including a display area and a non-display area;
    pixels disposed in the display area;
    a first driving voltage line and a second driving voltage line disposed in the non-display area and spaced apart from each other;
    a first fan-out line disposed in the non-display area and electrically connected to the first driving voltage line;
    a second fan-out line disposed in the non-display area and electrically connected to the second driving voltage line;
    a first power line including at least two first sub-power lines branching off to a corresponding one of the pixels from the first fan-out line; and
    a second power line including at least two second sub-power lines branching off to a corresponding one of the pixels from the second fan-out line.

2. The display device of claim 1, wherein
    the at least two first sub-power lines extend in a same direction and are spaced apart from each other, and
    the at least two second sub-power lines extend in a same direction and are spaced apart from each other.

3. The display device of claim 2, wherein
    the at least two first sub-power lines include a (1-1)th sub-power line and a (1-2)th sub-power line which branch off to a corresponding one of the pixels from the first fan-out line, and
    the at least two second sub-power lines include a (2-1)th sub-power line and a (2-2)th sub-power line which branch off to a corresponding one of the pixels from the second fan-out line.

4. The display device of claim 3, wherein
    a ratio of the number of the first fan-out line and a number of the at least two first sub-power lines is 1:2, and
    a ratio of the number of the second fan-out line and a number of the at least two second sub-power lines is 1:2.

5. The display device of claim 3, wherein the (1-1)th and (1-2)th sub-power lines are spaced apart from the (2-1)th and (2-2)th sub-power lines and are electrically disconnected from the (2-1)th and (2-2)th sub-power lines.

6. The display device of claim 3, wherein
widths of the (1-1)th and (1-2)th sub-power lines are equal to each other, and
widths of the (2-1)th and (2-2)th sub-power lines are equal to each other.

7. The display device of claim 6, wherein
a sum of the width of the (1-1)th sub-power line, the width of the (1-2)th sub-power line, and a distance between the (1-1)th sub-power line and the (1-2)th sub-power line is equal to a width of the first fan-out line, and
a sum of the width of the (2-1)th sub-power line, the width of the (2-2)th sub-power line, and a distance between the (2-1)th sub-power line and the (2-2)th sub-power line is equal to a width of the second fan-out line.

8. The display device of claim 6, comprising:
a first bridge pattern located in a corresponding one of the pixels and electrically connecting the (1-1)th sub-power line and the (1-2)th sub-power line to each other; and
a second bridge pattern located in a corresponding one of the pixels and electrically connecting the (2-1)th sub-power line and the (2-2)th sub-power line to each other.

9. The display device of claim 8, wherein
the first bridge pattern is integral with the (1-1)th and (1-2)th sub-power lines, and
the second bridge pattern is integral with the (2-1)th and (2-2)th sub-power lines.

10. The display device of claim 9, wherein each of the first and second power lines has a mesh shape in a corresponding one of the pixels.

11. The display device of claim 3, further comprising:
a buffer layer;
a gate insulating layer; and
an interlayer insulating layer, wherein
the buffer layer, gate insulating layer, and the interlayer insulating layer are sequentially disposed on the substrate,
the first and second power lines are located between the substrate and the buffer layer,
the first and second driving voltage lines are located on the interlayer insulating layer, and
the first and second fan-out lines and the first and second power lines are located in the same layer.

12. The display device of claim 11, wherein
the first driving voltage line is electrically connected to the first fan-out line through a contact hole sequentially penetrating the buffer layer, the gate insulating layer, and the interlayer insulating layer, and
the second driving voltage line is electrically connected to the second fan-out line through a contact hole sequentially penetrating the buffer layer, the gate insulating layer, and the interlayer insulating layer.

13. The display device of claim 2, wherein
the at least two first sub-power lines include a (1-1)th sub-power line, a (1-2)th sub-power line, and a (1-3)th sub-power line which branch off to a corresponding one of the pixels from the first fan-out line, and
the at least two second sub-power lines include a (2-1)th sub-power line, a (2-2)th sub-power line, and a (2-3)th sub-power line which branch off to a corresponding one of the pixels from the second fan-out line.

14. The display device of claim 13, wherein
a ratio of the number of the first fan-out line and the number of the at least two first sub-power lines is 1:3, and
a ratio of the number of the second fan-out line and the number of the at least two second sub-power lines is 1:3.

15. The display device of claim 3, wherein each of the pixels includes:
an emission area and a non-emission area;
a pixel circuit layer disposed on the substrate, the pixel circuit layer including at least one transistor; and
a display element layer disposed in the emission area on the pixel circuit layer, the display element layer including at least one light emitting element electrically connected to the at least one transistor.

16. The display device of claim 15, wherein the display element layer includes:
a first alignment electrode, a second alignment electrode, a third alignment electrode, and a fourth alignment electrode located in the emission area on the pixel circuit layer and spaced apart from each other;
a bank located in the non-emission area on the pixel circuit layer, the bank including an opening corresponding to the emission area; and
a first electrode and a second electrode located in the emission area on the pixel circuit layer and electrically connected to the light emitting element.

17. The display device of claim 1, further comprising:
a first pad disposed in the non-display area and electrically connected to the first driving voltage line; and
a second pad disposed in the non-display area and electrically connected to the second driving voltage line.

18. The display device of claim 17, wherein
the first driving voltage line is supplied with a first power source from the first pad,
the second driving voltage line is supplied with a second power source from the second pad,
the first power source is a high-potential driving power source, and
the second power source is a low-potential driving power source.

19. A display device comprising:
a substrate including a display area and a non-display area;
pixels disposed in the display area;
a first driving voltage line and a second driving voltage line disposed in the non-display area and spaced apart from each other;
a first fan-out line located between the first driving voltage line and the pixels in the non-display area, and electrically connected to the first driving voltage line;
a second fan-out line located between the second driving voltage line and the pixels in the non-display area, and electrically connected to the second driving voltage line;
a (1-1)th sub-power line extending to a corresponding one of the pixels from the first fan-out line;
a (1-2)th sub-power line extending to a corresponding one of the pixels from the first fan-out line and spaced apart from the (1-1)th sub-power line;
a (2-1)th sub-power line extending to a corresponding one of the pixels from the second fan-out line; and
a (2-2)th sub-power line extending to a corresponding one of the pixels from the second fan-out line and spaced apart from the (2-1)th sub-power line.

20. The display device of claim 19, wherein the (1-1) and (1-2)th sub-power lines are electrically disconnected from the (2-1) and (2-2)th sub-power lines.

\* \* \* \* \*